(12) United States Patent
Worry et al.

(10) Patent No.: US 10,374,444 B2
(45) Date of Patent: Aug. 6, 2019

(54) METHOD AND SYSTEM FOR BATTERY MANAGEMENT

(71) Applicant: ELITE POWER INNOVATIONS, LLC, Sunnyvale, CA (US)

(72) Inventors: Michael Alan Worry, Campbell, CA (US); John Ellis Corman, Kitchener (CA); Stefan Erik Janhunen, Waterloo (CA); Jonathan Thomas Malton, Kitchener (CA); Nathanael Dimitro Wennyk, Waterloo (CA)

(73) Assignee: ELITE POWER INNOVATIONS, LLC., Sunnyvale, CA (US)

(*) Notice: Subject to any disclaimer, the term of this patent is extended or adjusted under 35 U.S.C. 154(b) by 582 days.

(21) Appl. No.: 15/156,166

(22) Filed: May 16, 2016

(65) Prior Publication Data

US 2016/0261127 A1     Sep. 8, 2016

Related U.S. Application Data

(63) Continuation-in-part of application No. 14/836,895, filed on Aug. 26, 2015, now abandoned.

(60) Provisional application No. 62/042,156, filed on Aug. 26, 2014, provisional application No. 62/050,282, filed on Sep. 15, 2014.

(51) Int. Cl.
| | |
|---|---|
| *H01M 6/50* | (2006.01) |
| *H02J 7/00* | (2006.01) |
| *H01M 10/42* | (2006.01) |
| *H01M 10/48* | (2006.01) |
| *G01R 31/3842* | (2019.01) |
| *G01R 31/02* | (2006.01) |
| *G01R 31/396* | (2019.01) |
| *G01R 31/3835* | (2019.01) |

(52) U.S. Cl.
CPC ........ *H02J 7/0026* (2013.01); *G01R 31/3842* (2019.01); *H01M 10/425* (2013.01); *H01M 10/4207* (2013.01); *H01M 10/482* (2013.01); *H01M 10/486* (2013.01); *G01R 31/025* (2013.01); *G01R 31/3835* (2019.01); *G01R 31/396* (2019.01); *H01M 2010/4271* (2013.01); *H01M 2010/4278* (2013.01)

(58) Field of Classification Search
CPC .................... H01M 10/425; H01M 2010/4271
See application file for complete search history.

(56) References Cited

U.S. PATENT DOCUMENTS

| | | | | |
|---|---|---|---|---|
| 8,571,738 B1* | 10/2013 | Potter | ................... | B60L 3/0046 |
| | | | | 324/434 |
| 9,847,658 B2* | 12/2017 | Kuhlmann | ............ | H02J 7/0026 |
| 2011/0121656 A1* | 5/2011 | Hicks | ...................... | H02J 1/108 |
| | | | | 307/80 |
| 2014/0347014 A1* | 11/2014 | Lee | ........................ | H02J 7/0016 |
| | | | | 320/134 |

(Continued)

*Primary Examiner* — Abdullah A Riyami
*Assistant Examiner* — Nader J Alhawamdeh
(74) *Attorney, Agent, or Firm* — Bowen Liu; David Lewis

(57) ABSTRACT

A battery management system is provided that controls at least a stack of battery cells. The battery management system may detect stack voltage and current. Characteristics of each battery cell in the stack may be monitored. The battery management system may detect ground fault within the stack of battery cells. Communication breakdown and/or failure in the battery management system may also be detected.

16 Claims, 25 Drawing Sheets

(56) References Cited

U.S. PATENT DOCUMENTS

| | | | | |
|---|---|---|---|---|
| 2014/0361732 A1* | 12/2014 | Nishikawa | ............ | H02J 7/0014 |
| | | | | 320/107 |
| 2015/0028816 A1* | 1/2015 | Lee | ...................... | H02J 7/0021 |
| | | | | 320/134 |
| 2015/0340888 A1* | 11/2015 | Hofer | .................. | H01M 10/425 |
| | | | | 320/116 |
| 2016/0226107 A1* | 8/2016 | Worry | .................. | H01M 10/425 |
| 2016/0261127 A1* | 9/2016 | Worry | ................. | G01R 31/3624 |
| 2016/0356857 A1* | 12/2016 | Kaupp | ..................... | H04Q 9/00 |

* cited by examiner

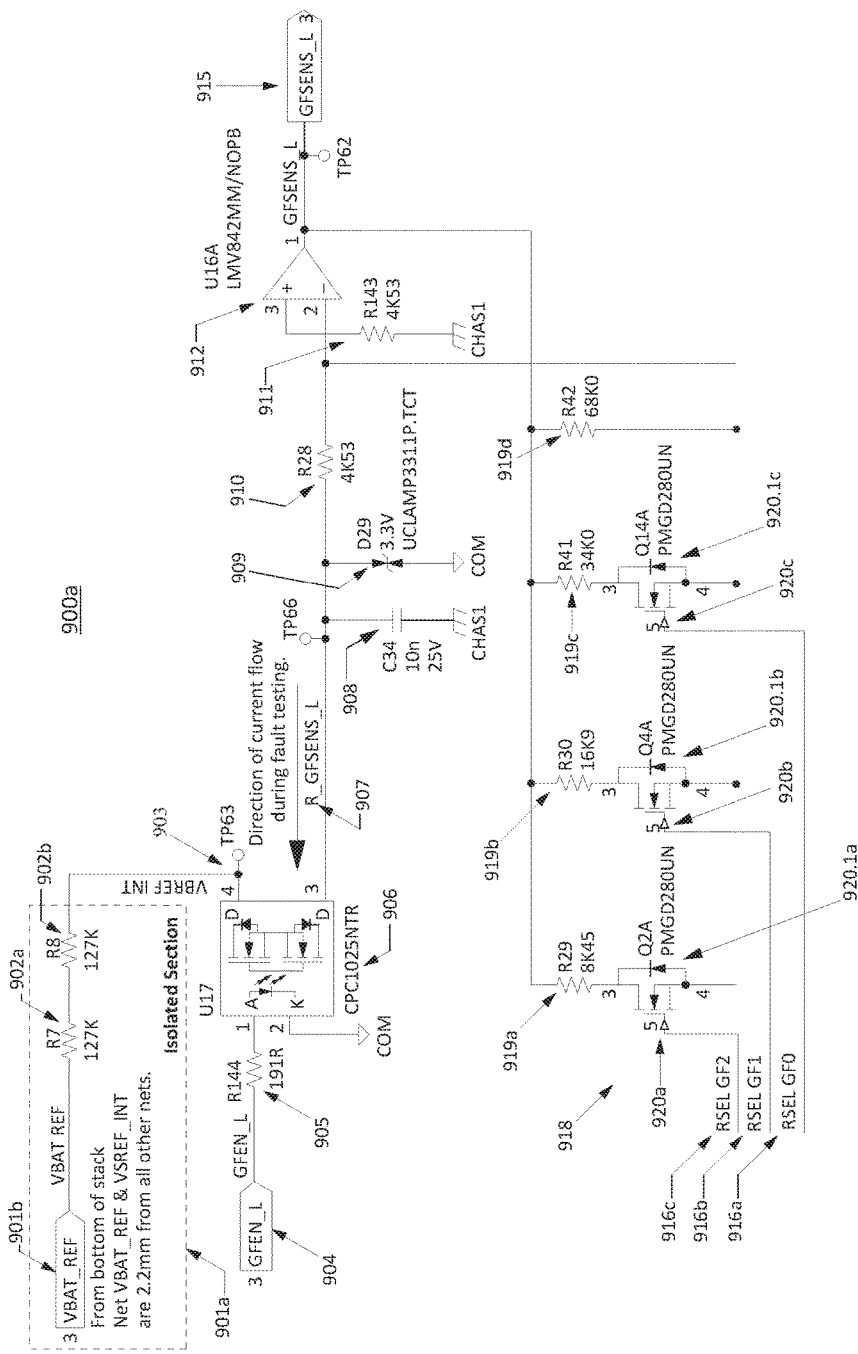
FIG. 9A(1)

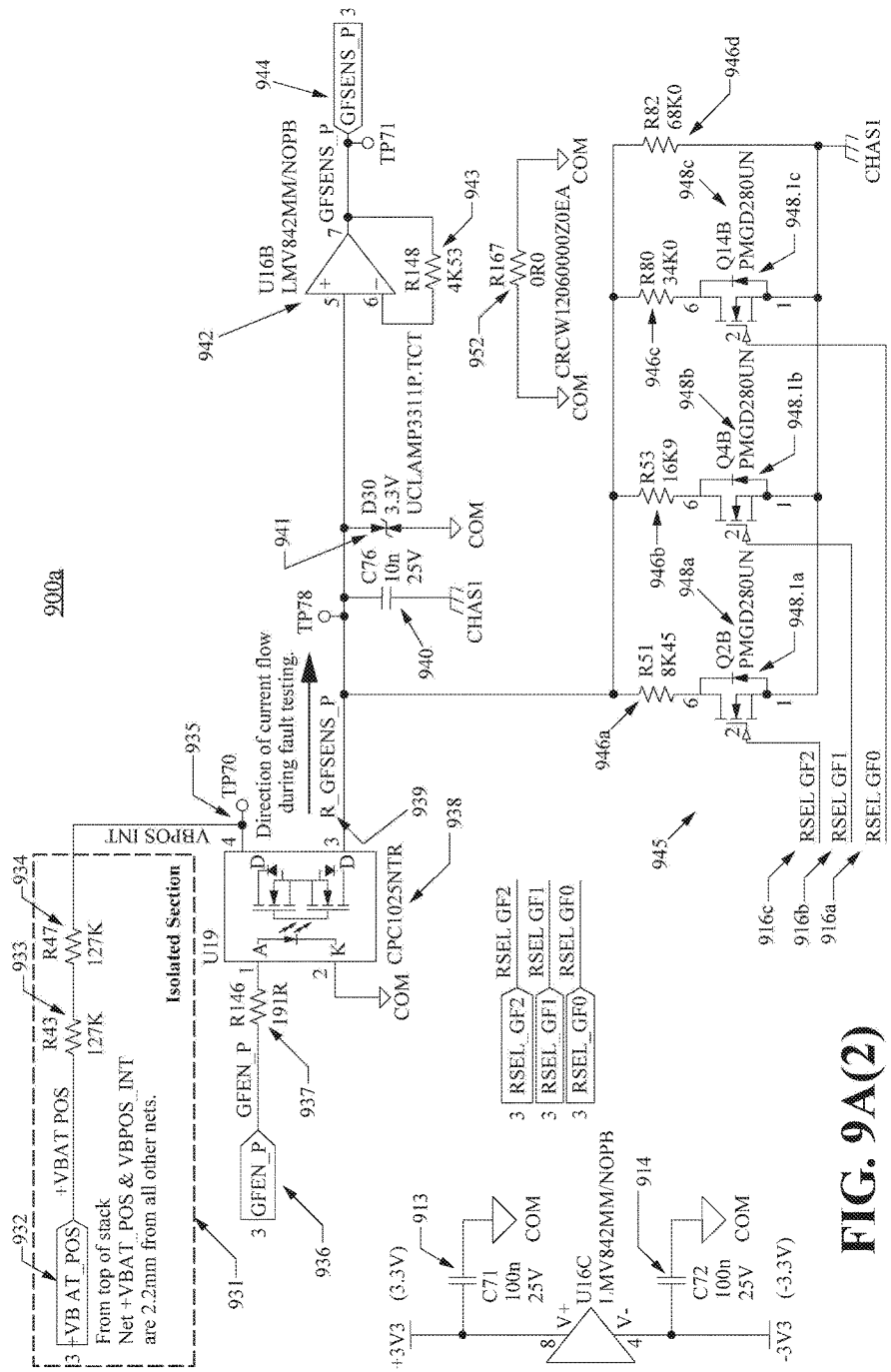
FIG. 9A(2)

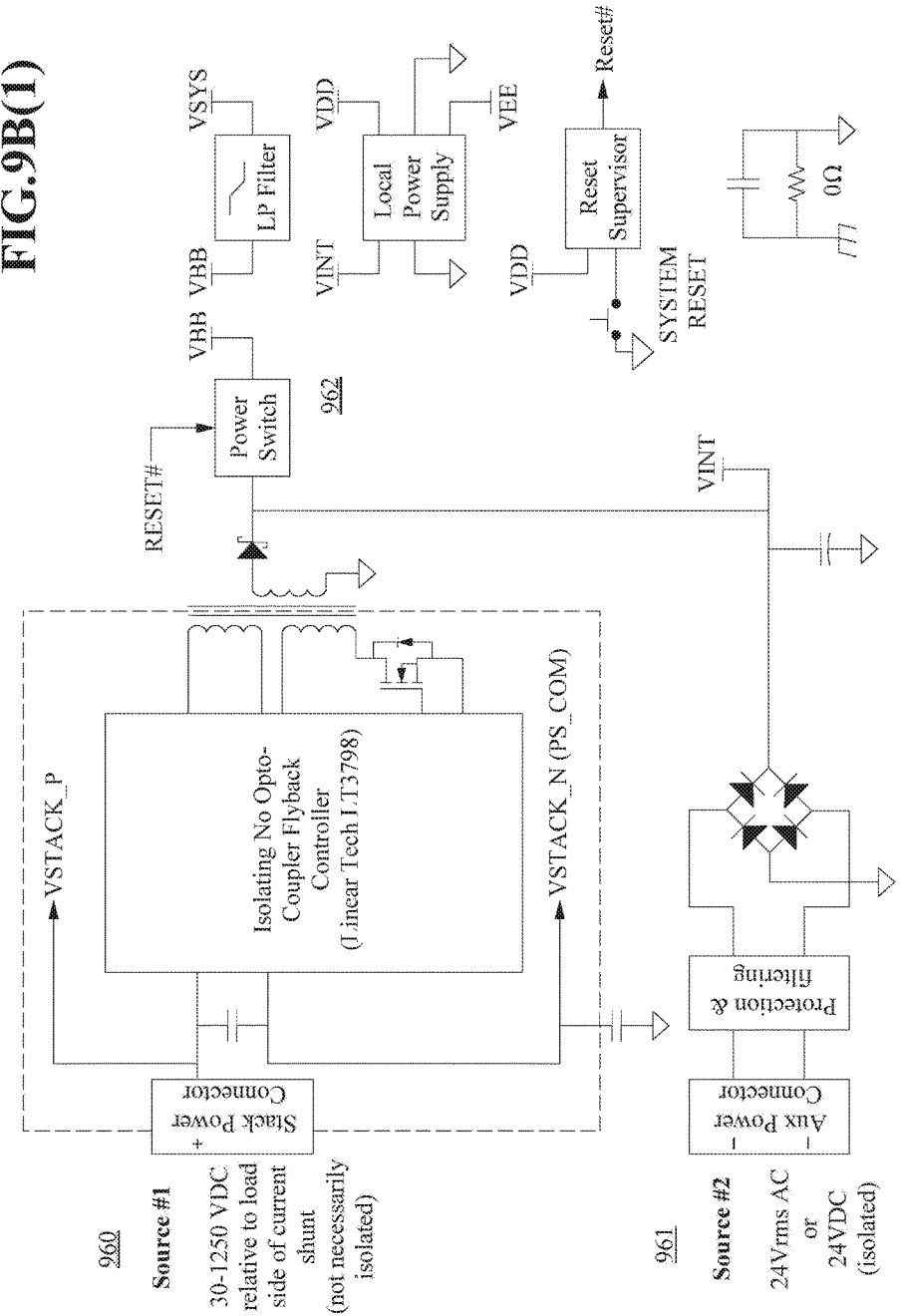
FIG.9B(1)

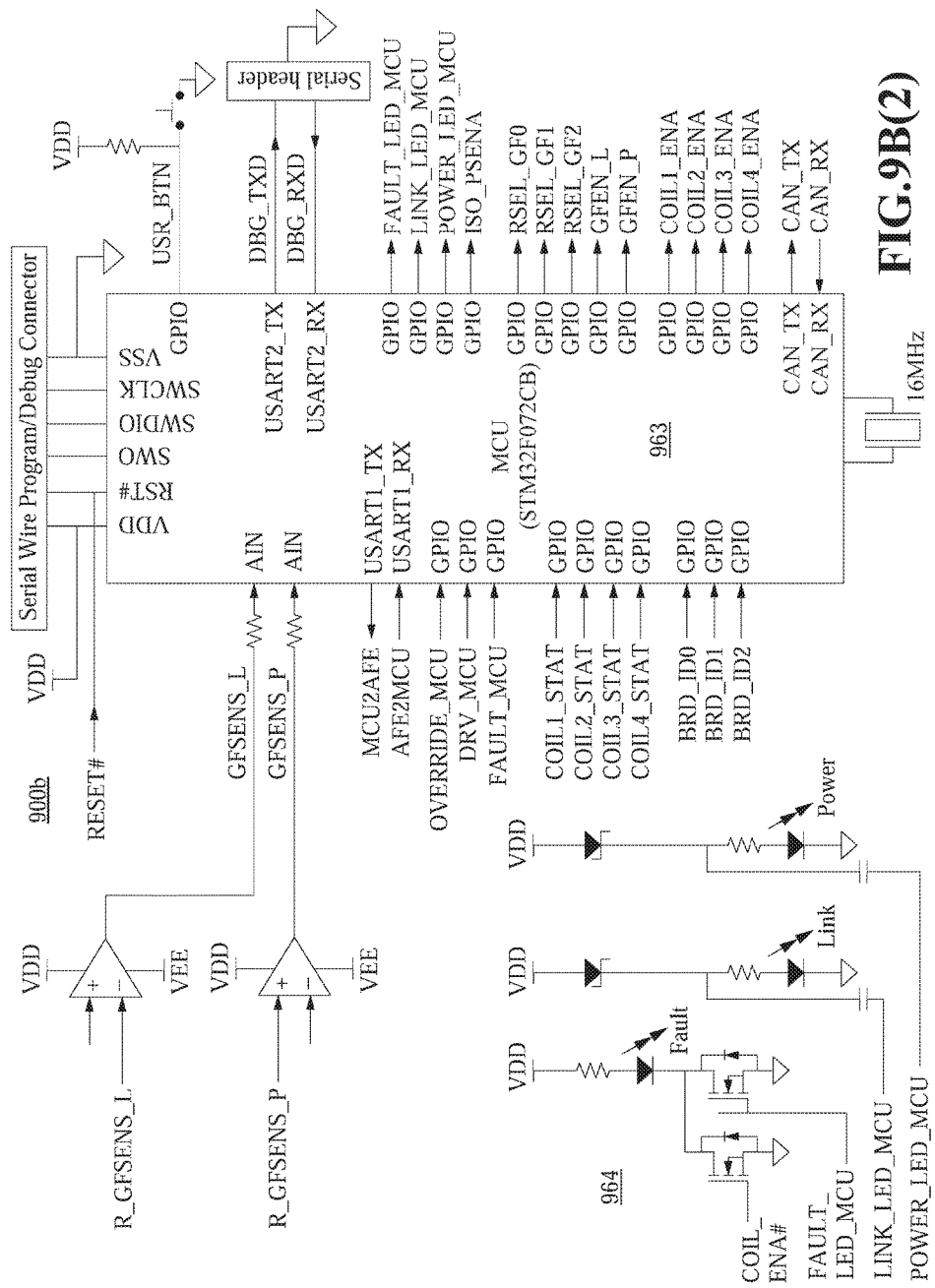
FIG. 9B(2)

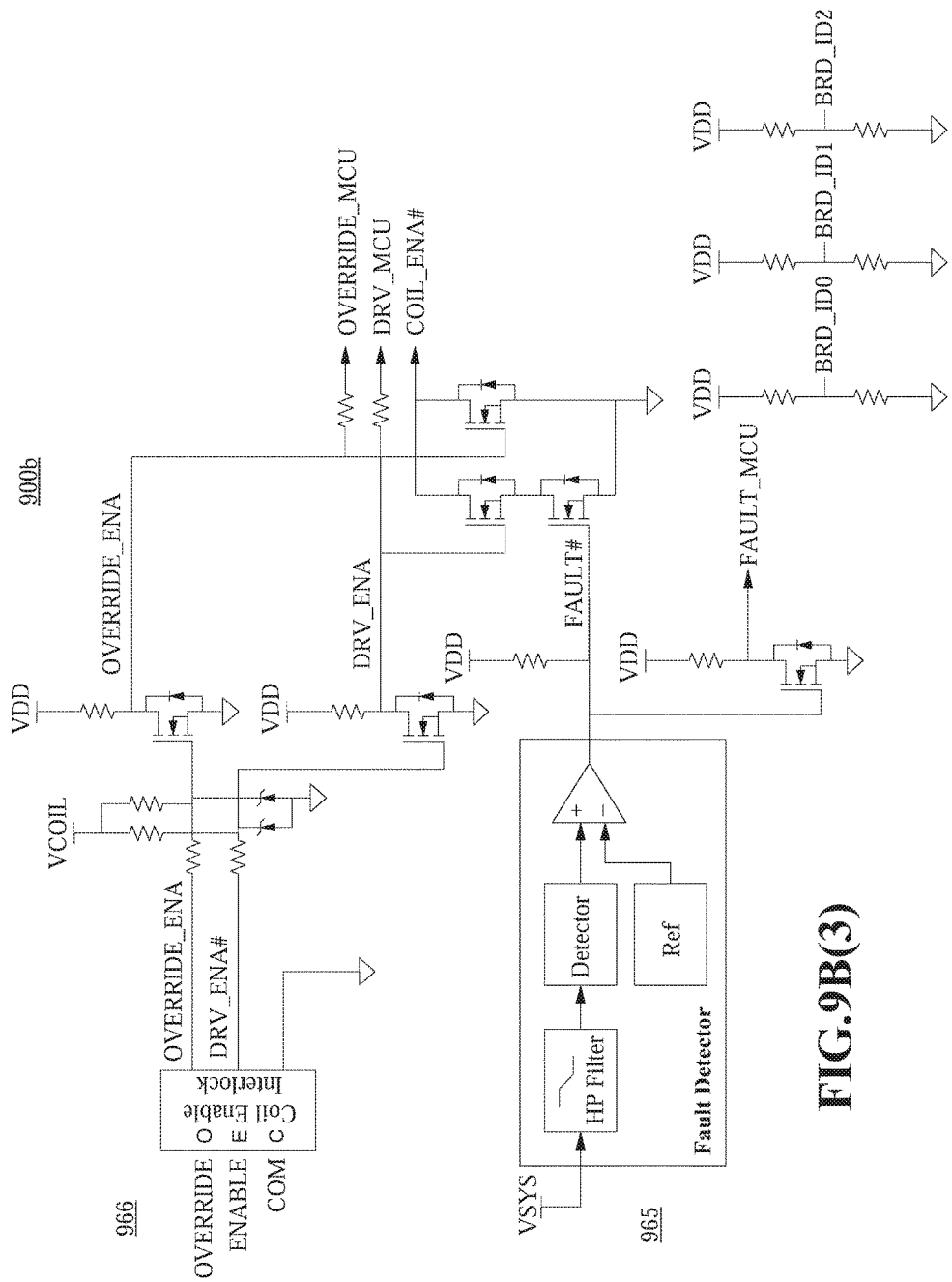
FIG. 9B(3)

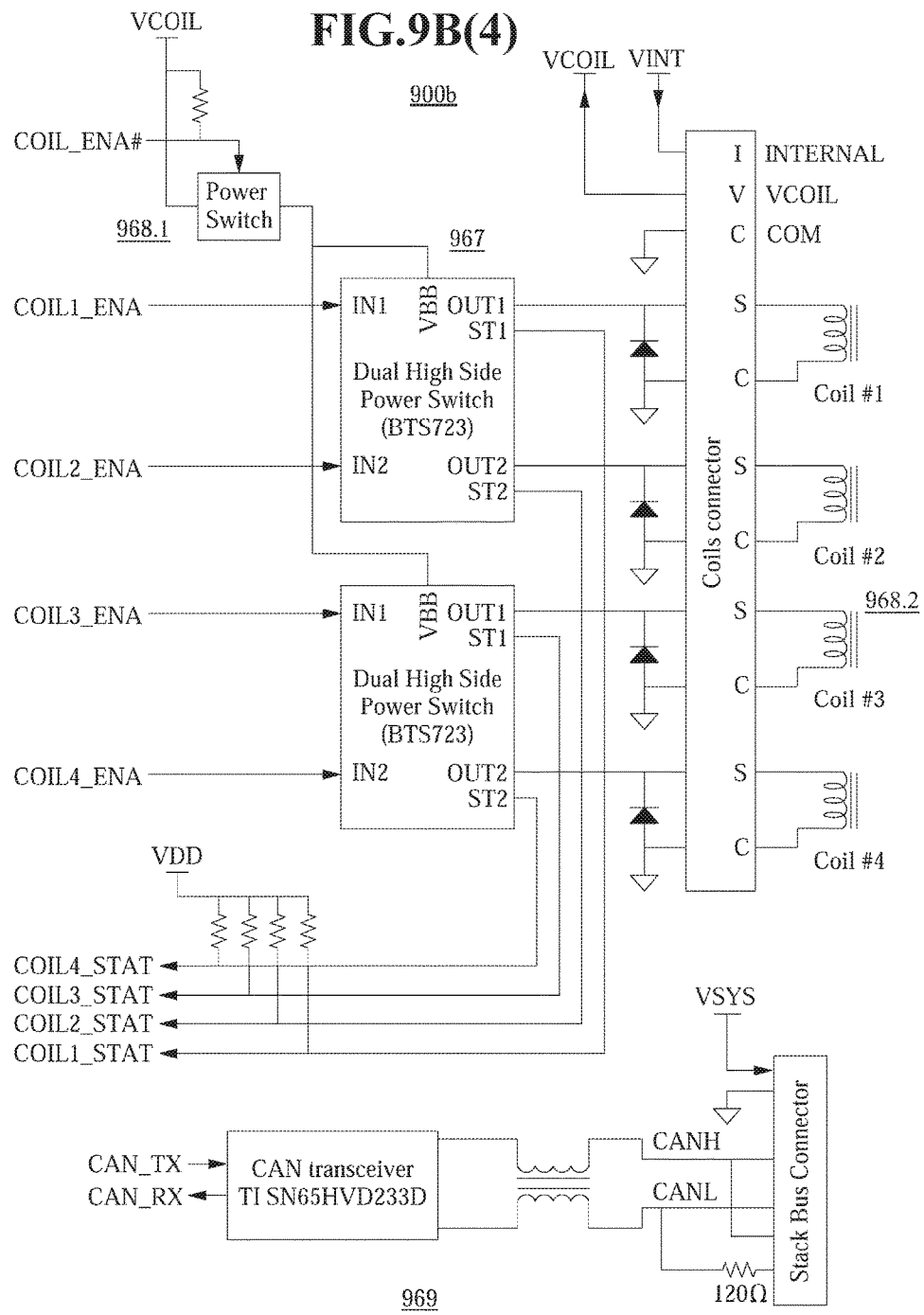

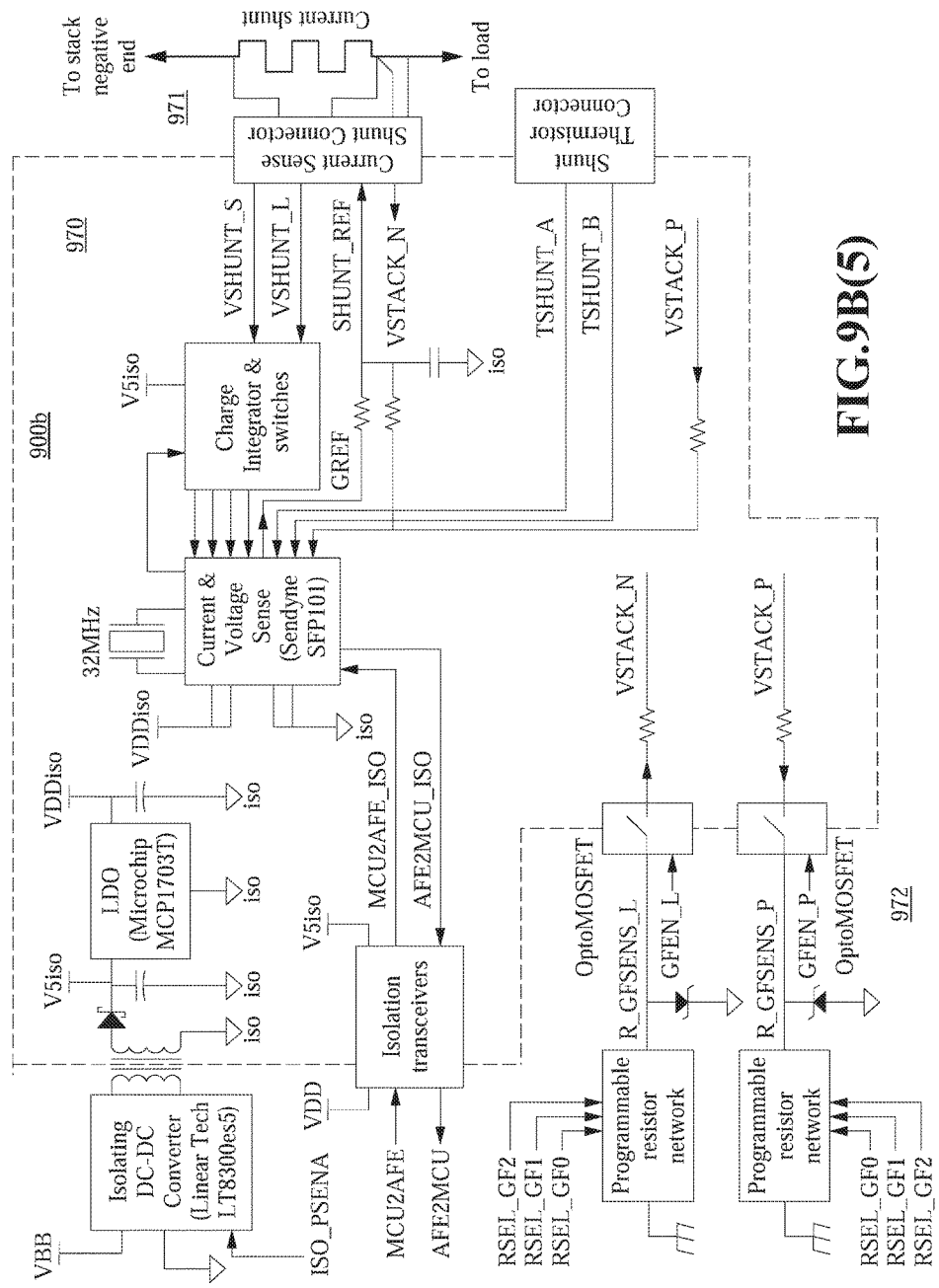
FIG. 9B(5)

METHOD AND SYSTEM FOR BATTERY MANAGEMENT

CROSS-REFERENCE TO RELATED APPLICATIONS

This application is a continuation in part of U.S. Non-Provisional patent application Ser. No. 14/836,895, entitled "METHOD AND SYSTEM FOR BATTERY MANAGEMENT," filed on Aug. 26, 2015, by Michael Alan Worry, which in turn claims priority to U.S. Provisional Patent Application No. 62/042,156, entitled "BATTERY MANAGEMENT SYSTEM," filed on Aug. 26, 2014, by Michael Alan Worry, and U.S. Provisional Patent Application No. 62/050,282, entitled "MODULAR BATTERY MANAGEMENT," filed on Sep. 15, 2014, by Michael Alan Worry.

All of the above Applications are incorporated herein by reference.

FIELD

The present specification relates to battery management.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Battery management is used to control one or more batteries. Common functions of battery management include charging and balancing batteries.

SUMMARY

In at least one embodiment, a system and method for battery management is provided. In at least one embodiment, the battery management system is configured to monitor and control an energy storage system that includes a plurality of batteries, which may be charged, via a charger, and/or may output electrical power, via an inverter, to a power grid.

In at least one embodiment, the battery management system includes a means to monitor and manage at least a battery stack that includes a number of battery cells connected in series. The battery management system also includes a power interface that is configured to control high-current switches in a power line that delivers current to and from the battery stack. The high current switches may be referred to a "contactors," and high current switches carry the full charge or discharge current at which the battery stack may be operating, which could be on the order of hundreds of amps. In contrast signal relay switches, such as may be used to communicate an operating state or instructions to or from external equipment are relatively low-current switches when compared to the high current switches/contactor. In at least one embodiment, the power interface is configured to measure a voltage and/or a current on the power line. The battery management system may further include a plurality of cell interfaces, each of which is connected to a battery cell in the battery stack and is configured to measure characteristics of the connected battery cell. In at least one embodiment, the cell interfaces are configured to measure at least voltages and/or temperatures of the connected battery cells. Each of the cell interfaces is configured to communicate digital results of the measurements via a digital communications channel (e.g., a link bus) to a stack controller of the battery management system. The stack controller receives and/or analyzes the digital results and sends control signals to the power interface, via a stack bus. The power interface, based on the control signals received from the stack controller and/or external systems, opens and closes switches to connect and disconnect the power line.

In at least one embodiment, the power interface may receive power input directly from the power line and/or from an isolated power supply. The power interface may power the stack controller, via the stack bus, and/or further power the cell interfaces, via the link bus. In at least one embodiment, the stack controller and/or the power interface may receive instructions from external systems. In an embodiment, the battery management system includes a grid battery controller that controls a plurality of stack controllers that are connected in parallel. In at least one embodiment, the grid battery controller may be connected to a charger/inverter and/or another external system.

In at least one embodiment, the power interface includes at least a ground fault detector that detects unintentional current paths between the battery stack and a ground. In an embodiment, the ground fault detector may detect and/or measure small test currents from the most positive end of the battery stack to the ground and/or from the most negative end to the ground, which may indicate existence of a ground fault within the battery stack. The power interface may also determine the fault resistance and/or location based on the measurements. Additionally, the battery management system may also include a fault pilot signal generation/detection system that is independent of the control signal path. In at least one embodiment, the fault pilot signal is propagated along the stack bus and/or link bus, and absence of the fault pilot signal may indicate software failure, failure of processors and/or microcontrollers, loss of connection between the stack controller, cell interfaces, and/or the power interface. In this specification, terms "microcontroller" and "processor," where ever either term occurs, may be substituted one for another to obtain different embodiments. In at least one embodiment, the stack controller generates fault pilot signals that are embedded in the link bus and stack bus. The fault pilot signal may be suppressed by the cell interfaces, the stack controller, and/or other components of the battery management system to indicate a fault condition. A fault condition may be any abnormal electrical signal and/or any other abnormality that the battery management system is capable of addressing (e.g., by shutting the system down, taking corrective action, and/or by sending an alert). The power interface may detect the absence of the fault pilot signal and accordingly control the switches. In an embodiment, external system may instruct the power interface whether or not to de-energize the switches in response to fault signals.

Any of the above embodiments may be used alone or together with one another in any combination. Inventions encompassed within this specification may also include embodiments that are only partially mentioned or alluded to or are not mentioned or alluded to at all in this brief summary or in the abstract.

BRIEF DESCRIPTION OF THE FIGURES

In the following drawings like reference numbers are used to refer to like elements. Although the following figures depict various examples of the invention, the invention is not limited to the examples depicted in the figures.

FIGS. 9A(1) and 9A(2) show a diagram of an embodiment of a ground fault detection circuit;

FIGS. 9B(1)-9B(5) show a block diagram of an embodiment of a power interface circuit;

DETAILED DESCRIPTION

Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

In general, at the beginning of the discussion of each of FIGS. 1-9 is a brief description of each element, which may have no more than the name of each of the elements in the one of FIGS. 1-9 that is being discussed. After the brief description of each element, each element is further discussed in numerical order. In general, each of FIGS. 1-12 is discussed in numerical order and the elements within FIGS. 1-12 are also usually discussed in numerical order to facilitate easily locating the discussion of a particular element. Nonetheless, there is no one location where all of the information of any element of FIGS. 1-12 is necessarily located. Unique information about any particular element or any other aspect of any of FIGS. 1-12 may be found in, or implied by, any part of the specification.

In various places in discussing the drawings a range of letters, such as a-n is used to refer to individual elements of various series of elements that are the same. In each of these series, the ending letters represent integer variables that can be any number. Unless indicated otherwise, the number of elements in each of these series is unrelated to the number of elements in others of these series. Specifically, even though one letter (e.g., "c") comes earlier in the alphabet than another letter (e.g., "n"), the order of these letters in the alphabet does not mean that the earlier letter represents a smaller number. The value of the earlier letter is unrelated to the later letter, and may represent a value that is greater the same or less than the later letter.

It should be understood that specific embodiments described herein are only used to explain at least one embodiment but not used to limit the present invention.

Figure 1:
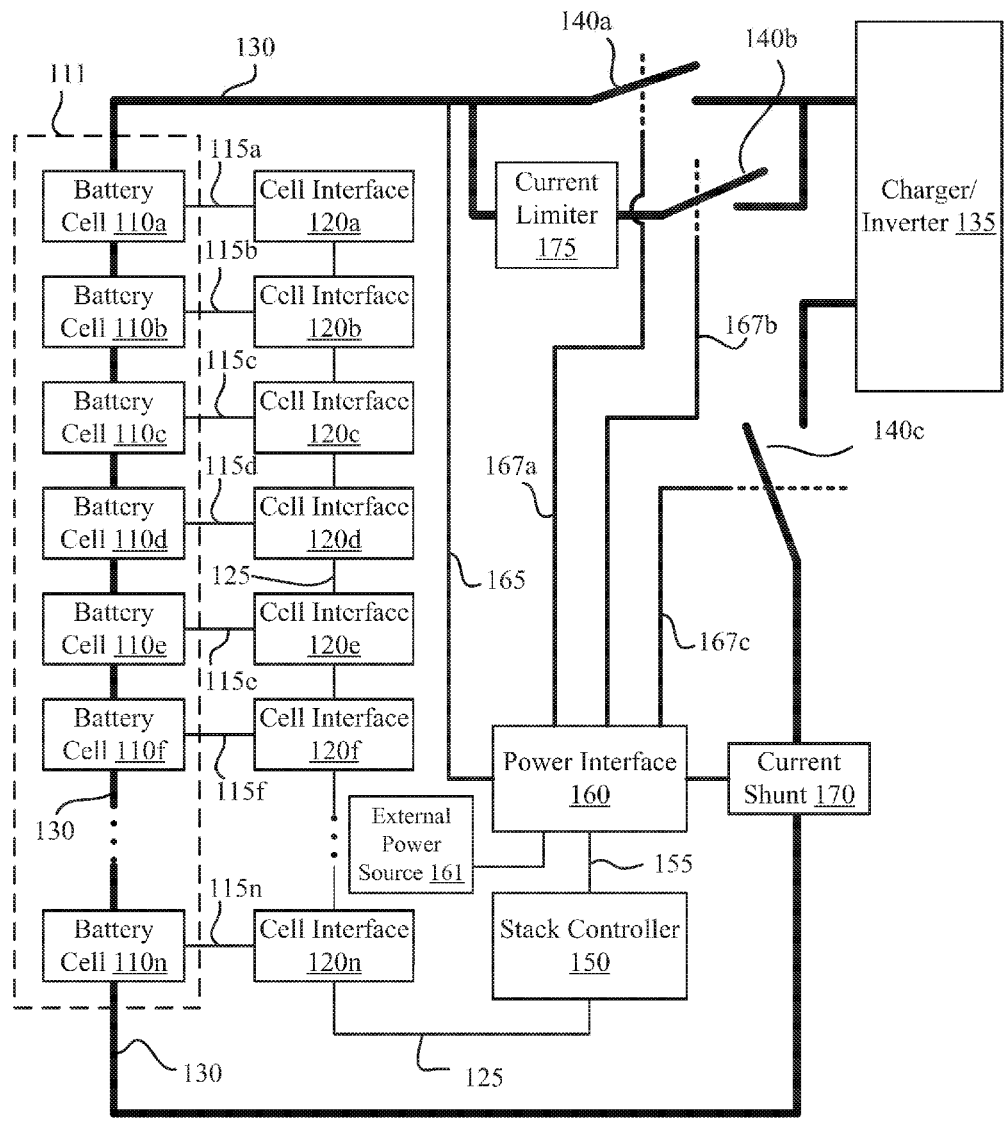
FIG. 1 shows a block diagram of an embodiment of a battery management system.

FIG. 1 shows a block diagram of an embodiment of a battery management system 100. Battery management system 100 includes at least a plurality of battery cells 110*a-n*, a battery stack 111, sensor conductors 115*a-n*, cell interfaces 120*a-n*, a link bus 125, a power line 130, a charger/inverter 135, switches 140*a*, 140*b*, and 140*c*, a stack controller 150, a stack bus 155, a power interface 160, an external power source 161, an input conductor 165, switch control conductors 167*a*, 167*b*, and 167*c*, a current shunt 170, and a current limiter 175. In other embodiments, the battery management system 100 may not have all of the elements or features listed and/or may have other elements or features instead of or in addition to those listed.

FIG. 1 shows a battery management system 100 that monitors and/or controls a stack of battery cells to input or output power via charger/inverter.

Battery management system 100 is a system that is configured to monitor the characteristics of a plurality of battery cells, and accordingly control the power inputting to and/or outputting from the battery cells. In at least one embodiment, battery management system 100 may receive instructions from external control systems to control accordingly the power inputting and/or outputting. In at least one embodiment, the battery management system 100 may detect fault conditions within the system and may respond to the fault conditions.

Battery cells 110*a-n* are electrochemical battery cells. In at least one embodiment, one cell in this specification refers to the smallest unit of energy storage distinguishable by the battery management system 100. In at least one embodiment, a battery cell may include one or more electrochemical cells connected in parallel. For example, a "1p" cell refers to a single electrochemical cell, while a "2p" cell refers to two electrochemical cells connected together in parallel. In at least one embodiment, the battery cells 110*a-n* may have different capacity. In another embodiment, some or all of the battery cells 110*a-n* may have similar capacity. Throughout this specification, the terms "battery cell," "electrochemical cell," and "cell" may be substituted one for the other to obtain different embodiments.

In at least one embodiment, a number of battery cells may form a group, while the battery cells in the same group are connected in series and managed together. For example, a "12s1p" group may include twelve "1p" cells connected in series, while a "16s2p" group may include sixteen "2p" cells connected in series. In at least one embodiment, at least one of the battery cells 110a-n may be replaced by a group of cells.

Battery stack 111 includes a number of battery cells 110a-n connected in series. In an embodiment, battery stack 111 may include one or more groups of cells connected in series. For example, a "5g14s2p" battery stack (which may also be referred to as a "70s2p" stack) may include five "14s2p" groups connected in series (or seventy "2p" cells connected in series). In at least one embodiment, the battery cells in the battery stack 111 are physically removable, together as a unit, from the battery stack 111. Throughout this specification, the terms "battery stack" and "stack" may be substituted one for the other to obtain different embodiments.

Sensor conductors 115a-n are conductors that communicatively connect the cell interfaces 120a-n to sensors that monitor the states of the cell batteries 110a-n, respectively. In at least one embodiment, sensor conductors 115a-n carry sensing signals (e.g., voltage of the cell batteries 110a-n and/or temperatures) to the cell interfaces 120a-n, respectively.

Cell interfaces 120a-n are interfaces that are configured to monitor and/or control connected battery cells 110a-n, respectively. In at least one embodiment, the cell interfaces 120a-n are communicatively connected with each other in series via a link bus. In at least one embodiment, each of the cell interfaces 120a-n includes both a link-in port and a link-out port that are used to connect the cell interfaces to the link bus in a daisy-chain fashion. In at least one embodiment, the cell interfaces 120a-n passively balances the battery cells 110a-n to redistribute charging and/or discharging of the battery cells 110a-n. In at least one embodiment, a cell interface may monitor a number of batteries connected in series (e.g., a number of battery cells in a group). In at least one embodiment, the battery cells 110a-n may be connected in other orders to cell interfaces 120a-n. In at least one embodiment, the battery cells 110a-n and/or cell interfaces 120a-n may be arranged in other orders in the battery stack 111.

Link bus 125 is a cable that communicatively connects the stack controller to the connected cell interfaces 120a-n in series. In at least one embodiment, the link bus 125 provides a digital communications channel between the stack controller and the cell interfaces 120a-n. In at least one embodiment, the link bus 125 also provides power from the stack controller to the cell interfaces 120a-n. In at least one embodiment, the link bus 125 includes both a power bus and a serial communication daisy chain. In at least one embodiment, the link bus 125 provides isolated Serial Peripheral Interface (isoSPI™) communication (up to 1 Mbps, for example) as digital communication channel(s). Any place in this specification that isoSPI™ is referred to any digital communications channel may be used. In an embodiment, the isoSPI™ link provides an isolated, differential serial link between each of the cell interfaces 120a-n and the stack controller. In an embodiment, each of the cell interfaces 120a-n is connected to the stack controller through the isoSPI™ link in a daisy-chain fashion, using link-in and link-out ports in each cell interface. In an embodiment, data flowing through the isoSPI™ link between a particular cell interface and the stack controller is shifted through all intervening cell interfaces in the chain of the link bus 125. In at least one embodiment, the daisy-chain of the link bus 125 simplifies the configuration of the battery management system 100, since no address assignment is required at the cell interface level when the battery management system 100 is connected.

In at least one embodiment, the link bus 125 provides a 24V direct current (DC) power supply for powering the cell interfaces 120a-n. In at least one embodiment, the link bus 125 also provides an electrical path for signals (e.g., fault pilot signals) to propagate to the cell interfaces 120a-n. In at least one embodiment, power is output from a link-out port of one cell interface (or the stack controller), and then is received at a link-in port of another cell interface.

Power line 130 is configured to carry electrical power into or out of the battery stack 111. In at least one embodiment, the battery cells 110a-n are connected in series in the power line 130, while the power line 130 is further connected to a load and/or charger/inverter that connect the battery stack 111 to a power grid.

Charger/inverter 135 includes a charger that is configured to provide a charging current to the battery stack 111, and an inverter that is configured to change direct current (DC) of the battery stack 111 to alternating current (AC) and output the AC power. In at least one embodiment, the charger and inverter may be separately connected to the power line 130. In another embodiment, the charger and inverter are combined into a single entity.

Switch 140a is an electrical switch that controls the connection and disconnection of the power line 130 to the charger/inverter 135. In at least one embodiment, the switch 140a is a main switch controlling the power line 130. In an embodiment, the switch 140a is a contactor that may be controlled by the power interface that may switch contactor coil currents to break or make the power line 130. In at least one embodiment, the switches in this specification may include, but are not limited to, electronic relays, transistors (and/or other semiconductor switches or threshold devices), electromagnetic switches, etc.

Switch 140b is an electrical switch that is connected in parallel with the switch 140a. In an embodiment, the switch 140b is a pre-charge switch that controls a pre-charge circuit with a current limiter to limit in-rush current through the pre-charge circuit. In another embodiment, the switch 140b may be used to connect other battery stacks to battery stack 111 in parallel.

Switch 140c is an electrical switch that is connected in the power line 130 for controlling the connection of the battery stack with the load. In an embodiment, the switches 140c may be controlled by the power interface under the control of external equipment.

Stack controller 150 is configured to control the battery stack 111. In at least one embodiment, stack controller 150 is connected via link bus 125 to cell interfaces 120a-b that monitor the battery cells 110a-n, respectively. In at least one embodiment, the stack controller 150 is also communicatively connected to at least one power interface for controlling the switches 140a-c. In an embodiment, a stack controller controls a single battery stack. In at least one embodiment, the stack controller 150 includes a link-out port that is connected to the link bus 125.

Stack bus 155 is a cable that communicatively connects the stack controller 150 to the power interface. In at least one embodiment, the stack bus 155 also provides power from the power interface to the stack controller 150 and/or other components of the battery management system 100. In at least one embodiment, the stack bus 155 provides 24V direct current (DC) power to the stack controller 150. The stack bus 155 may also include a CAN bus used as a digital communication channel(s). In at least one embodiment, the stack bus 155 also includes an electrical path for signals (e.g., fault pilot signals) to propagate via the stack bus 155 to all nodes on the stack bus 155. For example, the stack bus 155 may be connected to one stack controller node and one power interface node. Additionally, the stack bus 155 may be connected to other nodes that may be used as an expansion to the battery management system 100. In at least one embodiment, the nodes on the stack bus 155 may communicate with each other using CAN bus communication protocol via non-isolated CAN bus transceivers over the stack bus 155. In at least one embodiment, the power interface will supply operating power, via the stack bus 155, to other components in the battery management system 100 on an alternate pair of wires in the stack bus 155. In an embodiment, the operating voltage of the components in the battery management system 100 is 24V DC. In another embodiment, the operating voltage may be set to another voltage and/or may be unregulated. In at least one embodiment, the stack bus power supply is referenced to a power interface common, which is grounded to the chassis of the battery management system 100. In an embodiment, the battery management system 100 may draw up to 1 A from the stack bus power supply (in other embodiments, battery management system 100 may draw a different current).

Power interface 160 is an interface that monitors current and voltage as well as to control the switches 140a-c. In at least one embodiment, the power interface 160 interfaces directly with high voltage and high current components along the power line 130. In at least one embodiment, the power interface 160 transmits the measurement of current and voltage of the power line 130 to the stack controller 150 for analysis. In at least one embodiment, the power interface 160 may detect fault conditions (e.g., ground fault, software failure, failure of processors/microcontrollers, loss of communications), and may control the switches 140a-c accordingly (e.g., de-energizing the coils of the switches 140a-n to open the switches 140a-c). The fault detection and switch control will be discussed in conjunction with FIGS. 6-9 and 11A-B.

External power source 161 is an external power source that may provide system operating current to the power interface 160. In an embodiment, the power interface 160 may receive operating current from the battery stack 111, while the external power source 161 may be an alternative power source for the power interface 160.

Input conductor 165 is a conductor that connects a point in the power line 130 to the power interface 160. In at least one embodiment, system operating current may flow from the power line 130 directly to the power interface 160 directly via the input conductor 165, while the power interface 160 may measure the voltage in the power line 130. In another embodiment, the power interface 160 may measure the voltage in the power line 130, while the power interface derives system operating current from an alternate source via a separate conductor (e.g., the external power source 161).

Switch control conductor 167a, 167b, and 167c are conductors that connect the power interface 160 to the switches 140a, 140b, and 140c, respectively. In at least one embodiment, the power interface 160 controls the current flow in the switch control conductors 167a, 167b, and 167c to open and close the switches 140a, 140b, and 140c, respectively.

Current shunt 170 is a shunt or a resistor of accurately known resistance that is connected in the power line 130 in series with the load or charger/inverter 135 for accurately determining the current. In an embodiment, the resistance of current shunt 170 is small so as not to disrupt the power line 130. In at least one embodiment, measurement circuitry is connected across the current shunt 170 to measure the voltage, and the power interface 160 receives the measurement of the voltage and calculates the current in the power line 130 using the voltage and the known resistance of the current shunt 170.

Current limiter 175 is a resistor that is connected in series with the switch 140b in the pre-charge circuit. In at least one embodiment, the current limiter 175 is connected to limit in-rush current through the pre-charge circuit.

Figure 2:
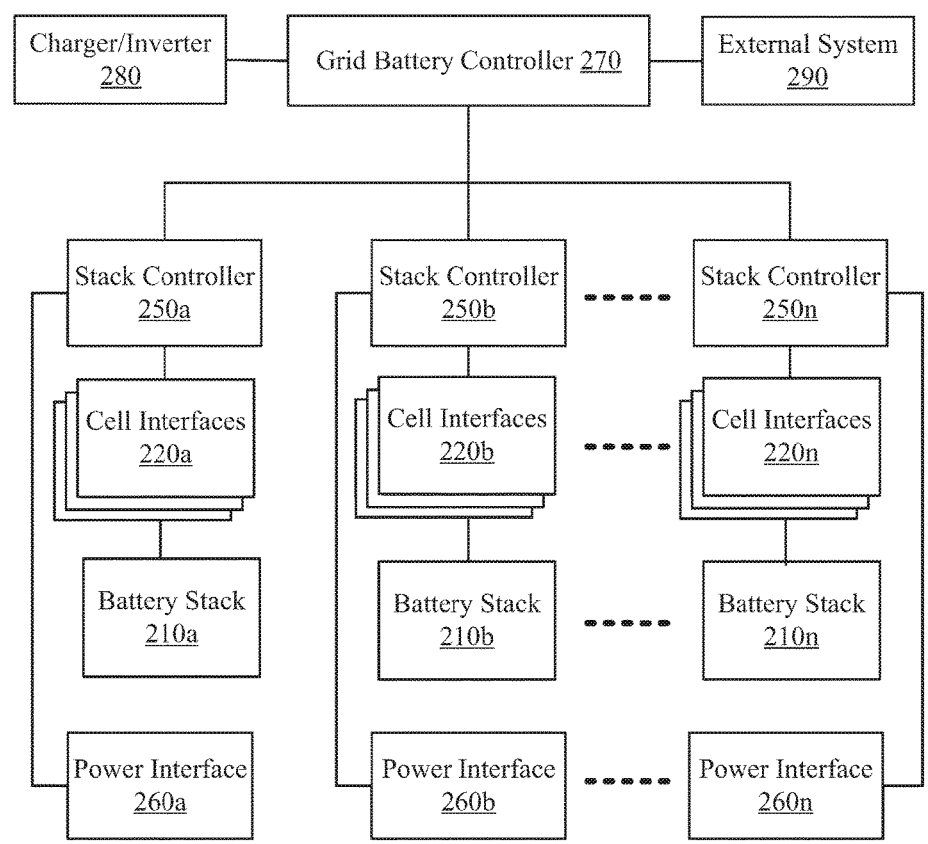
FIG. 2 shows a block diagram of another embodiment of the battery management system in a hierarchical structure.

FIG. 2 shows a block diagram of another embodiment of the battery management system 100 in a hierarchical structure. The battery management system 200 includes at least battery stacks 210a-n, cell interfaces 220a-n, stack controllers 250a-n, power interfaces 260a-n, grid battery controller 270, charger/inverter 280, and external system 290. In other embodiments, the battery management system 200 may not have all of the elements or features listed and/or may have other elements or features instead of or in addition to those listed.

FIG. 2 shows a block diagram 200 of a grid battery controller that controls a plurality of connected stack controllers. Each of the plurality of stack controllers is connected to a power interface and a plurality of cell interfaces that monitors cells in a battery stack. The stack controllers and a grid battery controller are interconnected with a communications bus, and each stack controller may be individually controlled by the grid battery controller.

Each of the battery stacks 210a-n may be an embodiment of the battery stack 111, which was discussed in conjunction with FIG. 1. Each of the cell interfaces 220a-n may include embodiments of the cell interfaces 120a-n, which were discussed in conjunction with FIG. 1. Each of the stack controllers 250a-n and power interfaces 260a-n may be an embodiment of the stack controller 150 and the power interface 160, respectively, which were discussed in conjunction with FIG. 1. Charger/inverter 280 may be an embodiment of the charger/inverter 135, which was discussed in conjunction with FIG. 1.

Grid battery controller 270 is configured to communicate and/or control a plurality of stack controllers in parallel. In an embodiment, a plurality of battery stacks are connected in parallel as a battery pack, while the grid battery controller 270 may serve as a supervisor for the battery pack and control each of the stack controllers in the battery pack. In at least one embodiment, the grid battery controller 270 is connected to each of the stack controllers 250a-n, via Ethernet or a Controller Area Network (CAN) bus. Alternatively, the grid battery controller 270 may communicate with the stack controllers 250a-n via (USB), Modbus (serial communications protocol), and/or other connections. In at least one embodiment, the grid battery controller 270 is connected to an external system and/or charger/inverter. In at least one embodiment, the grid battery controller 270 exposes all the data of the battery management system 100 to the external world and may also interface with 3rd-party inverters and/or chargers. In an embodiment, the grid battery controller 270 may summarize data and statistics pertinent to the battery stacks and report the overall system status. Throughout this specification, the terms "pack supervisor" and "grid battery controller" may be substituted one for the other to obtain different embodiments.

External system 290 is an external system that includes, but is not limited to, an external control system, an external power supply, and/or other external systems and/or equipments. In at least one embodiment, external system 290 may be connected to the grid battery controller 270, via an industry standard bus (e.g., Ethernet, CAN bus, Modbus 485, Modbus TCP, etc.). Alternatively or additionally, the external system 290 may communicate with the grid battery controller 270, via a USB connection. In at least one embodiment, the external system 290 supervises and/or controls the grid battery controller 270, and/or may perform Supervisory Control and Data Acquisition (SCADA) functions, allowing battery stacks to be monitored and controlled remotely. In at least one embodiment, the external system 290 may include a SCADA system operating with coded signals over communication channels so as to provide control of battery stacks remotely. The control system using external system 290 may be combined with a data acquisition system by adding the use of coded signals over communication channels to acquire information about the status of the battery stacks for display and/or for recording functions.

Figure 3:
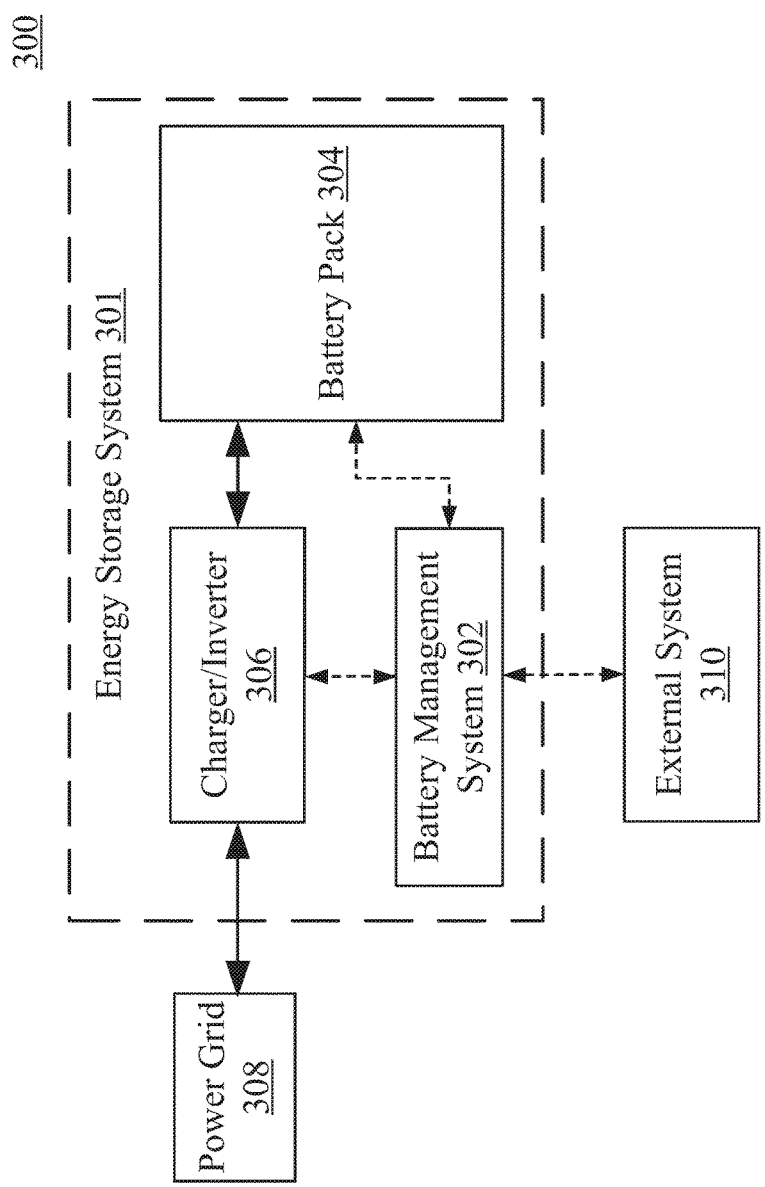
FIG. 3 shows a block diagram of an embodiment of the battery management system controlling an energy storage system.

FIG. 3 shows a block diagram 300 of an embodiment of the battery management system 100 controlling an energy storage system. The diagram 300 shows at least an energy storage system 301, a battery management system 302, a battery pack 304, charger/inverter 306, a power grid 308, and an external system 310. In other embodiments, the system in diagram 300 may not have all of the elements or features listed and/or may have other elements or features instead of or in addition to those listed.

FIG. 3 shows a block diagram 300 of an energy storage system that is connected to a power grid, while the energy storage system is controlled by the battery management system 302. Battery management system 302 may be an embodiment of battery management system 100. External systems may be connected to the battery management system 302 for supervisory control and/or data acquisition.

Battery management system 302 may be an embodiment of the battery management system 100 and/or 200, which were discussed in conjunction with FIGS. 1 and 2. Charger/inverter 306 may be an embodiment of the charger/inverter 135 and/or 280, which were discussed in conjunction with FIGS. 1 and 2.

Energy storage system 301 is a system that stores electrical energy in at least a battery pack. In at least one embodiment, the energy storage system 301 may be charged from and/or output power to a power grid under the control of the battery management system 302. In an embodiment, electrical power enters and exits the energy storage system 301 through the charger/inverter 306. In an embodiment, the charger/inverter 306 sets the usable power cap for the energy storage system 301. In at least one embodiment, the energy storage system 301 may grow in storage capacity, but voltage and current limits are determined by the choice and/or configuration of the charger/inverter 306. In at least one embodiment, since the charger/inverter 306 affects every battery cell in the battery pack of the energy storage system 301, the battery management system 302 monitors and/or accesses information about the entire battery pack in order to manage the charging and the safety of the system. In an embodiment, a single charger/inverter 306 communicates with a single battery management system 302 to manage a single battery pack. In other embodiments, the energy storage system 301 may be controlled differently.

Battery pack 304 includes a plurality of battery stacks (e.g., one or more battery stacks 111) connected in parallel. For example, a "3x5g14s2p" Pack (which may also be referred to as a "3x70s2p" pack) includes three "5g14s2p" stacks connected in parallel. Throughout this specification, the terms "battery pack" and "pack" may be substituted one for the other to obtain different embodiments.

Power grid 308 is a power network for delivering electricity. In at least one embodiment, the power grid 308 carries electrical power from the energy storage system 301 to grid attached systems, telecom, robotics, specialty vehicles, etc. In at least one embodiment, power grid 308 may provide power to be stored in the energy storage system 301.

External system 310 may be an embodiment of the external system 290, which was discussed in conjunction with FIG. 2. In an embodiment, the external system 310 may be connected to the battery management system 302 (e.g., the stack controller 150, power interface 160, grid battery controller 270) for supervision, control, and/or data acquisition. In an embodiment, the external system 310 may reside within or behind the charger/inverter 306 and communicate with other control systems present on the power grid 308. In other applications, the battery management system 302 may control the charger/inverter directly while communicating with the external system 310 over a separate communication link.

In at least one embodiment, the solid lines indicate the flow of electrical power between the battery pack 304, charger/inverter 306, and/or power grid 308. The dashed lines indicate the communication between the battery management system 302, battery pack 304, charger/inverter 306, and/or external control system 310. In at least one embodiment, the battery management system 302 may be powered using the power in the energy storage system 301 and/or an isolated power supply.

Figure 4:
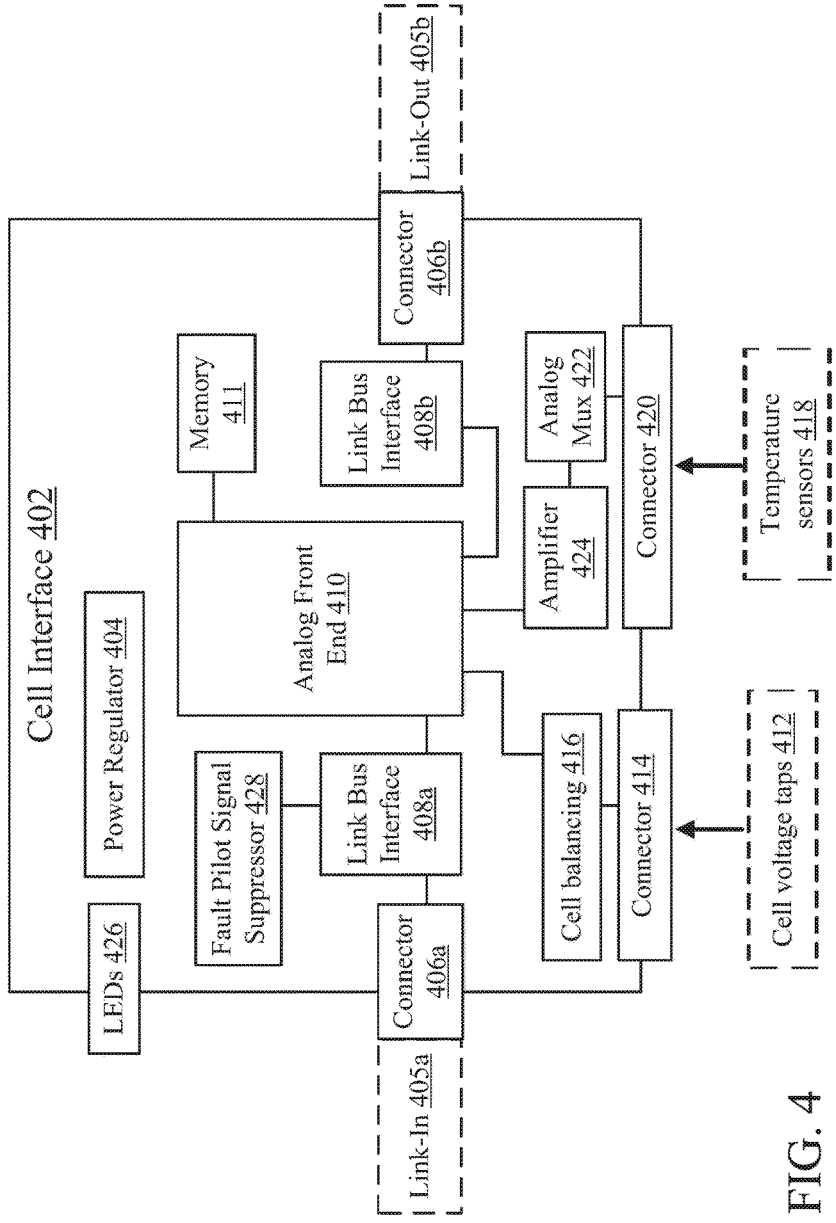
FIG. 4 shows a block diagram of an embodiment of a cell interface that may be used in the battery management system.

FIG. 4 shows a block diagram 400 of an embodiment of a cell interface that may be used in the battery management system 100. The system in diagram 400 includes at least a cell interface 402, a power regulator 404, an input communication channel (link-in) 405a, an output communication channel (link-out) 405b, connectors 406a and 406b, link bus interfaces 408a and 408b, an analog front end 410, a memory 411, cell voltage taps 412, a cell voltage connector 414, cell balancing 416, temperature sensors 418, a temperature sensor connector 420, an analog multiplexor 422, an amplifier 424, LEDs 426, and a fault pilot signal suppressor 428. In other embodiments, cell interface 402 may not have all of the elements or features listed and/or may have other elements or features instead of or in addition to those listed.

FIG. 4 shows a block diagram 400 of the components in the cell interfaces 120a-n. Cell interface 402 may be an embodiment of any of the cell interfaces 120a and 220a-n, which were discussed in conjunction with FIGS. 1 and 2, respectively. In at least one embodiment, the cell interface 402 may monitor multiple battery cells in a group and may be referred to as a multi-cell interface. In an embodiment, the cell interface 402 does not include high voltage and/or high current interfaces.

Power regulator 404 is a DC-DC regulator/converter that receives and regulates/converts the DC power received from the link bus 125 to power the components in the cell interface 402. In at least one embodiment, the power regulator 404 receives 24V DC power input from the link bus 125 and converts to other voltages. In at least one embodiment, high voltage isolation is desired in the battery management system 100 to protect circuitry and personnel in case of a ground fault in the battery stack 111. In an embodiment, the power regulator 404 supports a working voltage of up to 1000 VDC, using capacitors on the cell interface 402 for galvanic isolation.

Link-in 405a is an incoming end of the link bus 125 regarding the connected cell interface 402. Link-in 405a may be a two-wire connector. In at least one embodiment, link-in 405a carries data communication as well as electrical power.

Link-out 405b is an outgoing end of the link bus 125 regarding the connected cell interface 402. Link-out 405b may be a two-wire connector. In at least one embodiment, link-out 405b carries data communication as well as electrical power. In at least one embodiment, a link-out of one cell interface may be connected to a link-in of another cell interface, in order to connect a plurality of cell interfaces in series using the link bus 125.

Connectors 406a and 406b are connectors that connect link-in 405a and link-out 405b of the link bus 125, respectively, to the link bus interfaces 408a and 408b. In at least one embodiment, the connectors 406a and 406b are 4-pin connectors (2× isoSPI™, V+, V−, with embedded fault signal).

Link bus interfaces 408a and 408b provide power and/or communication between the link bus 125 and the cell interfaces 402. In at least one embodiment, the link bus interfaces 408a and 408b are communicatively connected to the analog front end to communicate sensing signals and/or other signals to the link bus 125. In an embodiment, the link bus interfaces 408a and 408b include isolated serial peripheral interface (isoSPI™ bus) provided in LTC6804, DC blocking capacitors, and/or Ethernet transformer for communication.

Analog front end 410 is an analog front end (AFE) that is configured to interface a plurality of sensors to collect, process, and/or communicate sensed data to digital systems (e.g., processors, microcontrollers). In at least one embodiment, the AFE 410 receives sensing signals about the voltage and temperature of the connected battery cell(s), and sends data to the stack controller 150, via the link bus 125. In an embodiment, the AFE 410 is LTC6804. In an embodiment, the cell interface 402 may include more than one AFE as a population option to support the monitoring of a larger number of battery cells.

Memory 411 is a memory system that is connected to the AFE 410. In an embodiment, the memory 411 may include electrically erasable programmable read-only memory (EEPROM) that may be attached to an I2C bus of AFE 410. The EEPROM may be used to store manufacturing information, build information, etc., which may be accessed via the isoSPI™ bus. In other embodiments, the memory 411 may have different sizes and/or access methods.

Cell voltage taps 412 are connected to different points in the connected battery cell or group of cells (e.g., a battery group may include a number of battery cells connected in series) to measure and/or regulate the voltage output between two connected points. In an embodiment, cell voltage taps 412 supports up to 12 battery cells with one AFE 410 or up to 16 battery cells with two AFEs.

Cell voltage connector 414 is a connector to which the cell voltage taps 412 are connected and transmits the voltage data to the cell interface 402. In at least one embodiment, the cell voltage connector 414 includes an 18-pin (9×2) connector.

Cell balancing 416 is passive balancing that is configured to redistribute charging and/or discharging cycles of the battery cells 110a-n. In an embodiment, the cell balancing 416 includes balancing resistor switches that are used to balance passively the battery cells based on the capacities of each cell. In an embodiment, energy may be drawn or bypassed from the most charged battery cell or cells and is wasted as heat dissipated in the balancing resistors.

Temperature sensors 418 are temperature sensors that monitor the temperature of the battery cell or a group of battery cells monitored by the cell interface 402. In an embodiment, the temperature sensors 418 generate analog signals. In an embodiment, the temperature sensors 418 includes up to 8 temperature probes that are connected to the battery cells for monitoring of cell temperature. In other embodiments, the temperature sensors 418 include other numbers of temperature probes.

Temperature sensor connector 420 is a connector to which the probes of the temperature sensors 418 are connected to transmit the analog signals to the cell interface 402. In at least one embodiment, the temperature sensor connector 420 includes a 16-pin (8×2) connector.

Analog multiplexor 422 is a multiplexer that selects one of several analog input signals received from the temperature sensors 418 and forwards the selected input into a single line to a signal amplifier.

Amplifier 424 is an electronic amplifier that amplifies the signals received from the temperature sensors 418 and transmits to the AFE 410. In at least one embodiment, the analog multiplexor 422 and amplifier 424 serve as supporting circuitry to deliver the signals from the temperature sensors 418 to the AFE 410.

LEDs 426 are a number of LEDs that serve as indicators indicating the status of the cell interface 402. In an embodiment, LEDs 426 may display statuses, such as "Power" (indicating that power is being provided to the cell interface 402), "Activity" (indicating that an activity, such as signal sensing and/or fault suppressing, is being performed), and/or "Fault" (indicating that a fault was discovered). In at least one embodiment, the LEDs that may display the statuses "Power" and/or "Activity" are controlled by the power regulator 404 and/or the AFE 410. In at least one embodiment, the LED that may display "Fault" is controlled by the stack controller 150, which may send instructions, via link bus 125 to activate the "Fault" LED on the cell interface 402.

Fault pilot signal suppressor 428 is a signal suppressor that suppresses a fault pilot signal embedded in the link bus 125, indicating a fault condition in the cell interface (e.g., loss of connection from the voltage taps 412 and/or temperature sensors 418, AFE failure). In at least one embodiment, a pilot signal is transmitted (e.g., using a single frequency) over a communications system for supervisory, control, equalization, continuity, synchronization, or reference purposes. In an embodiment, the fault pilot signal is an AC signal that is embedded in DC power rail in the link bus and/or stack bus. The propagation and suppression of fault pilot signal will be discussed in conjunction with FIGS. 7-9 and 11B.

Figure 5:
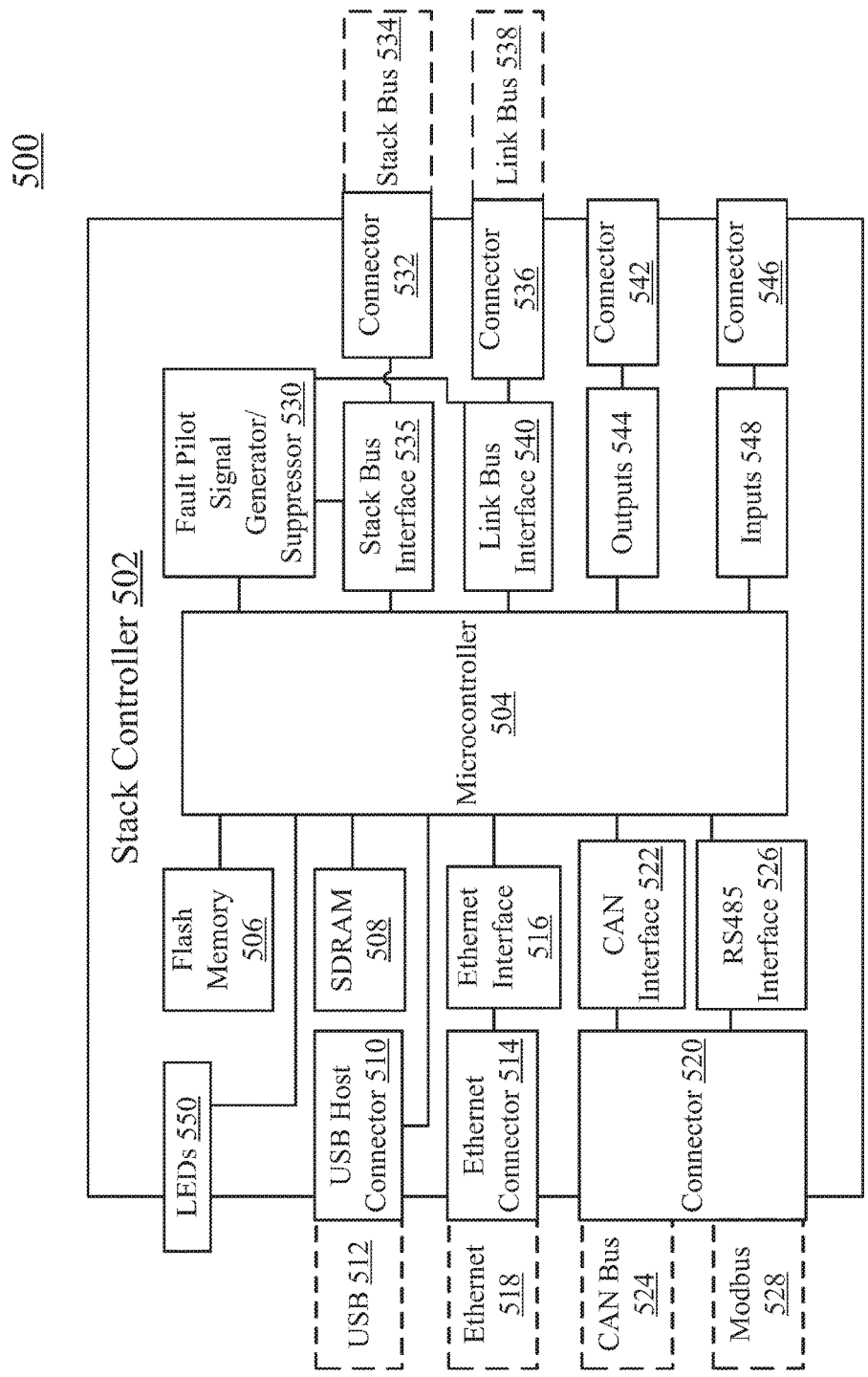
FIG. 5 shows a block diagram of an embodiment of a stack controller that may be used in the battery management system.

FIG. 5 shows a block diagram 500 of an embodiment of a stack controller that may be used in the battery management system 100. The system in diagram 500 includes at least a stack controller 502, a microcontroller 504, a flash memory 506, SDRAM 508, a USB host connector 510, USB 512, an Ethernet connector 514, an Ethernet interface 516, Ethernet 518, a connector 520, a CAN interface 522, CAN bus 524, a RS485 interface 526, Modbus 528, fault pilot signal generator/suppressor 530, a connector 532, a stack bus 534, a stack bus interface 535, a connector 536, a link bus 538, a link bus interface 540, a connector 542, outputs 544, a connector 546, inputs 548, and LEDs 550. In other embodiments, the system in diagram 500 may not have all of the elements or features listed and/or may have other elements or features instead of or in addition to those listed.

FIG. 5 shows a block diagram 500 of the components in the stack controller 150. Stack controller 502 may be an embodiment of any of the stack controllers 150 and 250*a-n*, which were discussed in conjunction with FIGS. 1 and 2, respectively. In at least one embodiment, the stack controller 502 includes a communication interface to connect external systems. In at least one embodiment, the stack controller 502 may also expose diagnostics interfaces and/or debug serial port for use during development. Link bus 538 and stack bus 534 may be embodiments of the link bus 125 and stack bus 155, which were discussed in conjunction with FIG. 1.

Microcontroller (MCU) 504 is a microcontroller for controlling a plurality of modules and/or components in the stack controller 502. In at least one embodiment, the microcontroller 504 includes at least a microprocessor that is connected to a memory system. In at least one embodiment, the microcontroller 504 is configured to monitor and control the connected cell interfaces and power interface.

Flash memory 506 is an electronic non-volatile computer storage medium that is connected to the microcontroller 504.

SDRAM 508 is a Synchronous Dynamic Random Access Memory (SDRAM). In at least one embodiment, the flash memory 506 and SDRAM 508 serve as auxiliary memory systems as a population option. Alternatively or additionally, the stack controller 502 may include other systems.

USB host connector 510 is a Universal Serial Bus (USB)-A female connector to which peripherals and/or external systems may be plugged using a USB cable. In at least one embodiment, the USB host connector 510 provides a service port for attaching a laptop or a firmware upgrade or configuration update from a laptop or memory stick. In an embodiment, the USB host connector 510 may also provide an alternative channel for communication with external systems.

USB 512 is the USB connection used for communication between the stack controller 502 and external systems.

Ethernet connector 514 is a connector to which an Ethernet cable may be connected. In at least one embodiment, the Ethernet connector 514 is an RJ-45 connector with activity LEDs that indicate configuration and activity on the Ethernet channel.

Ethernet interface 516 is an interface (e.g., standard dual pulse transformer and common mode filter) that transmits and receives data via Ethernet (e.g., from an external system) and transmits/receives the abovementioned data to/from the microcontroller 504. In an embodiment, the Ethernet interface 516 includes 10BASE-T and 100BASE-TX. In at least one embodiment, the Ethernet interface 516 may be used to connect the battery management system 100 to external control systems as well as for interconnection of multiple stack controllers in large multi-stack systems.

Ethernet 518 is Ethernet standard communication channel used for communication between the stack controller 502 and external systems.

In an embodiment, connector 520 includes at least a connector and a terminator for Controller Area Network (CAN) bus. In an embodiment, connector 520 may also include at least a connector and a terminator for RS485 Modbus. In at least one embodiment, the connector 520 is a 12-pin connector that includes +V_isoCAN (e.g., for inputting +10-30V isolated power via the CAN bus), −V_isoCAN (e.g., providing a return path of the +10-30V isolated power), CAN_HI and CAN_LO (e.g., for connecting to CAN transceiver), TERM1 and TERM2 (e.g., providing a termination to the CAN bus through a 120Ω resistor), Modbus D1 and D0 (e.g., for connecting a Modbus data line), TERM3 and TERM4 (e.g., providing a termination to the Modbus data line through a 150Ω resistor), +VSYS_485 and CHAS (e.g., for providing operating power for an external transceiver).

CAN interface 522 is an interface that transmits and receives data via a CAN bus, and transmits/receives the abovementioned data to/from the microcontroller 504. In at least one embodiment, the CAN interface 522 may be used to connect the battery management system 100 to external control systems. Alternatively or additionally, the CAN interface 522 may be used to interconnect multiple stack controllers in large multi-stack systems (e.g., an energy storage system such as 301 may include multiple battery stacks connected in parallel in a battery pack). In an embodiment, the CAN interface 522 is electrically isolated through use of an isolating CAN transceiver. In an embodiment, isolated power provided to the CAN interface 522 via the connector 520 is used only to power the isolation transceiver on the stack controller. In another embodiment, the CAN interface 522 may be powered via the stack bus 534.

CAN bus 524 is a controller area network communication channel. In at least one embodiment, the CAN bus 524 allows microcontroller 504 and other modules and/or circuits to communicate with each other without a host computer.

RS485 interface 526 is an interface that transmits and receives data via Modbus, and transmits/receives the abovementioned data to/from the microcontroller 504. In at least one embodiment, RS485 interface 526 is not an isolated interface, and has a common reference to ground.

Modbus 528 is a RS485 communication channel using the Modbus serial communications protocol, via which external systems may be connected to the stack controller 502. In at least one embodiment, the external system 290 and/or 310 may be connected to the stack controller 502, via Modbus 528.

Fault pilot signal generator/suppressor 530 includes at least a fault pilot signal generator/emitter that generates AC signal that is embedded in the DC power (e.g., the 24V DC supply) in the link bus 125 and stack bus 155. In at least one embodiment, the fault pilot signal generator includes an AC emitter. In an embodiment, the AC emitter of the fault pilot signal generator produces a 55 kHz sinusoidal pilot signal, with a magnitude of approximately 1V pk-pk at the source, AC coupled through moderately high impedance onto a DC power bus for the stack bus 534 and/or the link bus 538.

In at least one embodiment, the fault pilot signal generator/suppressor 530 also includes a fault pilot signal suppressor that suppresses the AC fault pilot signal to indicate a fault condition (e.g., software failure, failure of microcontroller 504, loss of connection with cell interfaces and/or power interface). In at least one embodiment, to suppress the AC fault pilot signal, the fault pilot signal suppressor includes, for example, a 4.7 µF/50V capacitor with a 4.7 kΩ resistor in series across bus power rail (e.g., in the stack bus 534 and/or link bus 538), and uses a Metal-Oxide-Semiconductor Field-Effect Transistor (MOSFET) to short the resistor in order to signal the fault. The capacitor in the fault pilot signal suppressor would then effectively dampen the fault pilot signal, and the absence of the fault pilot signal would be detected by a fault pilot signal detector (e.g., in the power interface 160). The fault pilot signal generation and suppression will be discussed in conjunction with FIGS. 7-9 and 11B.

Connector 532 is a connector to which the stack bus 534 is connected. In at least one embodiment, the connector 532 is a 6-pin connector (CAN+, CAN−, termination, V+, V−/Shield, with embedded fault pilot signal).

Stack bus interface 535 provides power and/or communication between the stack bus 534 and the stack controller 502. In an embodiment, the stack bus interface 535 receives 24V DC power input from the stack bus 534. In at least one embodiment, the stack bus interface 535 is communicatively connected to the microcontroller 504 to transmit data received via stack bus 534 to the microcontroller 504. In an embodiment, the stack bus interface 535 communicates via CAN bus with cell interfaces and/or power interface. In an embodiment, the stack bus interface 535 is connected to the fault pilot signal generator/suppressor 530, so that the generated fault pilot signal may be embedded in the stack bus 534.

Connector 536 is a connector to which the link bus 538 is connected. In at least one embodiment, the connector 536 is a 4-pin connector (2× isoSPI™, V+, V−, with embedded fault signal).

Link bus interface 540 delivers power to and/or allows communication between the link bus 538 and the stack controller 502. In at least one embodiment, the link bus interface 540 outputs 24V DC power with short-circuit protection via the link bus 538. In an embodiment, the link bus interface 540 uses an isolated Serial Peripheral Interface (isoSPI™) bus to communicate with cell interfaces. The isolated isoSPI™ provides a two wire connection, via which the stack controller 502 and devices connected to the link bus 538 can communicate while remaining isolated from one another (permitting devices connected to the link bus 502 to operate at different voltage reference levels) during the communication. In at least one embodiment, the link bus interface 540 is communicatively connected to the microcontroller 504 to transmit and receive data via link bus 538 to/from the microcontroller 504. In an embodiment, in addition to the isoSPI™ communication channel, operating power is also provided to devices connected to the link bus 538. In an embodiment, the link bus interface 540 is connected to the fault pilot signal generator/suppressor 530, so that the generated fault pilot signal may be embedded in the link bus 538.

Connector 542 is a connector to which optional digital outputs may be connected. In at least one embodiment, the connector 542 is a 10-pin connector.

Outputs 544 are optional digital outputs that may be connected to the microcontroller 504 of the stack controller 502. In at least one embodiment, outputs 544 provide interface for the microcontroller 504 to output signals to other components of the battery management system 100 and/or external system.

Connector 546 is a connector to which optional digital inputs may be connected. In at least one embodiment, the connector 546 is an 8-pin connector.

Inputs 548 are optional digital inputs that may be connected to the microcontroller 504 of the stack controller 502. In at least one embodiment, inputs 548 provide interface for external system and/or other components of the battery management system 100 to input signals to the microcontroller 504.

LEDs 550 are a number of LEDs that serve as indicators indicating the status of stack controller 502. In an embodiment, LEDs 550 may display statuses, such as "Power" (indicating that power is being provided to the stack controller) "Activity" (indicating that an activity, such as signal processing and/or fault testing, is being performed) and/or "Fault" (indicating that a fault was discovered). In at least one embodiment, the LEDs 550 are controlled by the microcontroller 504.

Figure 6:
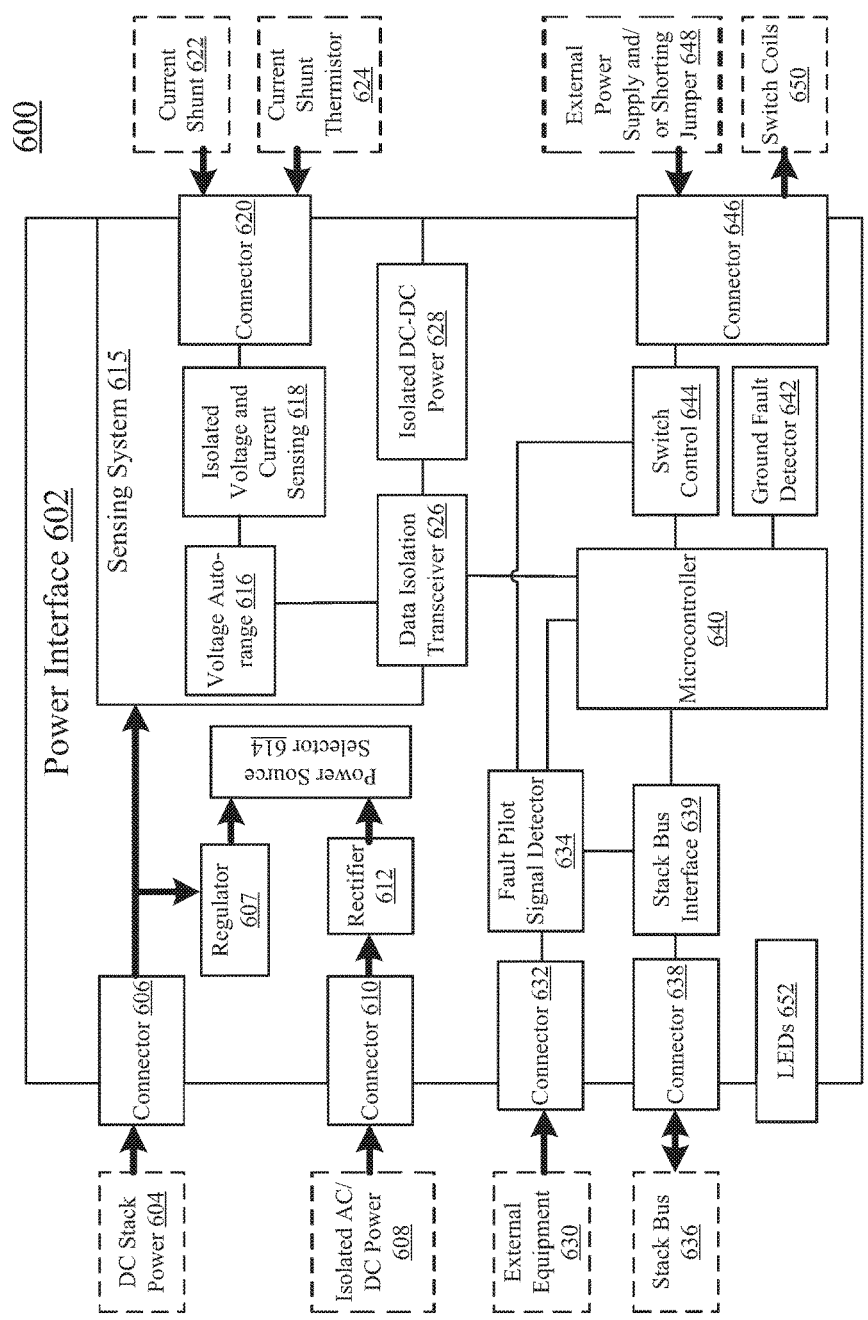
FIG. 6 shows a block diagram of an embodiment of a power interface that may be used in the battery management system.

FIG. 6 shows a block diagram 600 of an embodiment of a power interface that may be used in the battery management system 100. The system in diagram 500 includes at least a power interface 602, DC stack power 604, a connector 606, a regulator 607, isolated AC/DC power 608, a connector 610, a rectifier 612, a power source selector 614, a sensing system 615, voltage auto-range 616, isolated voltage and current sensing 618, a connector 620, a current shunt 622, a current shunt thermistor 624, data isolation transceiver 626, isolated DC-DC power 628, external equipment 630, a connector 632, a fault pilot signal detector 634, a stack bus 636, a connector 638, a stack bus interface 639, a microcontroller 640, a ground fault detector 642, switch control 644, a connector 646, external power supply or shorting jumper 648, switch coils 650, and LEDs 652. In other embodiments, the power interface 602 may not have all of the elements or features listed and/or may have other elements or features instead of or in addition to those listed.

FIG. 6 shows a block diagram 600 of the components in the power interface 602.

Power interface 602 may be an embodiment of any of the power interfaces 160 and 260a-n, which were discussed in conjunction with FIGS. 1 and 2, respectively. The power interface 602 may be connected to dual power sources to power the components in the battery management system 100. The power interface 602 provides data collection interfaces which receive a high voltage input from the battery stack 111 and input from the current shunt 170, in order to measure overall battery stack voltage and current. The power interface 602 may detect fault conditions and accordingly control the switches 140a-c. The power interface 602 may be connected to and/or controlled by external equipments and/or external systems.

Current shunt 622 and stack bus 636 may be embodiments of the current shunt 170 and stack bus 155, respectively, which were discussed in conjunction with FIG. 1.

DC stack power 604 is power supply directly received from the battery stack 111 via the input conductor 165.

Connector 606 is a connector to which the battery stack's positive end from input conductor 165 is connected for delivering electrical supply directly from the power line 130 to the power interface 602. In at least one embodiment, the connector 606 is a 3-pin connector, in which only one pin is used. This allows safety isolation from the battery stack's negative end, since in the case of a high-voltage battery stack, presenting both ends within the same connector could be hazardous.

Regulator 607 is a DC-DC regulator/converter that regulates/converts the DC power input from the battery stack 111 to other voltages (e.g., low voltages) in order to power the components in the power interface 602 and the rest of the battery management system 302.

Isolated AC/DC power 608 is an isolated power supply from a standard line transformer or battery. In an embodiment, the Isolated AC/DC power 608 provides 24V AC or DC power in order to power the components in the power interface 602 and the rest of the battery management system 302.

Connector 610 is a connector to which the isolated AC/DC power 608 is connected for supplying isolated power to the power interface 602. In at least one embodiment, the connector 610 is a 2-pin connector.

Rectifier 612 is a rectifier that converts alternating current (AC), which is received from the isolated AC/DC power 608, to DC power.

Power source selector 614 is a selector including at least switches for selecting either the DC stack power 604 or the isolated AC/DC power 608 as the power source for the power interface 602. In at least one embodiment, the power source selector 614 selects the higher of the DC stack power 604 and isolated AC/DC power as the operating source of the power interface 602. In at least one embodiment, the components of the power interface 602 (as well as the stack controller 502 and/or cell interfaces 402) accept a nominal 24V DC power.

Sensing system 615 is a high precision current and/or voltage sensing system. In at least one embodiment, the sensing system 615 measures voltage of the battery stack 111 and current via the current shunt 170. In at least one embodiment, the sensing system 615 transmits sensing signals to the microcontroller in the power interface 602 for analysis.

Voltage auto-range 616 automatically adjusts the scaling/range of the input voltage so that the measurement of the voltage uses the full precision of the sensing system 615. In at least one embodiment, the voltage auto-range 616 allows the sensing system 615 to measure voltage input with high dynamic range. In at least one embodiment, the voltage auto-range 616 is omitted, and voltage range selected by design of power interface appropriate for the stack voltage to which the power interface is to connect.

Isolated voltage and current sensing 618 isolates voltage sensing (e.g., measuring the input voltage using voltage auto-range 616) and current sensing (e.g., via the current shunt 622).

Connector 620 is a connector to which the current shunt 622 and current shunt thermistor are connected. In at least one embodiment, the connector 620 is a 4-pin connector, 2-pin for connecting the current shunt 622 and 2-pin for the thermistor. In at least one embodiment, the connector 620 includes two connectors, including a 4-pin connector for the current shunt 622 connection and connection to the battery stack's negative end, and a 2-pin connector for the thermistor. In at least one embodiment, the sensing system 615 includes a current shunt interface with high dynamic range and low offset error current for precision coulomb counting that calculates remaining capacity in the battery stack 111 by measuring the current entering (charging) or leaving (discharging) the battery stack 111.

Current shunt thermistor 624 is an electrical resistor that is dependent on temperature that is used to measure the temperature of the current shunt 622, allowing compensation for the small temperature-dependent variation that the current shunt 622 typically exhibits.

Data isolation transceiver 626 is a transceiver 626 that galvanically isolates the data communication between the sensing system 615 and the microcontroller from the rest of the power interface 602.

Isolated DC-DC power 628 galvanically isolates power for powering the sensing system 615 from the rest of the power interface 602.

External equipment 630 is external to the battery management system 100 and can be connected to the power interface 602 for controlling the system. In an embodiment, the coils of the switches 140a-c will not be energized by the battery management system 100 unless the external equipment 630 connects two points in a connector in the power interface 602. In at least one embodiment, the external equipment 630 (by opening a switch in the external equipment 630) may force de-energizing of switch coils to cause all switches 140a-c to open (to disconnect the power line 130). In an embodiment, it is desirable and/or required to use the external equipment 630 to disconnect the power line 130 in some fault situation not detected by the battery management system 100. Alternatively, if the external equipment 630 is not used or required, a shorting jumper may be connected to the two points in the connector where the external equipment 630 was connected. In an embodiment, disconnecting the shorting jumper may cause all switches 140a-n to open.

Connector 632 is a connector to which the external equipment 630 is connected. In at least one embodiment, the connector 646 includes three points/pins, allowing the external equipment 630 to be connected in different ways in different situations for controlling the switches 140a-c.

Fault pilot signal detector 634 is a signal detector that detects the AC fault pilot signal that is embedded in the stack bus 636. In at least one embodiment, an absence of the fault pilot signal may indicate that the fault pilot signal is suppressed by a fault pilot signal suppressor (e.g., fault pilot signal suppressor 428 in the cell interface 402, fault pilot signal generator/suppressor 530 in the stack controller 150), indicating a fault condition. In at least one embodiment, the fault pilot signal detector 634 monitors the AC fault pilot signal and detects disappearance of the AC signal. In an embodiment, the fault pilot signal detector 634 includes an envelope detector tuned for 55 kHz. In an embodiment, the power interface 602 may take direct hardware action (e.g., de-energizing coils of the switches 140a-c to open the switches 140a-c) based upon the detected absence of fault pilot signal.

In at least one embodiment, the fault pilot signal detector 634 outputs signals to the microcontroller of the power interface 602, which may send instructions to the switch control for controlling the switches 140a-c. Alternatively or additionally, the battery management system 100 includes a de-energizing response behavior that may de-energize the switch coils in response to the detection of absence of fault pilot signal, independent of the microcontroller of the power interface 602. In at least one embodiment, the fault pilot signal detector 634 may output directly to the switch control, and the switch control can cause immediate de-energizing of the switch coils, with no software interaction required. In at least one embodiment, the direct connection between the fault pilot signal detector 634 and the switch control allows detection and control of the switches 140a-c using hardware, independent of the software (e.g., of the microcontroller and/or processor) in the battery management system 100.

In at least one embodiment, the de-energizing response behavior may be defeated by the external equipment 630 (or a shorting jumper), via the connector 632 to which the external equipment 630 is connected to control the switch operation. In at least one embodiment, a user may choose via the external equipment 630 whether the detection of absence of fault pilot signal would directly cause opening of the switches 140a-c. In an embodiment, the connection of the external equipment 630 to the connector 632 may prevent the fault detection by the fault pilot signal detector 634 from directly de-energizing the coils of the switches 140a-c, while still allowing the microcontroller of the power interface 602 to instruct the switch control to control the switches 140a-n. Alternatively, the connection of the external equipment 630 to the connector 632 may permit the power interface 602 to de-energize the coils of the switches 140a-c directly in response to detected absence of fault pilot signal.

Connector 638 is a connector to which the stack bus 636 is connected. In at least one embodiment, the connector 638 is a 6-pin connector (CAN+, CAN−, termination, V+, V−/Shield, with embedded fault pilot signal).

Stack bus interface 639 provides power and/or communication between the power interface 602 and the stack controller 150 via the stack bus 636. In an embodiment, the stack bus interface 639 provides 24V DC for powering the stack controller 150 and/or cell interfaces 120*a-n*. In at least one embodiment, the stack bus interface 639 is communicatively connected to the microcontroller. In an embodiment, the stack bus interface 639 includes a CAN bus interface that is used to communicate with the stack controller 150. In an embodiment, the stack bus interface 639 is connected to the fault pilot signal detector 634, which monitors fault pilot signal embedded in the stack bus 636.

Microcontroller 640 is a microcontroller that controls the components in the power interface 602. In at least one embodiment, the microcontroller 640 includes at least a microprocessor that is connected to a memory system. In at least one embodiment, the microcontroller 640 is configured to monitor the voltage, current, and/or charge (e.g., through coulomb counting), and/or to report to the stack controller 150. In at least one embodiment, the microcontroller 640 includes integrated Random-access Memory (RAM), Flash, CAN, and/or serial interfaces. In at least one embodiment, the microcontroller 640 includes diagnostics interfaces and/or a debug serial port for use during development.

In at least one embodiment, the microcontroller 640 monitors and reports ground fault and/or absence of fault pilot signals to a switch control that controls the switches 140*a-c*. Additionally, the fault pilot signal detector 634 may directly output to the switch control, and the switch control may control the switches 140*a-c* without requiring control instructions received from the microcontroller 640. In at least one embodiment, software control (e.g., via the microcontroller 640) of the switches 140*a-n* is slower but more flexible than hardware control (e.g., using the external equipment 630 and/or direct connection between the fault pilot signal detector 634 and switch control). In an embodiment, some delay may be included in either suppressing the fault pilot signal or detecting a suppressed fault pilot signal to give the software control paths time to take action. In an embodiment, the microcontroller 640 detects the fault pilot signal, and on a fault de-assertion, implements a timer that waits for ten seconds, for example, before energizing any switch coil. If the control path via the microcontroller 640 has had a sufficient time window to act and has failed to do so (or in case of microcontroller failure and/or disconnection of communication in the battery management system 100), the switches 140*a-c* can be controlled using hardware without the software interaction in the microcontroller 640.

Microcontroller 504 and microcontroller 640 may have a master-slave relationship to one another, in which microcontroller 504 controls microcontroller 640. Microcontroller 640 is in the power interface, whereas microcontroller 504 is in the stack controller. Software running on microcontroller 504 controls the battery management system, whereas software running on microcontroller 640 may operate in a failsafe manner in the absence of ongoing instructions from microcontroller 504.

Ground fault detector 642 is a detector that detects unintentional current paths between the battery stack 111 and the ground. The ground fault detection will be discussed in conjunction with FIGS. 8, 9, and 11A.

Switch control 644 controls the coils of the switches 140*a-c*. In at least one embodiment, the switch control 644 may control the power to the coils that is directly supplied from the power interface 602. In at least one embodiment, the coil requirements are within the power supply capabilities of the power interface 602. Alternatively, operating power for the coils of switches 140*a-c* may be provided by an external power supply, while the switch control 644 may switch currents driven from that external power supply.

Connector 646 is a connector to which the switch coils, external power supply, and/or shorting jumper may be connected. In at least one embodiment, the connector 646 includes at least 8 pins for switching of up to four high-current contactors (switches) with configurable functions. In at least one embodiment, the connector 646 is a 12-pin connector, to provide electrical connections for up to four high-current contactors, as well as power source selection and optional external power connections.

External power supply or shorting jumper 648 may include an external power source for energizing the switch coils of the high-current contactors. In an embodiment, the external power supply may be on the circuit board of the power interface 602 (selected by the attachment of a shorting jumper to connector 646) or off the circuit board (selected by the attachment of an external power supply to connector 646).

Switch coils 650 are coils of a number of switches or high-current contactors (e.g., the switches 140*a-c*) that are controlled by the switch control 644. In an embodiment, the switch coils 650 are stipulated to have 24 VDC operating voltage, in order to match the system operating voltage, thereby permitting switch operation using the power supply included in the power interface 602.

LEDs 652 are a number of LEDs that serve as indicators indicating the status of the power interface 602. In an embodiment, the LEDs 652 may display status, such as "Power" (indicating that power is being provided by the DC Stack Power 604, or by the Isolated AC/DC Power 608), "Activity" (indicating that activity, such as fault testing and/or sensing activity, is being performed) and/or "Fault" (indicating a fault condition was discovered). In at least one embodiment, the LEDs 652 are controlled by the microcontroller 504.

Figure 7:
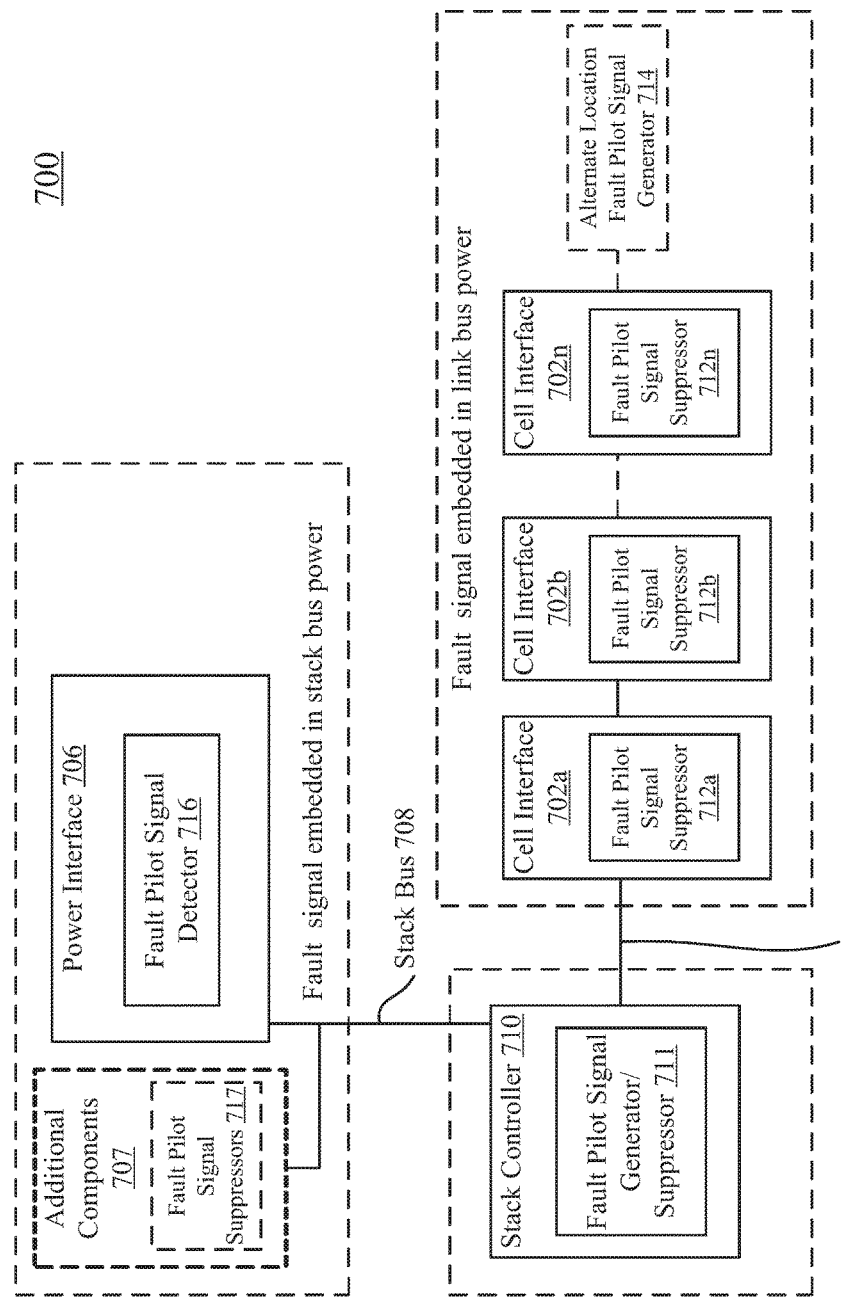
FIG. 7 shows a block diagram of an embodiment of fault detection using the fault pilot signal.

FIG. 7 shows a block diagram 700 of an embodiment of fault detection using the fault pilot signal. The system in diagram 700 includes at least cell interfaces 702*a-n*, a link bus 704, a power interface 706, zero or more additional components 707, a stack bus 708, a stack controller 710, a fault pilot signal generator/suppressor 711, fault pilot signal suppressor 712*a-n*, zero or one alternate location fault pilot signal generator 714, fault pilot signal detector 716, and a fault pilot signal suppressors 717. In other embodiments, the system in diagram 700 may not have all of the elements or features listed and/or may have other elements or features instead of or in addition to those listed.

FIG. 7 shows a block diagram 700 of fault detection in addition to the detection of ground fault in the battery stack 111. In at least one embodiment, the battery management system includes a fault pilot signaling mechanism that is redundant to the software mechanism by which the switches or high-current contactors 650 are controlled using the microcontroller 640 (e.g., activation and deactivation of switches 140*a-e*).

In at least one embodiment, a sinusoidal fault pilot signal at about 55 kHz is embedded as an AC signal on the DC power rail in both the stack bus and link bus, and is thus accessible to all nodes on both of the stack bus and link bus. In at least one embodiment, the fault detection signaled via a fault pilot signal is a hardware-based mechanism that is independent of the control communication path. In an embodiment, the fault pilot signal mechanism is only for indicating that a fault condition exists, and is independent of other methods that may be used actually to detect the fault condition. Detecting the cessation of the fault pilot signal triggers various safety mechanism to be implemented, such as disabling all or part of the stack or removing coils or other equipment being powered by the stack until the issue trigging the interruption in the fault pilot signal is resolved. Optionally, detecting the absence of the fault pilot signal may automatically trigger some diagnostic equipment to attempt to determine whether there is a fault condition. In at least one embodiment, fault detection using the fault pilot signal mechanism may signal software failure, failure of processors/microcontrollers, and/or loss of connection between the power interface and the stack controller and/or between the stack controller and the cell interfaces. In at least one embodiment, since the fault pilot signal is superimposed on the power rails of the stack bus and link bus, capacitance may not be added to these power rails directly as doing so would suppress the AC signal. In the above-mentioned embodiment, a series inductor (of value 2.7 mH or higher, for example) would be used at the input of any power supply connected to the stack bus or link bus power rails to prevent any input capacitors from suppressing the AC fault pilot signal.

Cell interface 702a-n may be embodiments of any of the cell interfaces 120a-n, 220a-n, and 402, which were discussed in conjunction with FIGS. 1, 2, and 4, respectively. Power interface 706 may be an embodiment of any of the power interfaces 160, 260a-n, and 602, which were discussed in conjunction with FIGS. 1, 2, and 6, respectively. Stack controller 710 may be an embodiment of any of the stack controllers 150, 250a-n, and 502, which were discussed in conjunction with FIGS. 1, 2, and 6, respectively. Link bus 704 and stack bus 708 may be embodiments of the link buses 125 and/or 538 and stack buses 155, 534, and/or 636, which were discussed in conjunction with FIGS. 1, 5, and 6. Fault pilot signal generator/suppressor 711 may be an embodiment of the fault pilot signal generator/suppressor 530, which was discussed in conjunction with FIG. 5. Each of the fault pilot signal suppressor 712a-n may be an embodiment of the fault pilot signal suppressor 428, which was discussed in conjunction with FIG. 4.

The fault pilot signal generator/suppressor 711 is an embodiment of the fault pilot signal generator/suppressor 530, which was discussed in conjunction with FIG. 5. In at least one embodiment, the fault pilot signal generator/suppressor 711 emits AC signals along the power rail of the stack bus 708 and the link bus 704, while the fault pilot signal suppressors 712a-n in the cell interfaces 702a-n may suppress the fault pilot signal to indicate a fault condition. The fault pilot signal generator/suppressor 711 may also suppress the AC signal in the stack bus 708. In an embodiment, a cable disconnection between the fault pilot signal generator/suppressor 711 in the stack controller 710 and the fault pilot signal detector in the power interface 706 will also be detected as a fault. In at least one embodiment, the stack controller 710 may suppress the fault pilot signal to assert the detection of a fault condition as a redundant means of signaling critical fault conditions that do not rely on the communication integrity of the CAN bus in the battery management system 100.

Additional components 707 include additional systems and/or components that may be included in the battery management system 100. At least one embodiment, each of the additional components 707 includes zero or more fault pilot signal suppressors that may signal a locally-detected system fault by suppressing the fault pilot signal embedded in the stack bus 708.

Alternate location fault pilot signal generator 714 is a fault pilot signal generator at an alternative location, instead of residing in the stack controller 710. In an embodiment, the alternate location fault pilot signal generator 714 is a link bus device that plugs into the link-out 405b port of the last cell interface 702n. In an embodiment, the alternate location fault pilot signal generator 714 includes an AC emitter/oscillator that is powered from the link bus 704, and emits the AC fault pilot signal superimposed along the link bus 704. In an embodiment, loss of connection in the link bus 704 at any of the cell interfaces 702a-n can be detectable by the fault pilot signal detector 716 as a fault condition. In an embodiment, when the AC emitter function of the fault pilot signal generator/suppressor 711 in the stack controller 710 is configured to emit the fault pilot signal, the AC emitter in the alternate location fault pilot signal generator 714 is configured to be non-operational (and vice versa; that is, only one fault pilot generator is configured in a particular battery management system).

Fault pilot signal detector 716 is an embodiment of the fault pilot signal detector 634, which was discussed in conjunction with FIG. 6.

Fault pilot signal suppressors 717 are fault pilot signal suppressors that are installed in the additional components 707. In at least one embodiment, the fault pilot signal suppressors 717 function in a similar way as the fault pilot signal suppressors 712a-n.

Figure 8:
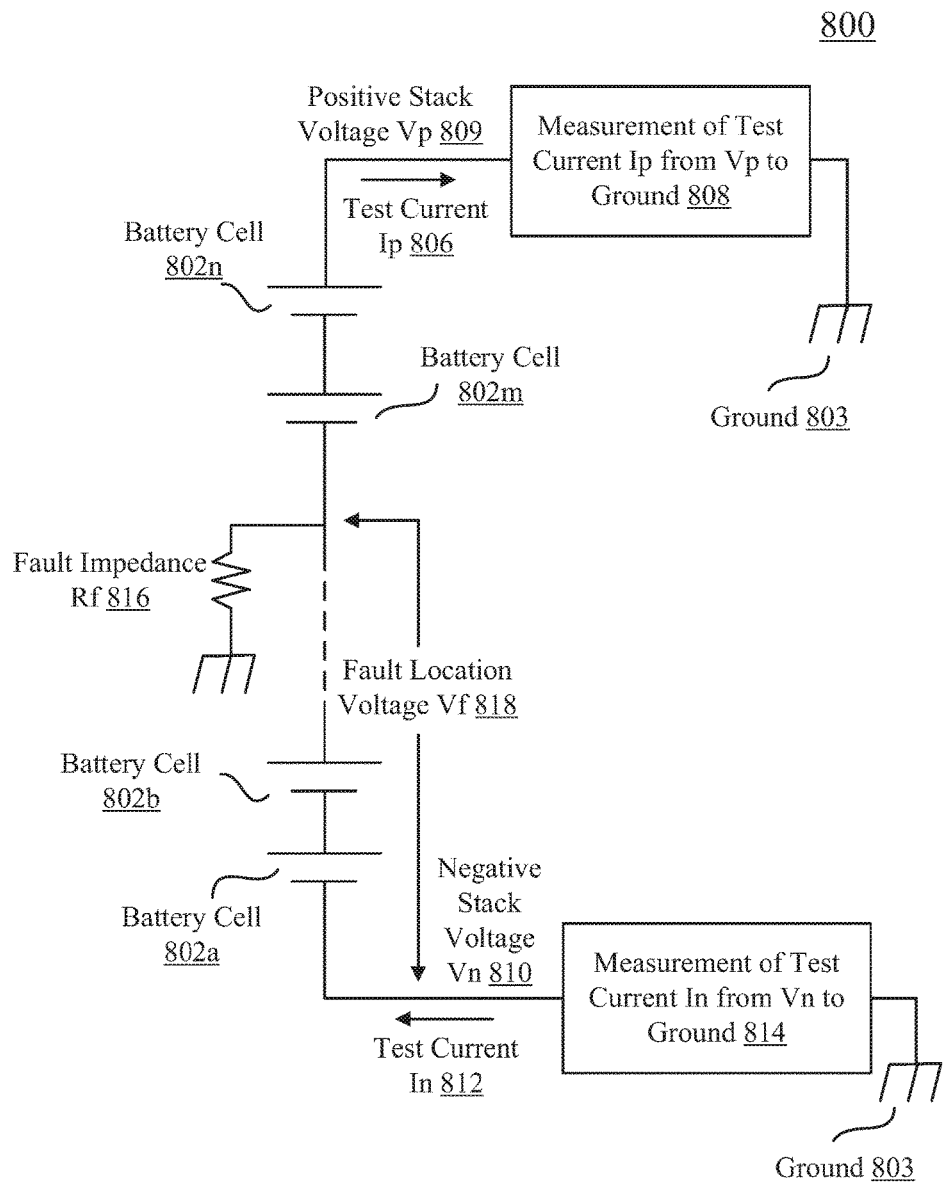
FIG. 8 shows a block diagram of an embodiment of detection of ground fault.

FIG. 8 shows a block diagram 800 of an embodiment of detection of ground fault. Diagram 800 shows at least battery cells 802a-n, ground 803, test current Ip 806, measurement capability of test current Ip from Vp to ground 808, positive stack voltage Vp 809, negative stack voltage Vn 810, test current In 812, measurement capability of test current In from Vn to ground 814, fault impedance Rf 816, and fault location voltage Vf 818. In other embodiments, the ground fault detection diagram 800 may not have all of the elements or features listed and/or may have other elements or features instead of or in addition to those listed.

FIG. 8 shows a diagram 800 of the detection of ground fault using the ground fault detector 644, by measuring test currents from the most positive end of the battery stack to the ground and from the most negative end to the ground.

Battery cells 802a-n are embodiments of the battery cells 110a-n, which were discussed in conjunction with FIG. 1. In at least one embodiment, battery cells 802a-n form a battery stack, within which one or more faults may exist at some point.

Ground 803 is a common return path for electric current, serving as constant potential reference point from which voltages are measured. In a grounded system (such as home AC wiring), the ground provides a return path back to the source for current, including fault current, to help prevent user contact with dangerous voltage. In at least one embodiment, when no grounding is intentionally made in a battery system (e.g., in the battery stack), a single ground fault would not carry current, since the ground 803 provides no return path to the battery stack. However, the ground fault within the battery stack may present a potentially dangerous situation, as personnel contacting any portion of the battery stack while simultaneously contacting the ground 803 could provide a current path through themselves if there is no ground provided.

Test current Ip 806 is a small test current that is passed through a test load connected between the positive stack voltage Vp 809 to the ground 803, if a ground fault exists in the battery stack. If no ground fault exits, no test current Ip 806 will be detected.

Measurement of test current Ip from Vp to ground 808 is performed by amplifying the small test current Ip 806 and then converting the signal by an analogue-to-digital converter in the microcontroller 640 in the power interface 602.

Positive stack voltage Vp 809 is the voltage of the most positive end of the battery stack that includes battery cells 802*a-n* in series relative to the ground. In at least one embodiment, the power interface 602 detects ground fault via the most positive end Vp 809 and the most negative end Vn 810 of the battery stack, but not directly testing individual cells within the stack.

Negative stack voltage Vn 810 is the voltage of the most negative end of the battery stack that includes battery cells 802*a-n* in series relative to the ground 803.

In an embodiment, test current In 812 is a small test current that is passed through a test load connected between the negative stack voltage Vn 810 to the ground 803, only if a ground fault exists in the battery stack. If no ground fault exits, no test current In 812 will be detected.

Measurement of test current In from Vn to ground 814 is performed by amplifying the small test current In 812 and then converting the signal by an analogue-to-digital converter in the microcontroller 640 in the power interface 602.

Fault impedance Rf 816, if a fault exits in the battery stack, is resistance at some point in the battery stack that results from the fault. In at least one embodiment, if fault impedance Rf 816 exits, the ground fault detector 642 would detect at least one of the test currents Ip 806 and In 812.

Fault location voltage Vf 818 is a voltage relative to the most negative end Vn 810 at which the fault impedance Rf 816 exists. In at least one embodiment, the fault location voltage Vf 818 is calculated by the power interface 602 to determine the location of the fault in the battery stack.

In at least one embodiment, a single fault within the battery stack may be detected using the following mechanism. The ground fault detector 642 attempts to pass a small test current from Vp 809 through Rf 816, using ground 803 as the return path. If no test current Ip 806 is detected, the detection may indicate two situations: either Rf 816 is infinite (i.e., there is no fault), or Vf 818=Vp 809–Vn 810 (i.e., the fault Rf 816 exists at the most positive end of the cell stack). The ground fault detector 642 then attempts to pass a small test current from Vn 810 through Rf 816, using ground 803 as the return path. If no test current In 812 is detected, the detection may indicate two situations: either Rf 816 is infinite (i.e., there is no fault), or Vf 818=0 (i.e., the fault Rf 816 exists at the most negative end of the battery stack). If both of test currents Ip 806 and In 812 are zero, indicating no passage of current, the results indicate that no ground fault exists between the Vp 809 and Vn 810 of the battery stack. If at least one of the Ip 806 and In 812 is detected to present a measured current, indicating the existence of a fault Rf 816, then the magnitude of the fault impedance Rf 816 and the location of the fault (based on Vf 818) may be calculated. In order to calculate the Rf 816 and Vf 818, the power interface 602 must determine and/or obtain the voltage of entire battery stack.

In an embodiment when at least one of Ip 806 and In 812 is not zero, the magnitude of the fault impedance Rf 816 may be calculated using the formula:

$$Rf = \frac{Vp - Vn}{Ip + In}$$

where Vp–Vn is the stack voltage that is known to the power interface 602. The location of Rf 816 may be further determined by calculating the voltage relative to Vn 810 using the formula:

$$Vf = In \times Rf$$

FIGS. 9A(1) and 9A(2) show a diagram of an embodiment of a ground fault detection circuit 900*a*. Fault detection circuit 900*a* may include negative-end current detector 901*a* having signal VBAT_REF 901*b*, resistors R7 902*a* and R8 902*b*, signal VBREF_INT 903, signal GFEN_L 904, resistor R144 905, optical switch U17 906 comprising a photodiode and two photosensitive MOSFETS, signal R_GFSENS_L 907, capacitor C34 908, voltage clamp diode D29 909, resistor R28 910, resistor R143 911, amplifier U16A 912, filter capacitors C71 913 and C72 914, an output signal GFENS_L 915, signals RSEL_GF0 916*a*, RSEL_GF1 916*b*, and RSEL_GF2 916*c*, resistor network 918, resistors R29 919*a*, R30 919*b*, R41 919*c*, and R42 919*d*, and switches Q2A 920*a*, Q4A 920*b*, and Q14A 920*c*. Fault detection circuit 900*a* may also include positive-end current detector 931 having signal VBAT_POS 932, resistors R43 933 and R47 934, signal VBPOS_INT 935, signal GFEN_P 936, resistor R146 937, optical switch U19 938 comprising a photodiode and two photosensitive MOSFETS, signal R_GFSENS_P 939, capacitor C76 940, voltage clamp diode D30 941, amplifier U16B 942, resistor R148 943, output signal GFENS_P 944, signals RSEL_GF0 916*a*, RSEL_GF1 916*b*, and RSEL_GF2 916*c*, resistor network 945, resistors R51 946*a*, R53 946*b*, R80 946*c*, and R82 946*d*, switches Q2B 948*a*, Q4B 948*b*, and Q14B 948*c*. Fault detection circuit 900*a* may also include zero ohm resistor R167 952 (FIG. 9A(2)). In other embodiments, the circuit 900*a* may not have all of the elements or features listed and/or may have other elements or features instead of or in addition to those listed.

Referring to FIG. 9A(1), fault detection circuit 900*a* detects ground faults in a battery stack by sampling the signal at both the positive and negative end of the battery stack. Fault detection circuit 900*a* is an embodiment of a circuit that carries out the ground fault detection of diagram 800. Fault detection circuit 900*a* may be an embodiment of ground fault detector 642. Negative-end current detector 901*a* detects a test current flowing into the most negative end of the stack. Negative-end current detector 901*a* is an embodiment of the measurement of test current In from Vn to ground 814 (FIG. 8). VBAT_REF 901*b* is the signal from negative end of the stack (which, if a ground fault exists, is expected to have a negative value), resistors R7 902*a* and R8 902*b* adjust the signal from the negative end of the stack to have a desired voltage range and current range, and form part of a voltage divider, which will be discussed further below. Signal GFEN_L 904 is a signal from microcontroller 640 (FIG. 6), which turns on the negative end test current path connecting the negative end of the stack to the negative-end current detector 901*a*. Resistor R144 905 limits the LED current in optical switch U17 906.

Optical switch U17 906 is activated by signal GFEN_L 904 to connect the negative end of the battery stack to the negative-end current detector. (The optical switch provides input/output voltage isolation through the internal use of light to pass the input signal, which illuminates an internal LED, to the output switches, which respond to the absence or presence of that light. It is a sealed device, and is not affected by ambient light.) An optical switch is used, so that the battery stack is electrically isolated from the control circuit that connects and disconnects the negative-end current detector with the negative end of the battery stack. By electrically isolating the control circuit from the battery stack, the control circuit tends to be protected from any damaging effects that might otherwise result from a ground fault in the battery stack. In an embodiment, switch U17 906 permits the test current In 812 (in FIG. 8) to flow if a ground fault exists, which is detected by the negative-end current detector 901a.

Signal R_GFSENS_L 907 is the signal from the negative-end current detector 901a that flows into the negative end of the battery stack. Capacitor C34 908 suppresses unwanted high-frequency AC noise that may be present on the signal. Voltage clamp D29 909 clamps the voltage at a maximum value to prevent any spurious voltage transient from damaging other circuitry, which in one embodiment is 3.3 volts (but in other embodiments the voltage could be clamped to other values). Resistor R28 910 forms part of the same voltage divider that includes resistors R7 902A and R8 902B.

Resistor R143 911 reduces the effect of input offset and bias currents of amplifier U16A 912.

Amplifier U16A 912 provides information to microcontroller 640 about the test current into the negative end of the battery stack, so that microcontroller 640 can determine whether there is a ground fault in the battery stack. In an embodiment, amplifier U16A 912 is configured as an inverting amplifier. Amplifier U16A 912 has a gain of $-R_x/R_{in}$, where $R_x$ is an equivalent resistance of a programmable resistance network, which will be discussed below, and where $R_{in}$ is the sum of fault impedance Rfault, R7 902a, R8 902b, and R28 910. In other embodiments, amplifier U16A 912 is configured in a different manner. Although the manner in which amplifier U16A 912 is configured affects the equations used for determining the fault voltage Vfault, the manner in which amplifier U16A 912 is configured is not important, as long as a means for measuring a test current through unknown fault impedance Rfault is provided.

In an embodiment, amplifiers U16A 912 and U16B 942 are operational amplifiers contained in a dual-amplifier package. Capacitors C71 913 and C72 914 filter the positive and negative power rails of a bipolar voltage source for amplifiers U16A 912 and U16B 942, where C71 913 filters the positive voltage source and C72 914 filters the negative voltage source. Output signal 915 is the output of amplifier U16A 913, which is sent to a processor to determine the fault voltage and fault impedance.

Signals RSEL_GF0 916a, RSEL_GF1 916b, and RSEL_GF2 916c are control signals from a processor (e.g., microcontroller 640) that determine which resistors are enabled to form part of resistor network 918. Resistor network 918 is a network of parallel resistors and switches that can be set to a variety of resistances, by signals RSEL_GF0 916a, RSEL_GF1 916b, and RSEL_GF2 916c. Resistors R29 919a, R30 919b, R41 919c and R42 919d are resistors of the voltage network. Resistors R29 919a, R30 919b, and R41 919c are placed in or removed from the network by switches Q2A 920a, Q4A 920b, and Q14A 920c, which are in turn controlled by signals RSEL_GF0 916a, RSEL_GF1 916b, and RSEL_GF2 916c, respectively. In an embodiment, switches Q2A 920A, Q4A 920B, and Q14A 920C are MOSFETs, and when signals RSEL_GF0 916a, RSEL_GF1 916b, and RSEL_GF2 916c have a high value, the corresponding MOSFET is switched on, enabling the corresponding resistor into the network. With three selection controls in the embodiment of FIG. 9A(1), a total of eight effective resistances may be realized by the parallel network.

Returning to the discussion of the gain of amplifier U16A 912, as mentioned above, this is equal to $-R_x/R_{in}$, where $R_x$ is given by $1/R_x=1/R42+(+1/R29$ (if switch Q2A 920A is on))+(+1/R30 (if switch Q4A 920B is on))+(+1/R41 (if switch Q14A 920C is on))—and so the gain of the amplifier U16A 912 is $-R_x/R_{in}=-R_x/(R7+R8+R28)$.

Referring to FIG. 9A(2), positive-end current detector 931 detects the test current flowing from the positive end of the battery stack. Based on the signal detected from the positive and negative end current detectors, microcontroller 640 can determine the fault impedance, Rfault, and the location of the fault, Vfault, relative to the most negative end of the battery stack. Positive-end current detector 931 is an embodiment of the measurement of test current Ip from Vp to ground 808 (FIG. 8).

VBAT_POS 932 is the signal from the positive end of the stack (which, if a ground fault is present, is expected to have a positive value). Resistors R43 933 and R47 934 scale the signal from the positive end of the stack to have a desired voltage range and current range, and form part of a voltage divider, which will be discussed further below. Signal GFEN_P 936 is a signal from microcontroller 640 (FIG. 6), which turns on the positive end current path connecting the positive end of the battery stack to the positive-end current detector 931. Resistor R146 937 limits the LED current in optical switch U19 938. As an aside, GFEN_L 904 and GFEN_P 936 are inputs to switches 906 and 938, and outputs from the microcontroller (e.g., microcontroller 640).

Optical switch U19 938 is activated by signal GFEN_P 936 to connect the positive end of the battery stack to the positive-end current detector 931. As explained in conjunction with detecting the signal from the negative end of the battery stack, an optical switch is used, so that the battery stack is electrically isolated from the control circuits that connect and disconnect the positive-end current detector with the positive end of the battery stack. By electrically isolating the control circuit from the battery stack, the control circuit tends to be protected from any damaging effects that might otherwise result from a ground fault in the battery stack. In an embodiment, switch U19 938 permits the test current Ip 806 (in FIG. 8) to flow if a ground fault exists, which is detected by the positive-end current detector 931.

Signal R_GFSENS_P 951 939 is the signal from the positive-end current detector 931 that flows from the positive end of the battery stack. Capacitor C76 940 suppresses unwanted high-frequency AC noise that may be present on the signal. Voltage clamp D30 941 clamps the voltage at a maximum value to prevent any spurious voltage transient from damaging other circuitry, which in one embodiment is 3.3 volts (but in other embodiments the voltage could be clamped to other values).

Amplifier U16B 942 provides information to microcontroller 640 about the test current into the positive end of the battery stack, so that microcontroller 640 can determine whether there is a ground fault in the battery stack. Amplifier U16B 942 is configured as a unity gain amplifier, serving only as a high input impedance buffer between the programmable attenuator formed by the resistor network described in the preceding paragraphs, and the unknown impedance of the analogue-to-digital converter input of the microcontroller 640. Although the manner in which amplifier U16B 942 is configured affects the equations used for determining the fault voltage Vfault, the manner in which amplifier U16B 942 is configured is not important, as long as U16B 942 is configured to provide a means for measuring a test current through unknown fault impedance Rfault.

Output signals GFSENS_L 915 and GFSENS_P 944 are the outputs of amplifiers U16A 912 and U16B 942, respectively. During activation of negative-end current detector 901*a* and positive-end current detector 931, they provide voltages that are analogs of the associated test currents flowing during the respective tests. These signals are sent to a processor (e.g., microcontroller 640) to determine the fault voltage and fault impedance.

Signals RSEL_GF0 916*a*, RSEL_GF1 916*b*, and RSEL_GF2 916*c* are control signals from a processor (e.g., microcontroller 640) that determine which resistors are enabled to form part of resistor network 945. Resistor network 945 is a network of resistors and switches that can be set to a variety of resistances, by signals RSEL_GF0 916*a*, RSEL_GF1 916*b*, and RSEL_GF2 916*c*. Resistors R51 946*a*, R53 946*b*, and R80 946*c* are placed in circuit or removed from the network by switches Q2B 948A, Q4B 948B, and Q14B 948C, respectively. In the embodiment of FIGS. 9A(1) and 9A(2), the same control signals, RSEL_GF0 916*a*, RSEL_GF1 916*b*, and RSEL_GF2 916*c*, are used to configure both the resistance network 918, and the resistance network 945. Using the same control signals to configure both resistor networks is acceptable, as the detection scheme requires that the test currents to/from each end of the battery stack be measured separately. Therefore, the configuration of network 945 is of no consequence when detector 901*a* is enabled, and the configuration of network 918 is of no consequence when detector 931 is enabled. Zero ohm resistor R167 952 sets the circuitry reference common level (COM) to the same potential as earth or chassis ground (CHAS), thereby ensuring that test currents to/from each end of the battery stack are returned through ground, which is the reference to which ground faults are detected.

Putting the above together and relating the embodiment of FIGS. 8, 9A(1), 9A(2) and 9B(1)-9B(5), FIG. 9A(2) shows a switch U19 938 that turns on the test current Ip 806 from the most positive end of the battery stack (+VBAT_POS 932). In at least one embodiment, the switch U19 938 is controlled by the microcontroller 640 of the power interface 602, via signal GFEN_P 936. The test current Ip 806 will flow only if a ground fault exists somewhere in the battery stack other than at the most positive end. If a test current Ip 806 flows, it causes a positive voltage (with respect to the ground 803) to be raised in the voltage divider network formed by resistors R43 933, R47 934, and programmable resistor network 945. The abovementioned positive voltage is buffered by the unity-gain amplifier U16B 942 onto signal GFSENS_P 951, and converted to a digital value by the analogue-to-digital converter in the microcontroller 640. The resistors comprising programmable resistor network 945 are chosen to give several attenuation ranges for the test current measurement, maximizing accuracy by permitting optimum use of the analogue-to-digital converter. To suppress noise or transient spikes which may appear on the battery stack from damaging or stressing the amplifier, transient voltage suppressor D30 941 clamps the amplifier input voltage at about ±3.3V.

In at least one embodiment, the MOSFETs Q2B 948A, Q4B 948B, and Q14B 948C are used to select a combination of resistors to configure the programmable resistor network 918. (The drain-source diodes are the intrinsic body diodes and are not physically separate components.)

FIG. 9A(1) shows a switch U17 906 that turns on the test current In 812 into the most negative end of the battery stack (VBAT_REF 901*b*). In at least one embodiment, the switch U17 906 is controlled by the microcontroller 640 of the power interface 602, via signal GFEN_L 904. The test current In 812 will flow only if a ground fault exists somewhere in the battery stack other than at the most negative end. If a test current In 812 flows, it causes a positive voltage (with respect to the ground 803) to be produced at the output of inverting amplifier U16A 912 onto signal GFSENS_L, with the amplifier gain set by the network formed by resistors R7 902A, R8 902B, R28 910, and programmable resistor network 918. The voltage at GFSENS_L is converted to a digital value by the analogue-to-digital converter in the microcontroller 640. The resistors comprising programmable resistor network 918 are chosen to give several attenuation ranges for the test current measurement, maximizing accuracy by permitting optimum use of the analogue-to-digital converter. To suppress noise or transient spikes which may appear on the battery stack from damaging or stressing the amplifier, transient voltage suppressor D29 909 clamps the amplifier input voltage at about ±3.3V. As mentioned above, output signals GFSENS_L 915 (FIG. 9A(1)) and GFSENS_P 944 (FIG. 9A(2)) are the outputs of amplifiers U16A 912 and U16B 942, respectively, and during activation of negative-end current detector 901*a* and positive-end current detector 931, output signals GFSENS_L 915 and GFSENS_P 944 provide voltages that are analogs of the associated test currents flowing during the respective tests. Output signals GFSENS_L 915 and GFSENS_P 944 signals are sent to a processor (e.g., microcontroller 640) to determine the fault voltage and fault impedance.

In at least one embodiment, the MOSFETs Q2A 920A, Q4A 920B, and Q14A 920C are used to select a combination of resistors to configure the programmable resistor network 918. (The drain-source diodes shown in FIG. 9A are intrinsic diodes formed by the MOSFET structure and are not physically separate components.)

In at least one embodiment, amplifiers Q16A and Q16B are powered from a bipolar power supply. The amplifiers used in the circuit of FIG. 9A (U16A 912 and U16B 942) require a bipolar power supply (i.e., both positive and negative power supply voltages) in order to produce a linear output. The positive supply is taken from the power interface's +3.3V power rail (+3V3), filtered by C71 913. The negative supply is taken from the power interface's −3.3V power rail (−3V3), filtered by C72 914.

In at least one embodiment, the overall gains of the positive-end and negative-end test current measurement networks are functions of the resistor combinations as set by the microcontroller through digital signals RSEL_GF2 916*c*, RSEL_GF1 916*b*, & RSEL_GF0 916*a*. In FIG. 9A(1), U16A 912 is configured to give negative gain, as the current direction will be out of the circuit into the most negative end of the battery stack. U16B 942 (FIG. 9A(2)) is configured as a unity gain buffer, (i.e., U16B 942 has a gain of +1), presenting a high impedance to the positive-end test current network (R43 933, R47 934, R51 946*a*, R53 946*b*, R80 946*c*, R82 946*d*) while providing a low impedance signal source to the analogue-to-digital converter. Individual gains are chosen for each of the two current tests to maximize the resolution of the analogue-to-digital converter without saturating the analogue-to-digital converter. When using negative-end detector 901*a* to measure the test current flowing into the negative end of the stack, the current In 812 flowing in the test impedance (R7 902A+R8 902*b*+R28 910) in series with the unknown fault impedance Rfault is V(GFSENS_L)/Rx, where Rx is the effective resistance configured in network 918 during the measurement. When using positive-end detector 931 to measure the test current flowing from the positive end of the stack, the current Ip 806 flowing in the test impedance (R43 933+R47 934+Ry) in series with the unknown fault impedance Rfault is V(GFSENS_H)/Ry, where Ry is the effective resistance configured in network 945 during the measurement. Therefore, when a battery stack has a total known potential of Vstack volts, the system may calculate the magnitude of the fault impedance, Rfault, of a single ground fault in the battery stack, and the location at which the ground fault is situated, having a fault voltage of Vfault above the negative stack voltage Vn 810, by solving the system of equations formed by the following two formulas for the unknown quantities, Rfault and Vfault.

Formula I: $Vfault/(R7+R8+R28+Rfault)=V(GFSENS\_L)/Rx$.

Formula II: $(Vstack-Vfault)/(R43+R47+Ry+Rfault)=V(GFSENS\_P)/Ry$.

Formula I is a consequence of amplifier U16A 912 having a gain of $$\frac{V(GFSENS_L)}{-V_{FAULT}} = -\frac{R_X}{R7 + R8 + R28 + R_{FAULT}}$$

Formula II is a consequence of amplifier U16B 942 having unity gain, so that $$V(GFSENS_P) = V(RGFSENS_P)$$

and $$V(RGFSENS_P) = (V_{STACK} - V_{FAULT}) * \frac{R_y}{(R_{FAULT} + R43 + R47 + R_y)}$$

In at least one embodiment, two tests, one from the positive stack voltage Vp 809 (FIG. 8) and one from the negative stack voltage Vn 810 (FIG. 8) of the battery stack, are performed for detecting the ground fault within the battery stack. If a fault exists, the fault will be at a lower potential than the positive stack voltage Vp 809, and at a higher potential than the negative stack voltage Vn 810, and therefore the test currents Ip 806 (FIG. 8) and In 812 (FIG. 8) will be in opposite directions. In an embodiment, to meet the requirements of the analogue-to-digital converter which can only read positive signals, one of the two test currents Ip 806 and In 812 needs to be inverted, as is performed by the example given in negative-end current detector 901a.

FIGS. 9B(1)-9B(5) show a diagram of an embodiment of a power interface circuit 900b. In an embodiment, the power interface 900b includes at least an off-stack power supply 960 (FIG. 9B(1)), an auxiliary power supply 961 (FIG. 9B(1)), reset supervisor, local power supplies, isolation low-pass filter, and power switch 962 (FIG. 9B(1)), a microcontroller 963 (FIG. 9B(2)), indicator LEDs 964 (FIG. 9B(2)), a fault pilot signal detector 965 (FIG. 9B(3)), interlock inputs 966 (FIG. 9B(3)), contactor coil drivers 967 (FIG. 9B(4)), a transistor switch 968.1 (FIG. 9B(4)), one or more external switch coils 968.2 (FIG. 9B(4)) (the switch coils are external equipment controlled by the Power Interface), a stack bus interface 969 (FIG. 9B(4)), a current and voltage measurement system 970 (FIG. 9B(5)), an external current shunt resistor 971 (FIG. 9B(5)), and a ground fault detection circuit 972 (FIG. 9B(5)). In other embodiments, the circuit 900b may not have all of the elements or features listed and/or may have other elements or features instead of or in addition to those listed.

FIGS. 9B(1)-9B(5) show a block diagram of an embodiment of the power interface 160 of the battery management system 100. In an embodiment, the power interface 900b may be made in several models so as to accommodate different battery pack voltage ranges (e.g., different models for interfacing battery packs with voltage ranges of 30-120V, 70-280V, 160-640V, and 370-1250V). In an embodiment, while different models of the power interface 900b may have different implementation and component value details, the basic function of the power interface is consistent.

Referring to FIG. 9B(1), in an embodiment, the off-stack power supply 960 uses the battery stack/pack to provide power to the battery management system 100. Power supply 960 and the associated circuitry correspond to DC stack power 604, connector 606, and regulator 607. In an embodiment, the off-stack power supply 960 provides sufficient current to operate components and/or modules of the battery management system 100, as well as to operate up to four contactor coils. In an embodiment, the off-stack power supply 960 converts power at the battery stack voltages to 24V DC operating voltage required by the battery management system 100. In an embodiment, the off-stack power supply 960 is implemented with a flyback controller, and transistor switch and transformer as required for the proper function at the stack voltage range of the power interface 900b. In the case of the higher-voltage models of the power interface 900b (e.g., 370-1250V), the circuit for controlling and converting the off-stack power 960 ensures that the required creepage and clearance minimum distances were met for the insulation level required by international safety standards. In an embodiment, the transformer may be custom-designed to accommodate different models of the power interface 900b.

In an embodiment, since the battery stack 111 may be isolated from earth ground, or connected to earth ground at some arbitrary point within the battery stack 111, the off-stack power supply 960 is isolated from earth ground. The use of a transformer in the power supply provides the galvanic isolation, allowing the input of the off-stack power supply 960 to be referenced to the battery stack 111, and the output to be referenced to the common point of battery management system 100, which is connected to earth ground. In an embodiment, a high voltage capacitor bridges the isolation boundary, in order to help stabilize the control network for the power supply with AC coupling to the ground reference.

In an embodiment, the power interface 900b includes auxiliary power supply 961 that supports a configuration of the battery management system 100 that is not powered from the battery stack 111, or to provide backup power to the battery management system 100 in the case of a completely discharged battery stack 111. Power supply 961 and the associated circuitry corresponds to Isolated AC/DC Power 608, connector 610, and rectifier 612. In an embodiment, the auxiliary power supply 961 provides 24V DC operating voltage required by the battery management system 100, sourced from an external power source that may be either AC or DC, allowing the use of a simple magnetic transformer powered from a grid-sourced AC line, or a DC power supply or backup battery. In an embodiment, a 24V DC or 18-24V AC supply may be used.

In an embodiment, the auxiliary power supply 961 is capable of providing sufficient current to operate the components of the battery management system 100 and contactor coils. In at least one embodiment, the outputs of the off-stack power supply 960 and auxiliary power supply 961 are combined using diodes, to generate an internal power rail VINT of the power interface 900b.

In an embodiment, the power interface includes a reset supervisor 962 that provides reset control to local power supplies of the power interface 900b as well as to other components in the battery management system 100. In an embodiment, the reset supervisor 962 is activated by a reset pushbutton switch, in addition to monitoring of the internal power rail to ensure orderly operation at power-up. When activated, the reset supervisor 962 shuts off the power source to local power supplies and other components for a preset time period, allowing devices downstream of the power supplies to perform their own power-on reset when power is restored to the downstream devices at the end of the timeout. In an embodiment, the coil contactor drivers are disabled during the timeout period, ensuring that no contactor coils are energized until the battery management system 100 takes control.

In an embodiment, the 24-volt VINT power rail is converted to 3.3 volts for operating the microcontroller, using the same common reference (ground). The circuitry that performs ground fault detection and measurement incorporates amplifiers that require a bipolar power supply (e.g., both positive and negative voltage rails). Very little current is required by the circuits of ground fault detection and measurement, and a switched capacitor inverter is used to generate the negative power supply for the amplifiers, sourced from the 3.3-volt rail, and using the same common reference (ground). In addition, an isolated 5.0-volt power supply is provided from VINT to power the current and voltage measurement system, using a flyback controller and a transformer. Isolation is required as the circuitry of the battery management system 100 is ground-referenced, while the current and voltage measurement system is stack-referenced. The use of a transformer in the power supply provides the galvanic isolation, allowing the input of the measurement system supply to be referenced to the system common point, which is connected to earth ground, and the output to be referenced to a dynamic point near the bottom/negative end of the battery stack 111. A high voltage capacitor bridges the isolation boundary, in order to help stabilize the control network for the power supply with AC coupling to the ground reference.

Referring to FIG. 9B(2), in an embodiment, the power interface 900b includes a microcontroller 963 (which may be an embodiment of microcontroller 640) that provides a means for the stack controller 150 to control the various functions of the power interface 900b, and to receive status data regarding the parameters monitored by the power interface 900b. In an embodiment, communication between the power interface 900b and the stack controller 150 is performed using a controller area network (CAN) channel, over the stack bus 155. In an embodiment, firmware in the microcontroller 963 responds to commands on the CAN channel according to a custom protocol to perform ground fault testing, to change the state of contactors, and to report results and system status. In an embodiment, a serial communication channel is provided to allow the microcontroller 963 to communicate with the current and voltage measurement system, with interface circuitry passing data bi-directionally across a voltage isolation boundary. In an embodiment, the voltage isolation boundary is required as the microcontroller 963 is ground-referenced, while the current and voltage measurement system is stack-referenced. In addition, the firmware can monitor the state of the contactors to verify correct driver function, monitor the state of the fault and interlock circuits to determine external fault status, and verify communication integrity with the master controller to ensure that system control is correctly functioning.

Status inputs are provided to the microcontroller 963, allowing the microcontroller 963 to determine which model of power interface 900b is installed, which allows the firmware to adapt to differences among models of the power interface 900b, without requiring model-specific builds of firmware.

In an embodiment, indicator LEDs 964 may be an embodiment of LEDs 652, and are provided on the power Interface 900b, controlled by the microcontroller 963, to indicate power, correct functioning of the microcontroller firmware and/or of the communication link with the master, and the detection of a system fault. In an embodiment, to accommodate the link and indicator LEDs' 964 requirement of higher operating voltage than the 3.3 volts available to the microcontroller 963, a simple diode-capacitor charge pump is used on the link and indicator LEDs 964 to boost the voltage.

Figure 9C:
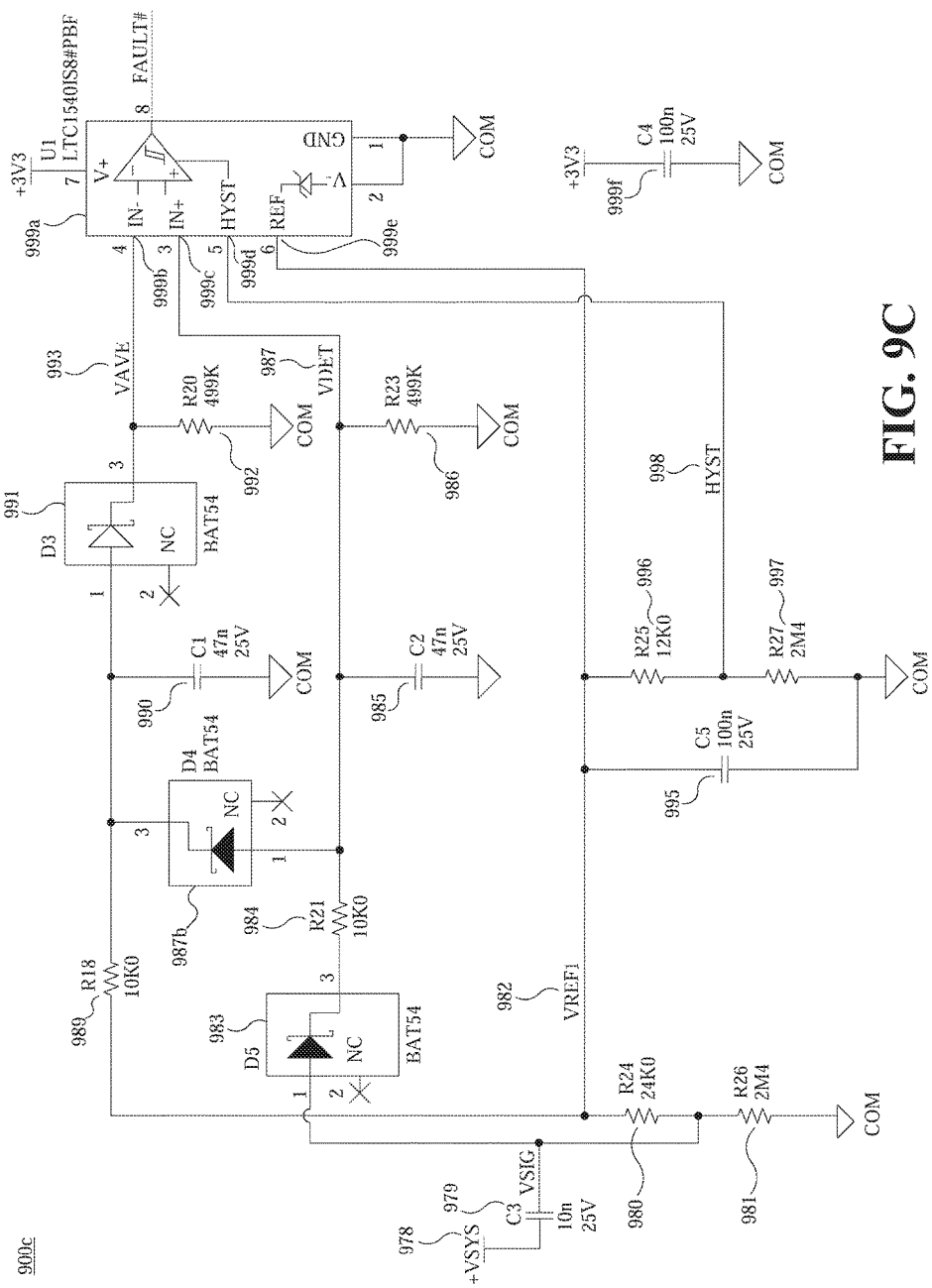
FIG. 9C shows a diagram of an embodiment of a fault pilot signal detector.

Referring to FIG. 9B(3), fault pilot signal detector 965 detects the fault pilot signal. The fault pilot signal detector 965 may be an embodiment of fault pilot signal detector 634 and/or 716. Fault pilot signal detector 965 is discussed further below in the next few paragraphs. Fault pilot signal detectors are also discussed in FIG. 9C.

In an embodiment, the power interface 900b includes a fault pilot signal detector 965 and interlock inputs 966 that provide redundant mechanisms for indicating detection of a system fault. In an embodiment, such a system fault will be communicated to the microcontroller 963 of the power interface 900b and the stack controller 150 via the stack bus 155 communication channel. In the event that a failure occurs with the abovementioned mechanism for some reason, a second fault indication is provided in a pilot signal that is superimposed onto the system DC power supply. The pilot signal takes the form of a 55 kHz sinusoidal signal of about 2 volts amplitude, generated at a component (e.g., stack controller 150) other than the power interface 900b, and presented superimposed on the stack bus power supply. A detector circuit 965 in the power interface 900b monitors the presence of the pilot signal, and if absent, asserts an internal FAULT signal. The pilot signal may be absent due to a fault detected in another module, or due to a break in the stack bus 155, among other reasons. The internal FAULT signal may be monitored by the microcontroller 963, and used to report and/or act according to implementation-specific configuration (which may or may not include de-energizing all or some contactors).

In an embodiment, two interlock inputs 966 are provided on the power interface 900b to allow external equipment to affect control over the state of the contactors (e.g., the switches that connect the battery stack 111 to an external load or charge source). The correct control of the contactors/switches can ensure that the entire system operates safely. The interlock inputs 966 may be monitored by the microcontroller 963, and used to report and/or act according to implementation-specific configuration (which may or may not include de-energizing all or some contactors).

Referring to FIGS. 9B(3) and 9B(4), in an embodiment, circuitry combines the two external interlock inputs 966 with the internally-generated FAULT signal, conditionally to disable all contactors immediately, or to leave such control to the microcontroller 963. In an embodiment, if the first interlock input, OVERRIDE_ENA, is asserted, then control of the contactors is left to the microcontroller 963 regardless of the state of the FAULT signal. If the OVERRIDE_ENA input is not asserted, and the second interlock input, DRV_ENA, is asserted, then control of the contactors is left to the microcontroller 963 only if the FAULT signal is not asserted, and the contactors are immediately de-energized if the FAULT signal is asserted. If neither of the OVER-RIDE_ENA nor the DRV_ENA inputs is asserted, then the contactors remain de-energized.

In an embodiment, the power interface 900b includes contactor coil drivers 967 that drive up to four contactor coils. In an embodiment, power for the contactor coil drivers 967 is provided through an external connection, but provision is made for a loopback connection to power the contactor coils from the internal power supply (e.g., VINT) of power interface 900b. Optional connection of an external coil power supply permits the use of coils operating at a voltage other than the 24 VDC provided by VINT, or with operating currents higher than that available from VINT.

In an embodiment, the power interface 900b includes a single transistor switch 968.1 that is used to enable all coil drivers, controlled by the fault detector 965 (FIG. 9B(3)) and interlock inputs and logic 966. The control of the single transistor switch 968.1 is not reliant on correct microcontroller firmware operation, thereby providing a redundant means of de-energizing the contactor coils in the event of loss of control by firmware. The contactor coil drivers 967 are each able to monitor the actual state of the coil, each providing a status signal to the microcontroller 963 allowing determination of open or shorted coils, as well as drivers that fail in a shorted state. In an embodiment, clamping of coil back EMF is provided on the power interface 900b for each coil, to protect the driver circuitry.

In an embodiment, the power interface 900b includes a stack bus interface 969 that provides a communication channel between the stack controller 150 and the microcontroller 963 in the power interface 900b. Stack interface 969 is an embodiment of connector 638 and stack interface 639. The communication channel uses the controller area network (CAN, also known as ISO 11898) communication protocol and physical layer transceivers, with link termination provided in the power interface 900b, selectable via a shorting connection on the stack bus connector. The stack bus 155 also provides operating power to the stack controller 150, from which the power is further relayed to other components of the battery management system 100. Since the fault pilot signal is superimposed onto the operating power on the stack bus 155, an inductor is used to decouple the pilot signal from the bulk power rail capacitance on the VINT rail of the power interface, which would suppress the signal locally, preventing detection by the fault pilot detector.

Referring to FIG. 9B(5), in an embodiment, the power interface 900b includes a current and voltage measurement system 970 that monitors stack current in real time, which is used to assist the battery management system 100 in performing stack state of charge determination. The combination of contactor coil drivers 967, a transistor switch 968.1, and a current and voltage measurement system 970 correspond to switch control 644, connector 646, and switch coils 650. In addition, the current and voltage measurement system measures the overall stack voltage, which is used in various calculations, such as ground fault detection.

In an embodiment, the current and voltage measurement system 970 includes a high precision sensing integrated circuit (IC) for highly accurate measurement of stack current, which self-calibrates and monitors the voltage created across a shunt resistor 971 placed in series with the battery stack 111. The magnitude of the shunt resistor 971 determines the minimum and maximum currents that the measurement system can accurately measure. If the shunt resistance is too low, then low stack currents may be undetectable. If the shunt resistance is too high, then high stack currents will saturate the measurement. The shunt resistance is determined based on the usage anticipated for a particular battery management system 100.

In order to measure both charge and discharge currents, the measurement system reads both positive and negative shunt voltages. In an embodiment, the sensing IC places the common reference voltage below the low end of the shunt, so that the measured shunt voltage will not be below the sensing IC's reference. The sensing IC performs stack voltage measurement, stack current measurement, and continuous coulomb counting (which is used to determine the state of charge of the battery stack 111). In order to compensate for the effect of temperature on the value of the shunt resistance, which in turn affects the accuracy of the current measurement, the sensing IC detects the shunt temperature and can adjust measurements accordingly.

In an embodiment, communication of commands and data between the sensing IC and the microcontroller 963 (FIG. 9B(2)) is made over a simple universal asynchronous receiver/transmitter (UART) channel, with transceivers that span the high-voltage isolation boundary. In at least one embodiment the voltage difference of the battery stack 111 may be up to 1250V, and optical isolation is used. Power for the measurement system is provided by an isolating flyback power supply.

In at least one embodiment, the battery stack 111 is not ground-referenced, and the power interface 900b includes circuitry 972 and firmware to determine the presence of a ground fault (which in the case of stack 111 may be the unintentional presence of a current path from some point in the battery stack 111 to ground). Ground fault detector 900a may be an embodiment of circuitry 972, and circuitry 972 may be an embodiment of ground fault detector 642. The reason for not referencing a battery stack 111 to ground is primarily for safety. In a high-voltage stack, inadvertent contact by ground-referenced personnel to a point in a ground-referenced stack could produce dangerous current flow. In a lower-voltage stack, while contact by personnel may not be dangerous, a direct short to ground in a ground-referenced battery stack could cause high current flow, resulting in fire. Ground fault detection is performed by the microcontroller 963, using large resistances applied sequentially (but not concurrently) between each end of the battery stack and ground. In an embodiment, it is a requirement that the chassis of the battery management system 100 be electrically connected to the point against which ground fault detection is to be performed. For each end of the battery stack 111, the current, if any, through the large test resistance is measured. In an embodiment, the current will be zero at both ends only if no ground fault (return path) exists. If a ground fault does exist somewhere within the battery stack 111, then currents will be measured at each end, proportional to the voltage between the fault and the end of the battery stack 111, and to the magnitude (resistance) of the fault. If a ground fault exists at only one end of the battery stack 111, then currents will be measured at the opposite end only (which is why both ends must be considered), proportional to the stack voltage, and to the magnitude (resistance) of the fault.

FIG. 9C shows a diagram of an embodiment of a fault pilot signal detector 900c. The fault pilot detector of FIG. 9C, includes input for signal VSYS 978, capacitor C3 979, resistors R24 980, resistor R26 981, voltage VREF 982, rectifier D5 983, resistor R21 984, capacitor C2 985, resistor R23 986, rectifier D4 987, signal VAVE 988, resistor R18 989, capacitor C1 990, rectifier D3 991, resistor R20 992, voltage VDET 994, capacitor C5 995, resistors R25 996, resistor R27 997, voltage HYST 998, and comparator U1 999*a* having inverting input 999*b*, noninverting input 999*c*, HYST connection 999*d*, and REF connection 999*e*. The fault pilot detector of FIG. 9C also includes power supply filter capacitor C4 999*f*. In other embodiments, the fault pilot signal detector 900*c* may not have all of the elements or features listed and/or may have other elements or features instead of or in addition to those listed.

The fault pilot signal detector 900*c* detects the fault pilot signal and may be an embodiment of or an alternative embodiment to any of the fault pilot signal detectors 634, 716, and/or 965, which were discussed in conjunction with FIGS. 6 and 7, respectively. The fault pilot detector of FIG. 9C, filters out the DC component from the signal, leaving primarily any AC component of the power rail signal, which is primarily the fault pilot signal if present. Then, a fraction of a reference voltage is added to the remaining AC component of the power rail signal and compared to larger fraction of the reference signal. The difference between the smaller and larger fraction of the reference signal is somewhat less than the expected amplitude of the fault pilot signal, so that if the fault pilot signal is present, the sum of the fault pilot signal and the smaller fraction of the reference voltage exceeds that of the larger fraction of the reference voltage, and the fault pilot signal is deemed present. Conversely, if the fault pilot signal is absent, the larger fraction of the reference voltage is greater than the smaller fraction of the reference voltage alone, and the fault pilot signal is deemed suppressed. The signal with the larger fraction of the reference voltage is compared to the signal with the smaller fraction of the reference voltage to see which is larger, as an indication of whether or not the fault pilot signal is present. There are many ways of creating two signals, in which one signal represents the fault pilot signal and the other signal is reference signal to which the signal representing the fault pilot signal is compared to determine whether the fault pilot signal is present.

In an embodiment, VSYS 978 is the voltage from the power rail, which includes a DC component with an AC fault pilot signal superimposed unless the fault pilot signal has been suppressed (the power rail is any line carrying the power for powering the various components of the system). Capacitor C3 979, in combination with a resistor connected to ground, filters out the DC component of VSYS 978, allowing the AC fault pilot signal to pass, which is eventually detected and applied to an input of the comparator. Resistors R24 980 and R26 981 act as voltage dividers, which derive a portion of a DC reference voltage (VREF 982, included as a feature 999*e* in the comparator package chosen for this embodiment), adding this to the AC fault pilot signal. The resulting signal is detected by D5 983 and filtered by low-pass filter R21 984, C2 985, and R23 986, and presented as VDET 987 to the non-inverting input 999*c* of comparator in U1 999*a*. This voltage will be $$VDET = \left(VREF1 * \frac{R26}{R24 + R26} + V_{PK}(VSIG) - V_{D5}\right) * \frac{R23}{R21 + R23}$$

where the term $V_{PK}(VSIG)$ is the repetitive peak voltage of the superimposed AC fault pilot signal.
As the reference against which to compare this signal, the inverting input 999*b* of the comparator is presented with a signal VAVE 993, which is $$VAVE = (VREF1 - V_{D3}) * \frac{R20}{R20 + R18}$$

Component values are chosen such that the diode characteristics will be approximately equal, and the final attenuators are equal. That is, $$V_{D3} = V_{D5} \text{ and } \frac{R23}{R21 + R23} = \frac{R20}{R20 + R18}$$

The comparator therefore essentially judges the relative magnitudes of $$VREF1 * \frac{R26}{R24 + R26} + V_{PK}(VSIG) \text{ and } VREF1$$

and the term on the left will be greater if the AC fault pilot is present in sufficient magnitude, and the term on the right will be greater if the AC fault pilot is missing or significantly suppressed. In an embodiment, if the AC fault pilot is present in sufficient magnitude, the circuit output, FAULT#, will be at a high level; if the AC fault pilot is absent or suppressed, the circuit output, FAULT#, will be at a low level.

Rectifier D5 983 facilitates detection of the AC fault pilot peaks present on VSIG. Rectifier D5 983 also incidentally reduces the voltage somewhat. To compensate for this voltage drop, a similar diode D3 991 is included in the reference path to the comparator. Diode D3 993 provides a current- and temperature-dependent voltage drop similar to that introduced by D5 983 in the signal path.

In an embodiment, a diode D4 987*b* may be included in order to present positive voltage excursions on VSYS (which may occur from transient events) to both inputs of the comparator 999*a*. This helps to prevent the mistaken detection of such transients as an AC fault pilot even when such pilot might be suppressed.

In an embodiment, capacitor C5 995 filters the reference voltage VREF1 982. Capacitor C4 999*f* helps to provide a noise-free power supply to the comparator IC 999*a*, by bypassing high-frequency noise to COM.

In an embodiment, hysteresis is provided at the comparator, to reduce "chattering" (i.e., rapid unwanted changes from one state to the other) of the circuit output FAULT#, in the case where the AC fault pilot may be suppressed to a level very close to the detection threshold. This provides a non-zero threshold at the inputs that must be exceeded for the output to change state. That is, the inputs must differ by some small threshold level in order to have the output make a low to high transition, and by some opposite threshold level in order to have the output transition from high to low. In the selected device in FIG. 9C, the amount of hysteresis is determined by the voltage presented to the hysteresis input 999*d*, according to the manufacturer. Resistors R25 996 and R27 997 provide a proportion of the reference VREF1 982 to the hysteresis input 999*d* of the selected comparator. In an embodiment, a hysteresis band of about 12 mV is chosen.

Putting the above together, in at least one embodiment, the fault pilot signal detector 900*c* receives an input (e.g., +VSYS 978 in FIG. 9C). The input may include a DC voltage of approximately 24 volts, with a sinusoidal fault pilot signal of amplitude approximately Vp=2 volts peak-to-peak and a frequency of 55 kHz added to the DC voltage (in other embodiments other frequencies and voltages could be used instead). Capacitor C3 979 and resistor R26 981 form a high pass filter, allowing only the sinusoidal portion of the fault pilot signal to pass, and adding the sinusoidal portion to a DC reference level of VREF1*R26/(R24+R26). In an embodiment, reference VREF1 982 is a stable DC reference level voltage produced by the LTC1540 at U1 999a, and filtered by C5 995. The resulting signal is rectified by D5 983 (forward voltage drop of about Vf=0.24V) (in other embodiments other voltages could be used instead), and low-pass filtered by R21 984 and C2 985, to produce the signal VDET 987 which will have amplitude as calculated in (VREF1*R26/(R24+R26)+Vp/2−Vf)*R23/(R21+R23). The resulting signal is compared by comparator U1 999a to a reference voltage VAVE 993, equal to (VREF1 982−Vf)*R20 992/(R18 989+R20 992), Vf is the voltage drop across rectifier D3 991. Component values have been chosen such that R23/(R21+R23) equals R20/(R18+R20). The Vf terms are the forward voltages of D5 983 and D3 991, and may be considered equal. U1 therefore compares VREF1*R26/(R24+R26)+Vp/2 compared to VREF1.

In an embodiment, if Vp=0 (i.e., if the fault pilot signal is suppressed), then the comparison reduces to VREF1*R26/(R24+R26) compared to VREF1. And thus the right side (IN− on U1) is greater in magnitude than the left side (IN+ on U1), and the output of U1 (FAULT#) will be at a low voltage indicating detection of a fault (where IN− is the input voltage at the inverting input 999b of the comparator and IN+ is the input voltage at the non-inverting input 999c of the comparator U1 999a).

If Vp has a peak-to-peak voltage of 2V, for example, (i.e., if the fault pilot signal is not suppressed), then the comparison reduces to VREF1*R26/(R24+R26)+1 compared to VREF1. Values for R24 980 & R26 981 are chosen so that the right side (IN− on U1) is lower in magnitude than the left side (IN+ on U1), and the output of U1 will be at a high voltage (FAULT#) indicating no detection of a fault.

In an embodiment, U1 is implemented with a small amount of hysteresis, to prevent the output signal from oscillating if the fault pilot signal is close to the detection threshold.

The circuit shown in FIG. 9C is just one example of a signal detector that may be used for detecting the fault pilot signal. In the embodiment of FIG. 9C, AC signals superimposed on the DC power rail are detected, and it is assumed that the AC signals are the fault pilot signals. There are many other ways of constructing a signal detector that could be used instead of the circuit shown in FIG. 9C.

Figure 9D:
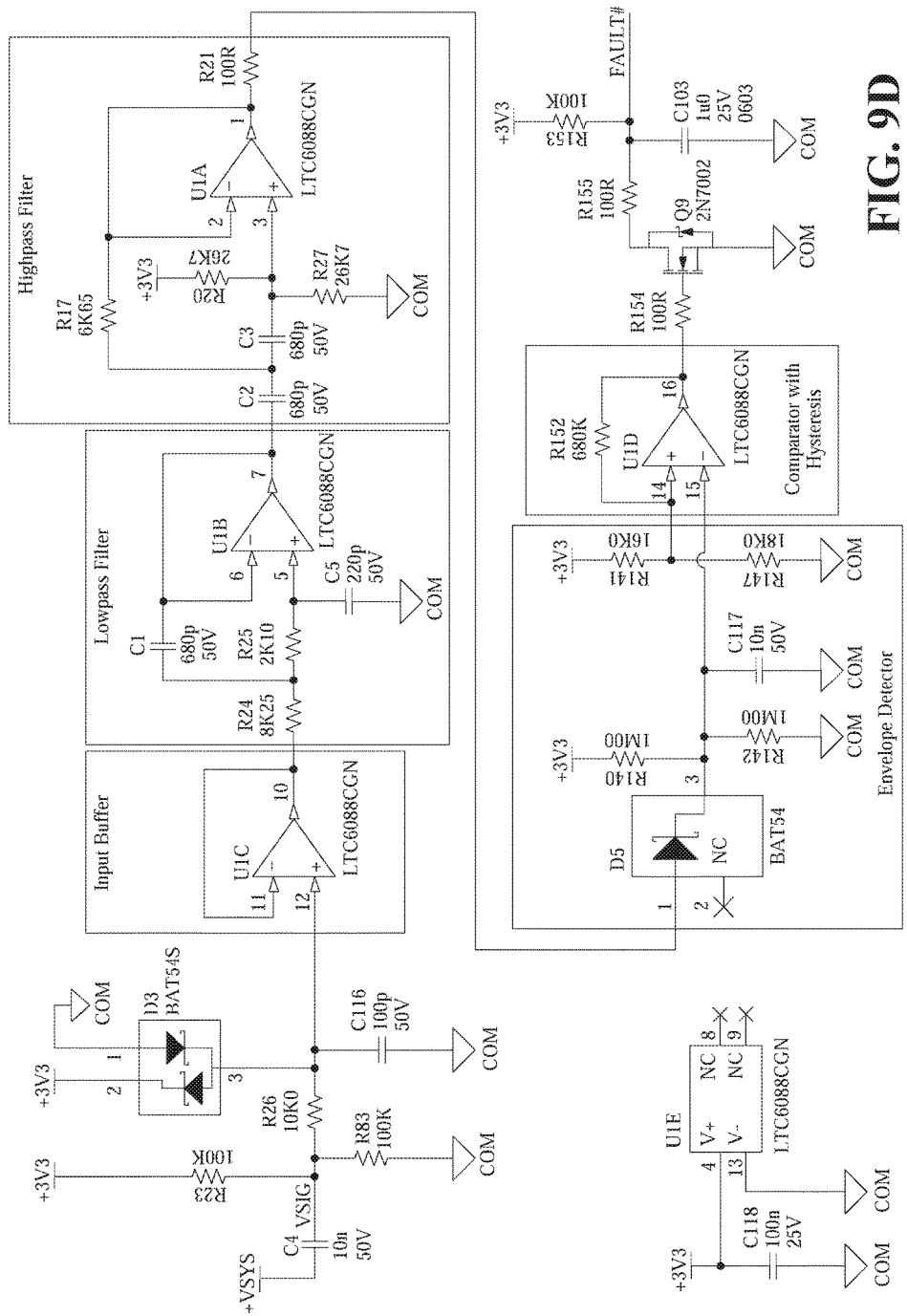
FIG. 9D shows a diagram of another embodiment of a fault pilot signal detector.

For instance, FIG. 9D shows a diagram of another embodiment of a fault pilot signal detector. In the embodiment of FIG. 9D (in contrast to the embodiment of FIG. 9C), an AC signal is bandpass-filtered to reduce signals other than those that are around a predetermined fixed frequency (e.g., 55 kHz), which is the frequency of the fault pilot signal, and then a determination is made of the magnitude of the remaining signal. The remaining signal (that is after the filtering) is assumed to be the fault pilot signal. In the embodiment of FIG. 9D, by filtering out all but the fault pilot signal, the circuit is less sensitive to noise. In an embodiment, the fault pilot detector includes an input buffer having a default gain of 1, but the gain may be adjustable, a low pass filter, a high pass filter, an envelope detector, and a comparator having hysteresis. For example, the low pass filter may be an active, second order, Butterworth Sallen-Key filter with a Q of 0.707, gain of 1 and cutoff frequency of 100 Hz, and the high pass filter may also be a second order, Butterworth Sallen-Key filter with a Q of 0.707, gain of 1, but with a cutoff frequency of 25 Hz. Also, as an example, the comparator with hysteresis may have an ON threshold of 1.77 volts and an OFF threshold of 1.72 volts. The circuit may assert the FAULT output immediately, but may implement a fairly long time delay (e.g., time constant of 100 kΩ×1 μF=100 mS) as the FAULT output is de-asserted.

Method of Using

Figure 10:
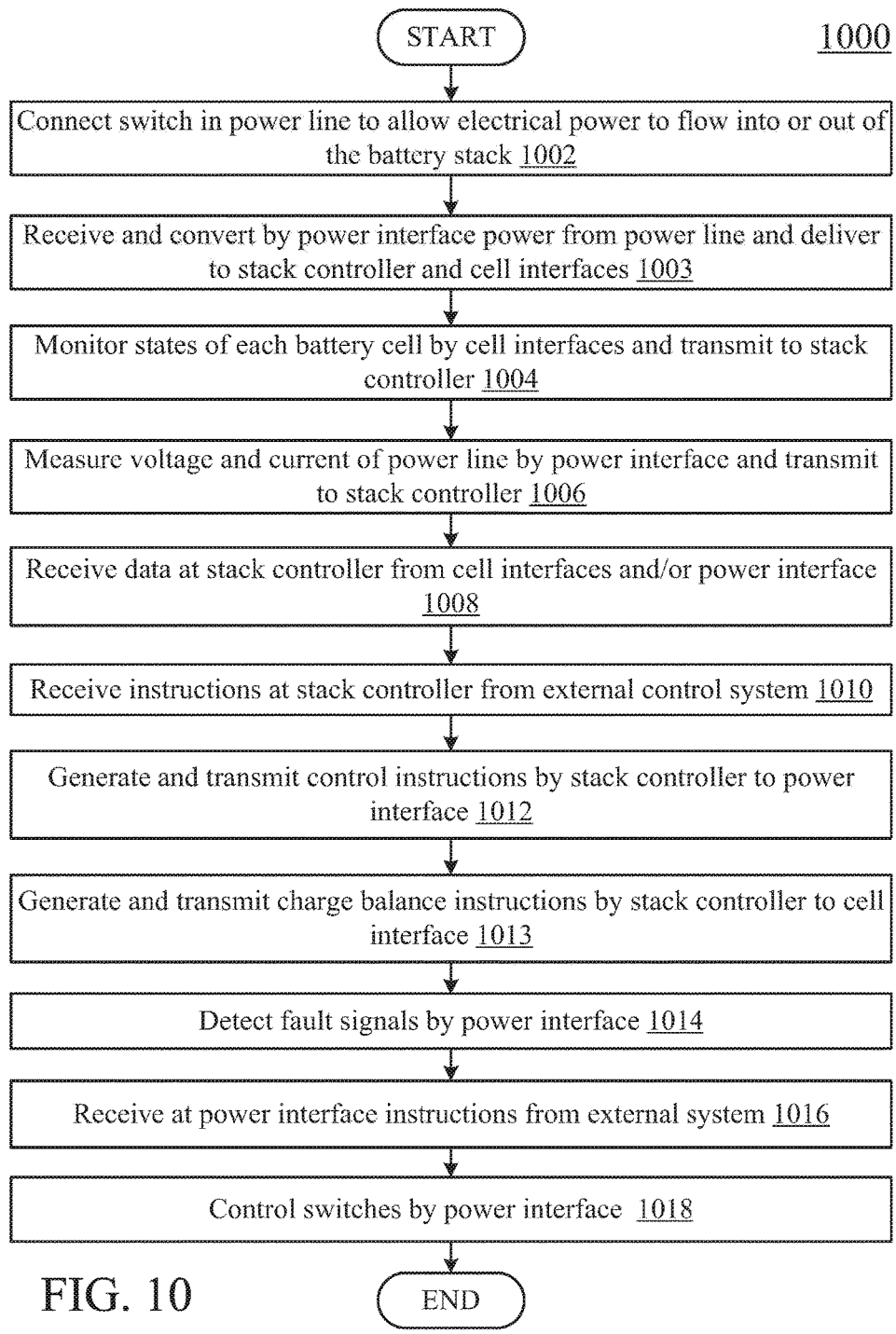
FIG. 10 is a flowchart of an embodiment of a method of using the system.

FIG. 10 is a flowchart of an embodiment of a method 1000 of using the battery management system 100.

In step 1002, the switches 140a and/or 140c in the power line 130 are connected to allow electrical power to flow from into or out of the battery stack 111.

In step 1003, the power interface 160 receives power at battery stack voltage via the input conductor 165 from the power line 130, and converts the power to a regulated voltage to power the power interface. The battery stack is not necessarily at a high voltage—stacks may be controlled at just 30V, for example. In an embodiment, the power interface produces a regulated 24 VDC for system operation from whatever voltage is presented from the stack. As part of the step 1003, the power interface 160 transmits electrical power via the stack bus 155 to power the stack controller 150, and the electrical power is further carried via the link bus 125 to power the cell interfaces 120a-n.

In step 1004, cell interfaces 120a-n monitor characteristics of battery cells 110a-n, respectively. As part of the step 1004, the cell interfaces 120a-n transmit the data about the battery cells 110a-n via the link bus 125 to the stack controller 150. In an embodiment, the cell interface(s) 120a-n only return information to the stack controller on demand (e.g., upon request). In other words, each cell interface must be requested to send data, interface(s) 120a-n does not unilaterally return information to the stack controller.

In step 1006, the power interface 160 measures the voltage and current by detecting the voltage drop across a current shunt 170 placed in the power line 130. As part of the step 1006, the power interface 160 transmits data about the voltage and current via the stack bus 155 to the stack controller 150. In an embodiment, the power interface 160 only returns information to the stack controller when requested, and the power interface does not send data unilaterally.

In step 1008, the stack controller 150 receives data from the cell interfaces 120a-n and/or power interface 160.

In step 1010, the stack controller 150 receives instructions from external control system 310 via Ethernet 518, CAN bus 524, USB 512, and/or Modbus 528.

In step 1012, the stack controller 150 generates control instructions based on data received from cell interfaces 120a-n and/or power interface 160, and/or instructions received from external control system 130. As part of the step 1012, the stack controller 150 transmits the control instructions via the stack bus 155 to the power interface 160.

In step 1013, the stack controller 150 generates charge balance instructions based on the measurements of the voltage of each battery in a cell and transmits to the connecting cell interface.

In step 1014, the power interface 160 detects fault signals. As part of step 1014, the ground fault detector 642 of the power interface 160 detects ground fault signals by detecting unintentional current paths between the battery stack 111 and the ground 803. As part of step 1014, the fault pilot signal detector 634 of the power interface 160 detects suppression of fault pilot signals embedded in the stack bus 155. The ground fault detection and fault pilot signal detection will be discussed in FIGS. 11A and 11B.

In step 1016, the power interface 160 receives instructions from external system that may include some external control source and/or shorting jumper 648. In an embodiment, the power interface 160 receives instructions from external systems whether to de-energize coils of the switches 140a-c in response to fault detection.

In step 1018, the power interface 160 controls the switches 140a-c based on fault signal detection and/or instructions received from the stack controller 150 and/or external system.

In an embodiment, each of the steps of method 1000 is a distinct step. In another embodiment, although depicted as distinct steps in FIG. 10, step 1002-1018 may not be distinct steps. In other embodiments, method 1000 may not have all of the above steps and/or may have other steps in addition to or instead of those listed above. The steps of method 1000 may be performed in another order.

Figure 11A:
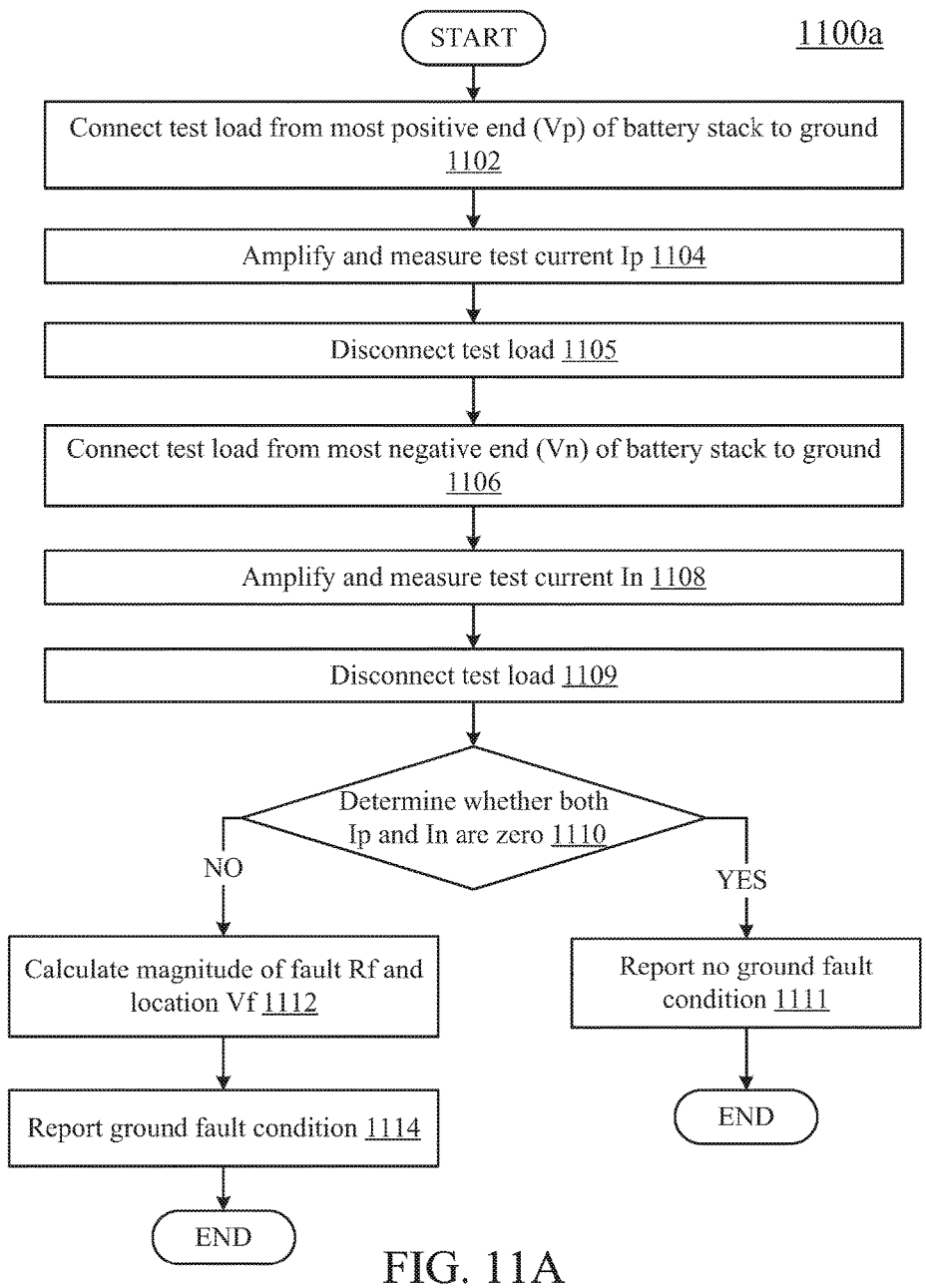
FIG. 11A is a flowchart of an embodiment of a method of ground fault detection process.

FIG. 11A is a flowchart of an embodiment of a method 1100a of ground fault detection process. In an embodiment, the process of FIG. 11A is performed using the circuit of FIG. 8.

In step 1102, the most positive end of the battery stack is connected to the ground 803 via a light test load. As part of the step 1102, resistors are placed as test load in the path from Vp 809 to the ground 803.

In step 1104, the test current Ip 806 is amplified and measured by the microcontroller 640.

In step 1105, the test load is disconnected.

In step 1106, the most negative end of the battery stack is connected to the ground 803 via a light test load. As part of the step 1106, resistors are placed as test load in the path from Vn 810 to the ground 803.

In step 1108, the test current In 812 is amplified and measured by the microcontroller 640.

In step 1109, the test load is disconnected.

In step 1110, the microcontroller 640 of the power interface 160 determines whether both Ip 806 and In 812 are zero. If yes, the microcontroller 640 determines that there is no ground fault in the battery stack, and the method 1100 proceeds to step 1111. If no, the value of the Ip 806 and/or In 812 indicates a ground fault in the battery stack, and the method 1100 proceeds to step 1112.

In step 1111, the power interface reports no ground fault condition.

In step 1112, the microcontroller 640 calculates the magnitude of fault Rf 816 and the fault location voltage Vf 818. The Vf 818 indicates the location of the fault Rf 816 in the battery stack relative to the most negative end of the stack.

In step 1114, the microcontroller 640 reports the ground fault condition to the stack controller 502, grid battery controller 270, and/or external system 290.

In an embodiment, each of the steps of method 1100a is a distinct step. In another embodiment, although depicted as distinct steps in FIG. 11A, step 1102-1114 may not be distinct steps. In other embodiments, method 1100a may not have all of the above steps and/or may have other steps in addition to or instead of those listed above. The steps of method 1100a may be performed in another order.

Figure 11B:
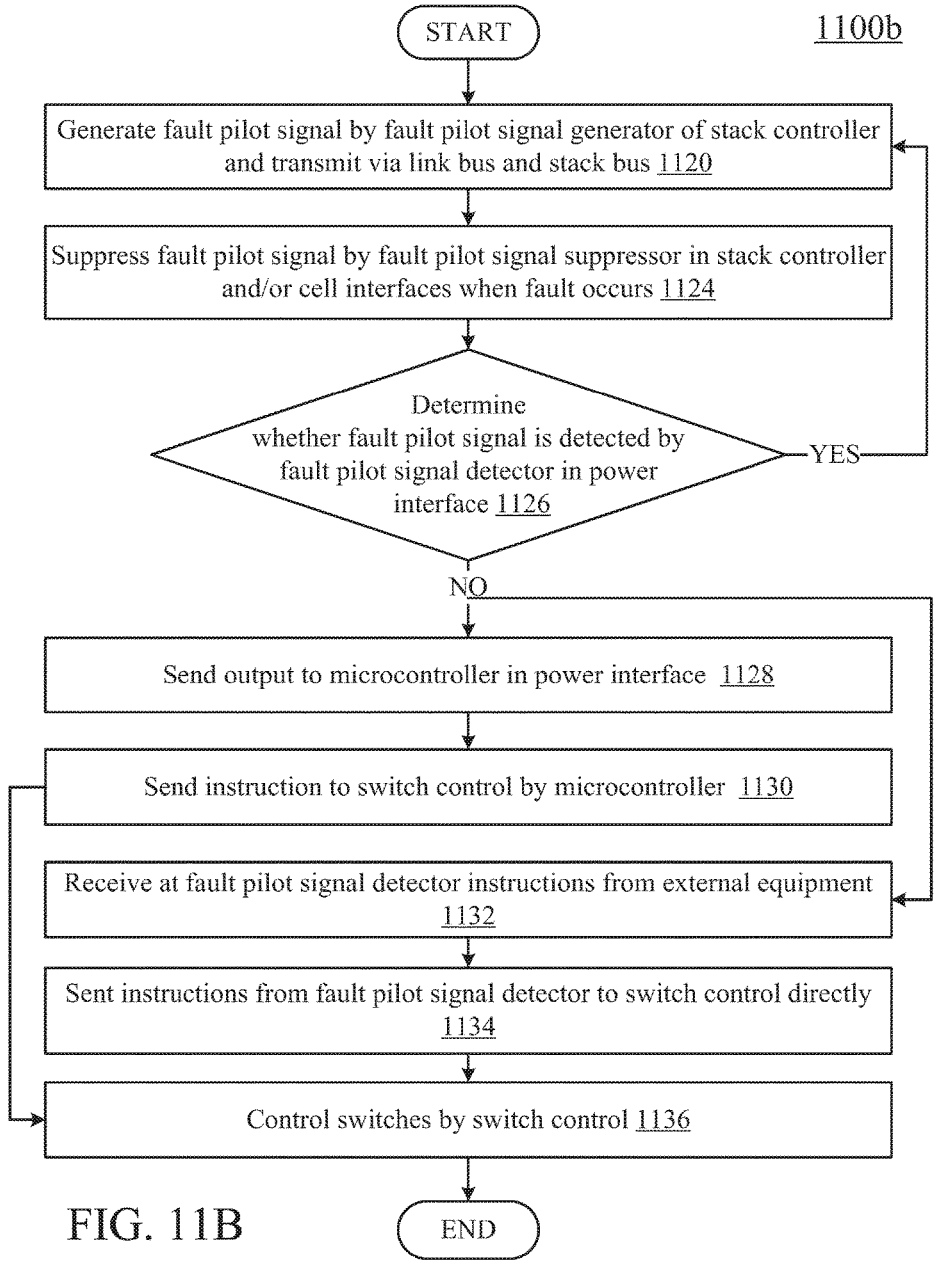
FIG. 11B is a flowchart of an embodiment of a method of fault detection using fault pilot signals.

FIG. 11B is a flowchart of an embodiment of a method 1100b of fault detection using fault pilot signals.

In step 1120, a fault pilot signal is generated by the fault pilot signal generator (in 530) of the stack controller 150. As part of the step 1120, the fault pilot signal is embedded in the link bus 125 and the stack bus 155.

In step 1124, the fault pilot signal suppressor (in 530) in the stack controller 502 may suppress the fault pilot signal to indicate a fault condition (e.g., processor failure, loss of communication with the power interface 160 and/or cell interfaces 120a-n). As part of the step 1124, any of the fault pilot signal suppressor 712a-n in the cell interfaces 120a-n may suppress fault pilot signal to indicate fault (e.g., failure of AFE 410, loss of communication from the cell voltage taps 412 and/or temperature sensors 418). Optionally as part of the step 1124, the fault pilot signal suppressor 717 in the additional components may also suppress the fault pilot signal when fault occurs.

In step 1126, the fault pilot signal detector in the power interface 160 determines whether the fault pilot signal is present. If yes (indicating there is no fault), the steps 1120-1126 may be repeated to continue the detection of fault pilot signals. If no, the absence of the fault pilot signal indicates a fault condition and the method 1100b then proceeds to step 1128 and step 1132.

In step 1128, the fault pilot signal detector 634 sends an output to the microprocessor 640 in the power interface 160. As part of the step 1128, the microprocessor 640 receives and analyzes the output. The output of absence of fault pilot signal indicates a fault condition.

In step 1130, the microcontroller 640 generates and sends control instructions to the switch control 644.

In step 1132, the fault pilot signal detector 634 receives instructions from external equipment 630. In an embodiment, the instructions may be used by the fault pilot signal detector 634 to decide whether the absence of the fault pilot signal should cause all controlled switches to be de-energized immediately.

In step 1134, the fault pilot signal detector 634 sends instructions to the switch control 644 directly. In at least one embodiment, steps 1132-1134 allow direct communication from the fault pilot signal detector 634 to the switch control 644 to control the switches 140a-c based on information from external equipment 630, in addition to the control mechanism through the microcontroller 640 (steps 1128-1130).

In step 1136, the switch control 644 controls the switch coils 650 of the switches 140a-c based on instructions received.

In an embodiment, each of the steps of method 1100B is a distinct step. In another embodiment, although depicted as distinct steps in FIG. 11B, step 1120-1136 may not be distinct steps. In other embodiments, method 1100B may not have all of the above steps and/or may have other steps in addition to or instead of those listed above. The steps of method 1100B may be performed in another order.

Method of Assembling

Figure 12:
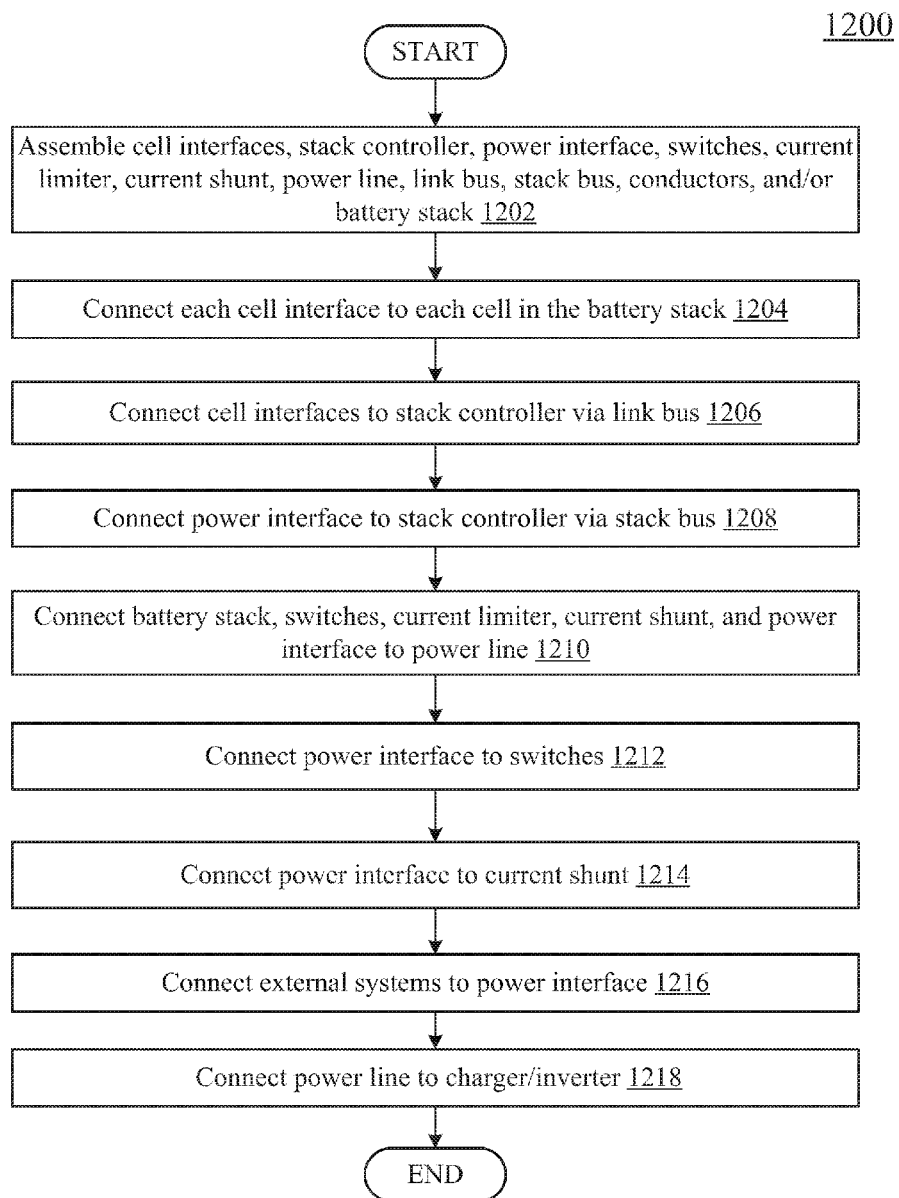
FIG. 12 is a flowchart of an embodiment of a method of assembling the battery management system.

FIG. 12 is a flowchart of an embodiment of a method 1200 of assembling the battery management system 100.

In step 1202, the cell interfaces 120a-n, stack controller 150, power interface 160, switches 140a-c, current limiter 175, current shunt 170, power line 130, link bus 125, stack bus 155, conductors 165 and switch control conductors 167a-c, and/or battery stack 111 are assembled.

In step 1204, each of the cell interfaces 120a-n is connected to each of the battery cells 110a-n in the battery stack 111.

In step 1206, the cell interfaces 120a-n are connected in series via the link bus 125 to the stack controller 150.

In step 1208, the power interface 160 is connected to the stack controller 150 via the stack bus 155.

In step 1210, the battery stack 111 and current shunt are connected to the power line 130. As part of the step 1210, switches 140a and 140c are connected to the power line 130. As part of the step 1210, the current limiter 175 is connected to the switch 140b in series, and the current limiter 175 and switch 140b are connected to the switch 140a in parallel. As part of the step 1210, the power interface is connected to the power line 130 via the input conductor 165.

In step 1212, the power interface 160 is connected to the switches 140a-c via switch control conductors 167a-c, respectively.

In step 1214, power interface is connected to the current shunt 170.

In step 1216, external systems are connected to the power interface 160 via Ethernet, CAN bus, USB, and/or Modbus.

In step 1218, the power line 130 is connected to the charger/inverter 135.

In an embodiment, each of the steps of method 1200 is a distinct step. In another embodiment, although depicted as distinct steps in FIG. 12, step 1202-1218 may not be distinct steps. In other embodiments, method 1200 may not have all of the above steps and/or may have other steps in addition to or instead of those listed above. The steps of method 1200 may be performed in another order.

Figure 13A:
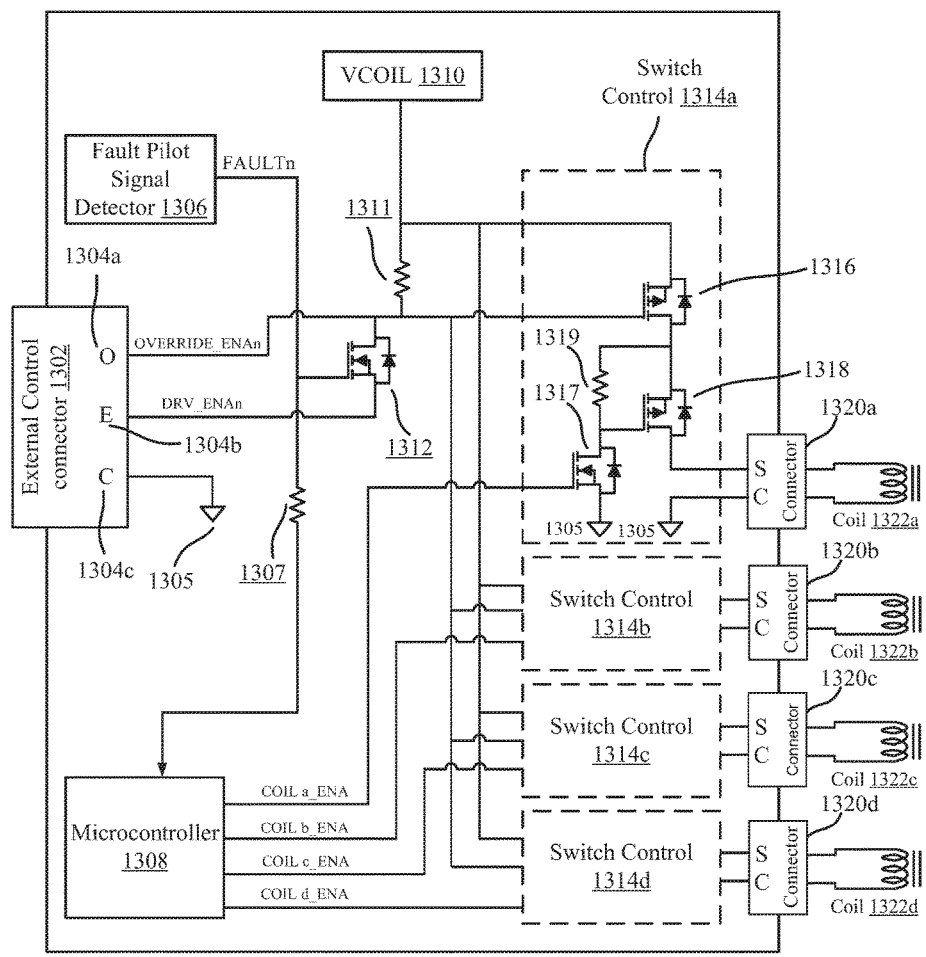
FIG. 13A shows a diagram of an embodiment of a control circuit for the switches.

FIG. 13A shows a diagram of an embodiment of a control circuit 1300a for up to four contactors in the battery management system 100. The control circuit 1300a includes at least an external control connector 1302, providing an override terminal 1304a, an enable terminal 1304b, and a common terminal 1304c; an input protection network 1305; input interface switches 1306 and 1307; a fault detection input 1308; combinatorial logic switches 1309, comprising switches 1309a-c; a power switch 1310, with gate clamp 1311; microcontroller status output connections 1313 and 1315, with current limiting resistors 1312 and 1314; a fault status switch 1316, providing a microcontroller status output connection 1317; a microcontroller control input 1318, comprising individual inputs 1318a-d; a coil driver 1319, comprising individual drivers 1319a-d, and microcontroller status output connections 1320a-d; coil clamp diodes 1321, comprising paired diodes 1321a-b, c-d, e-f, and g-h; external contactor coil connector 1323; and coil power protection diode 1324. In other embodiments, the control circuit 1300a may not have all of the elements or features listed and/or may have other elements or features instead of or in addition to those listed.

FIG. 13A shows a control circuit 1300a via which the power interface may control the contactors in the battery management system 100 to connect and disconnect the power line 130 in response to the detection of fault. In an embodiment, the power interface may control up to four contactors. In another embodiment, the power interface may control other numbers of contactors.

External control connector 1302 is a connector to which the external equipment 630 may be connected. In at least one embodiment, a user may choose, via the use of the external equipment 630, whether or not to open the contactors directly in response to the detection of a fault. External control connector 1302 may be an embodiment of the connector 632, which was discussed in conjunction with FIG. 6. In at least one embodiment, the external control connector 1302 includes three terminals (which may be pins or other means of electrical connection). In another embodiment, the external control connector 1302 may include other numbers of terminals.

Override terminal 1304a is a terminal in the external control connector 1302 that allows the microcontroller (e.g., microcontroller 640 or 963) to control energizing and de-energizing of the external contactor coils regardless of whether a fault is being signaled at the fault input. Override terminal 1304a can be electrically connected to the common terminal, which causes the override enable signal (e.g., "OVERRIDE_ENA#" as shown in FIG. 13A) to turn on logic switch, causing the coil power switch to provide coil current to the coil drivers regardless of whether a fault condition is detected.

Drive terminal 1304b is a terminal in the external control connector 1302 that allows the microcontroller (e.g., microcontroller 640 or 963) to control energizing and de-energizing of the external contactor coils only when a fault is not being signaled at the fault input. Drive terminal 1304b can be electrically connected to the common terminal 1304c, which causes the drive enable signal (e.g., "DRV_ENA#" as shown in FIG. 13A) to turn on a logic switch. When fault input 1308 indicates that no fault is being signaled, another logic switch is turned on.

Input protection network 1305 protects the rest of the control circuit 1300a from inputs that may damage control circuit 1300a. Input protection network 1305 includes capacitor C1 which filters and smooths the signal from drive terminal 1304b. Similarly, protection network 1305 includes capacitor C2, which filters and smooths the signal from override terminal 1304a. Protection network 1305 includes resistors R21 and R19 and voltage clamp diodes D1 and D2, respectively, which together keep the voltage at a desired value or range of values. Resistors R2 and R17 further protect the circuit from high voltages, and provide default pullup voltage levels in case no external connection is made.

Input interface switches 1306 and 1307 are turned on by a signal on override terminal 1304a and drive terminal 1304b, respectively. Resistors R1 and R23 provide pull-up voltage levels compatible with logic components in the rest of the circuit.

The signal presented at the fault input 1308 of contactor control circuit 1300a may be the output from an embodiment of any of the fault pilot signal detectors 634, 716, and 900c, which were discussed in conjunction with FIGS. 6, 7, and 9C, respectively. In at least one embodiment, the fault input indicates the presence and/or absence of the fault pilot signal that is embedded in the stack bus (e.g., stack bus 155, 534, 636, and/or 708), and a signal (e.g., "FAULT_MCU" as shown in FIG. 13A) is relayed to the microcontroller (e.g., microcontroller 640 or 963) of the power interface on an output of contactor control circuit 1300a. When fault input 1308 indicates that no fault is being signaled, a logic switch is turned on.

As discussed above, the state signaled via fault input 1308 may or may not cause direct (i.e., without microcontroller action) de-energizing of the external contactor coils by removal of coil current via a power switch, depending on the selection made by external equipment to terminals in connector 1302.

Logic switches 1309a and 1309b control the coil power switch to provide coil current to the coil drivers. The combination of logic switches 1309a and 1309b being on causes the coil power switch 1310 to provide coil current to the coil drivers. Drive terminal 1304b can be electrically connected to the common terminal 1304c, which causes the drive enable signal (e.g., "DRV_ENA#" as shown in FIG. 13A) to turn on a logic switch 1309a. When fault input 1308 indicates that no fault is being signaled, logic switch 1309b is turned on. If neither the override terminal 1304a nor the drive terminal 1304b is connected to the common terminal 1304c, then logic switches 1309a and 1309c remain turned off, and the coil power switch does not provide coil current to the coil drivers. In the above-mentioned case, the external contactor coils remain de-energized.

Coil power switch 1310 powers the coils by providing power to coil drivers. Coil power switch 1310 is controlled by override terminal 1304*a* and the drive terminal 1304*b*, via logic switches 1309*c* and 1309*a* (such that if neither the override terminal 1304*a* nor the drive terminal 1304*b* is connected to the common terminal 1304*c*, then logic switches 1309*c* and 1309*a* remain turned off, and the coil power switch 1310 does not provide coil current to the coil drivers, and the external contactor coils remain de-energized, whereas if one of override terminal 1304*a* or the drive terminal 1304*b* is connected to the common terminal 1304*c*, then logic switches 1309*c* and 1309*a* may be turned on, and the coil power switch 1310 may provide current to the coil drivers).

As discussed above, the direct (i.e., without microcontroller action) de-energizing of the external contactor coils by removal of coil current via power switch 1310 may are may not be caused by fault input 1308, depending on the selection made by external equipment to terminals in connector 1302. Coil power switch 1310 is turned on by the combination of logic switches 1309*a* and 1309*b* being on.

Zener clamp diode D5, in conjunction with biasing resistors R24 and R25 ensure that the gate voltage of coil power switch Q13 1310 remains within normal operating range, even if the supplied coil voltage presented at VCOIL 1324 is particularly high.

Resistors 1312 and 1314 limit current, ensuring that any erroneous activity by the microcontroller (e.g., microcontroller 640 or 963) will not affect the operation of the contactor control circuit 1300*a*. The states of the external control signals presented at connector 1302 are relayed as inputs to the microcontroller (e.g., microcontroller 640 or 963), via output connections 1313 and 1315 of contactor control circuit 1300*a*.

Logic switch 1316 buffers the FAULT signal to the microcontroller, thereby ensuring that any erroneous activity by the microcontroller (e.g., microcontroller 640 or 963) will not affect the operation of the contactor control circuit 1300*a*. Resistor R26 determines the voltage level of the signal Fault MCU.

Output 1317 is an output of contactor control circuit 1300*a*. In at least one embodiment, a signal (e.g., "FAULT_MCU" as shown in FIG. 13A) is relayed to the microcontroller (e.g., microcontroller 640 or 963) of the power interface on output 1317 of contactor control circuit 1300*a*, when the fault input indicates the presence and/or absence of the fault pilot signal that is embedded in the stack bus (e.g., stack bus 155, 534, 636, and/or 708).

Inputs 1318*a-d* are inputs to control circuit 1300*a* from a microcontroller (e.g., microcontroller 640 or 963). The microcontroller (e.g., microcontroller 640 or 963) controls input 1318 (comprising individual inputs 1318*a-d* in the embodiment shown in FIG. 13A) permits individual control of external contactor coils by the microcontroller (e.g., microcontroller 640 or 963), via the power interface.

Coil drivers 1319 drive the coils. In the embodiment shown in FIG. 13A, provision is made for connecting four coils, with coil current sourced by individual drivers 1319*a-d*, and return path connections provided to circuit common (in other embodiments another number of coils may be supported). As alluded to in the above paragraphs, coil drivers 1319*a-d* switch the current to the coils from the microcontroller (e.g., microcontroller 640 or 963) of the power interface on or off based on control inputs 1318*a-d*. The coil current that is available at "+D_VCOIL" is provided to individual coil drivers 1319*a-d*, by switch 1310, depending on the fault input 1308 and the selection of connections made at external control connector 1302. (However, if neither the override terminal 1304*a* nor the drive terminal 1304*b* is connected to the common terminal 1304*c*, then logic switches 1309*c* and 1309*a* remain turned off, and the coil power switch 1310 does not provide coil current to the coil drivers 1319).

In other words, the combination of either logic switch 1309*c*, or logic switches 1309*a* and 1309*b* being on causes the coil power switch 1310 to provide coil current to the coil drivers 1319. Only when power switch 1310 is turned on and coil current is available, will individual coil drivers 1319*a-d* supply current to their respective coils. Individual coil drivers are provided for each contactor supported, in coil drivers 1319*a-d*, with coil current supplied via the power switch 1310 (e.g., on "COIL_VBB" as shown in FIG. 13A).

Outputs 1320*a-d* provide status information about coil drivers 1319*a-d* to the microcontroller (e.g., microcontroller 640 or 963). In addition to switching coil current from "COIL_VBB" to their outputs, when commanded to do so by the individual inputs 1318*a-d*, coil drivers 1319*a-d* also provide coil energized/de-energized status signals to the microcontroller (e.g., microcontroller 640 or 963) of the power interface on outputs 1320*a-d*, allowing the microcontroller (e.g., microcontroller 640 or 963) to verify that the drivers and associated circuitry are functioning correctly.

To prevent inductive kickback voltage which may be induced in the external contactor coils as they are de-energized from damaging the coil drivers 1319*a-d*, each coil is clamped by a pair of diodes in a network of clamp diodes 1321.

Through the use of zener clamp diodes 1321*b, d, f*, and *h*, the collapse of the coil current occurs more rapidly than if diodes 1321*a, c, e*, and *g* were used alone, helping to extend contactor life by promoting more rapid contact opening.

Contactor coil connector 1323 is a connector to which the external contactor coils may be connected. When coil drivers 1319*a-d* are on, power is supplied to the coils via contactor coil connector 1323. Contactor coil connector 1323 also provides connections for an external coil current supply, via the terminals connecting "+D_VCOIL" and circuit common (power supply return). Optionally, the power interface internal power supply, "+VINT", may be connected to "+D_VCOIL" at contactor coil connector 1323 in order to provide a source for the coil current from the internal supply. Ferrite FB3 filters internal high-frequency switching noise present on "+VINT" from reaching cabling connected to connector 1323.

Diode 1324 prevents circuit damage from an incorrect reversal of the polarity of an external power supply.

Figure 13B:
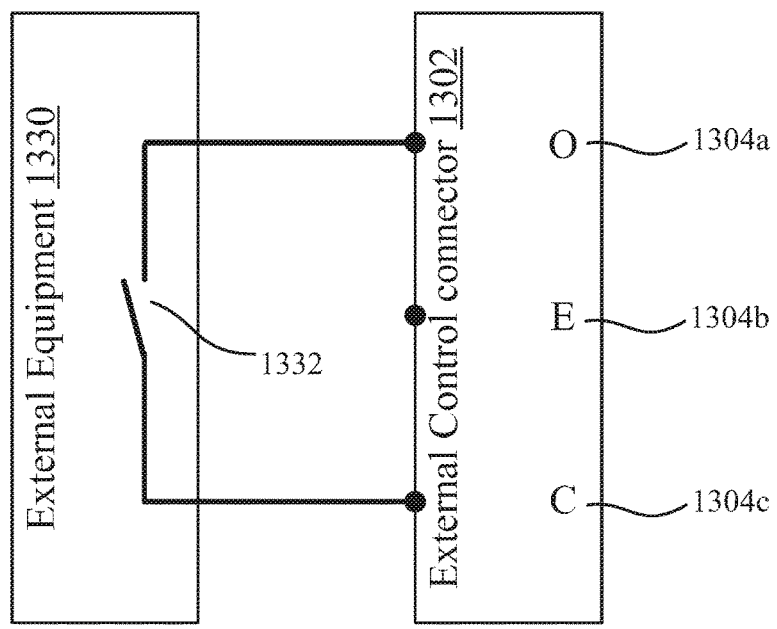
FIG. 13B shows a diagram of an embodiment of a connection of an external equipment to the control circuit of FIG. 13A.

FIG. 13B shows a diagram 1300*b* of an embodiment of a connection of an external equipment to the control circuit 1300*a* of FIG. 13A. Diagram 1300*b* shows at least the external control connector 1302, override terminal 1304*a*, drive terminal 1304*b*, and common terminal 1304*c*, which were discussed in conjunction with FIG. 13A. Diagram 1300*b* further shows external equipment 1330 and a switch 1332. In other embodiments, the circuit in the diagram 1300*b* may not have all of the elements or features listed and/or may have other elements or features instead of or in addition to those listed.

FIG. 13B shows a diagram 1300*b* of a connection between an external equipment and the external control connector 1302, connecting the override terminal 1304*a* and common terminal 1304*c*, to enable and disable control of the switches, while not allowing direct (i.e., without microcontroller action) de-energizing of the coils in response to the assertion of fault input 1308.

External equipment 1330 may be an embodiment of the external equipment 630, which was discussed in conjunction with FIG. 6. In at least one embodiment, the external equipment 1330 includes a circuit that connects the override terminal 1304a and common terminal 1304c. Switch 1332 is a switch that controls the connection and disconnection of the circuit between the override terminal 1304a and common terminal 1304c.

Figure 13C:
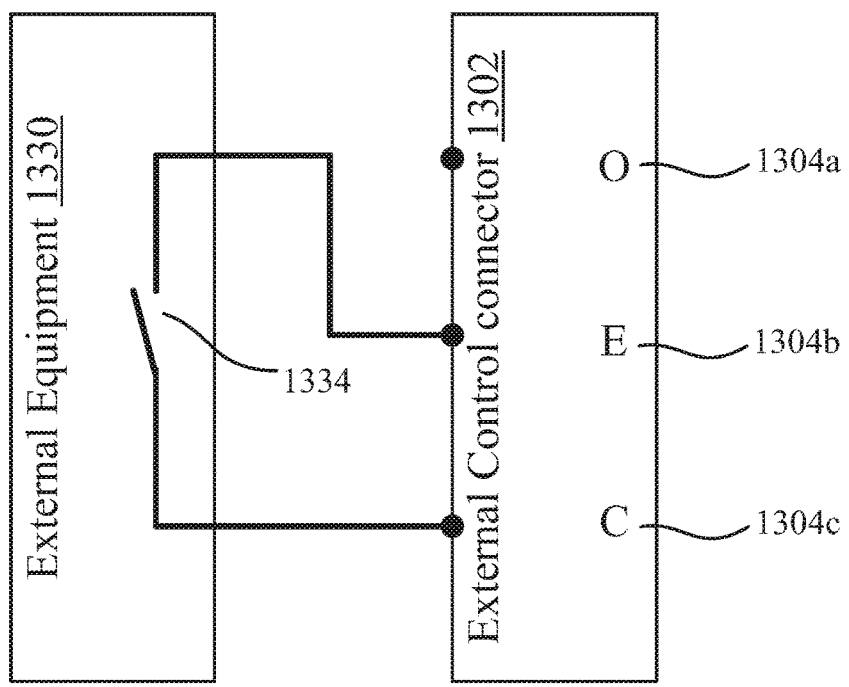
FIG. 13C shows a diagram of an embodiment of another connection of the external equipment to the control circuit of FIG. 13A.

FIG. 13C shows a diagram 1300c of an embodiment of another connection of the external equipment 1330 to the control circuit 1300a of FIG. 13A. Diagram 1300c shows at least the external control connector 1302, override terminal 1304a, drive terminal 1304b, common terminal 1304c, and external equipment 1330, which were discussed in conjunction with FIGS. 13A and 13B. Diagram 1300c further shows a switch 1334. In other embodiments, the circuit in the diagram 1300c may not have all of the elements or features listed and/or may have other elements or features instead of or in addition to those listed.

FIG. 13C shows a diagram 1300c of another connection between the external equipment 1330 and the external control connector 1302, connecting the drive terminal 1304b and common terminal 1304c, to enable and disable control of the switches, while permitting direct de-energizing of the coils in response to the fault signal independent of the microcontroller 640 or 963.

In FIG. 13C, the switch 1334 controls the connection and disconnection between the drive terminal 1304b and common terminal 1304c. In at least one embodiment, when the switch 1334 is open, no signal exists to cause the logic switch 1309a to be turned on. When the switch 1334 is closed, the drive enable signal (e.g., "DRV_ENA#" as shown in FIG. 13A) turns on the logic switch 1309a. When fault input 1308 indicates that no fault is being signaled, logic switch 1309b is turned on. The combination of logic switches 1309a and 1309b being on causes the coil power switch 1310 to provide coil current to the coil drivers 1319. Therefore, the connection in FIG. 13C allows the microcontroller (e.g., microcontroller 640 or 963) to control energizing and de-energizing of the external contactor coils only when a fault is not being signaled at the fault input 1308. When fault input 1308 indicates that a fault is being signaled, logic switch 1309b is turned off, causing the coil power switch 1310 to be off and cutting power supply to the coil drivers 1319, thus directly de-energizing the coils.

Figure 14:
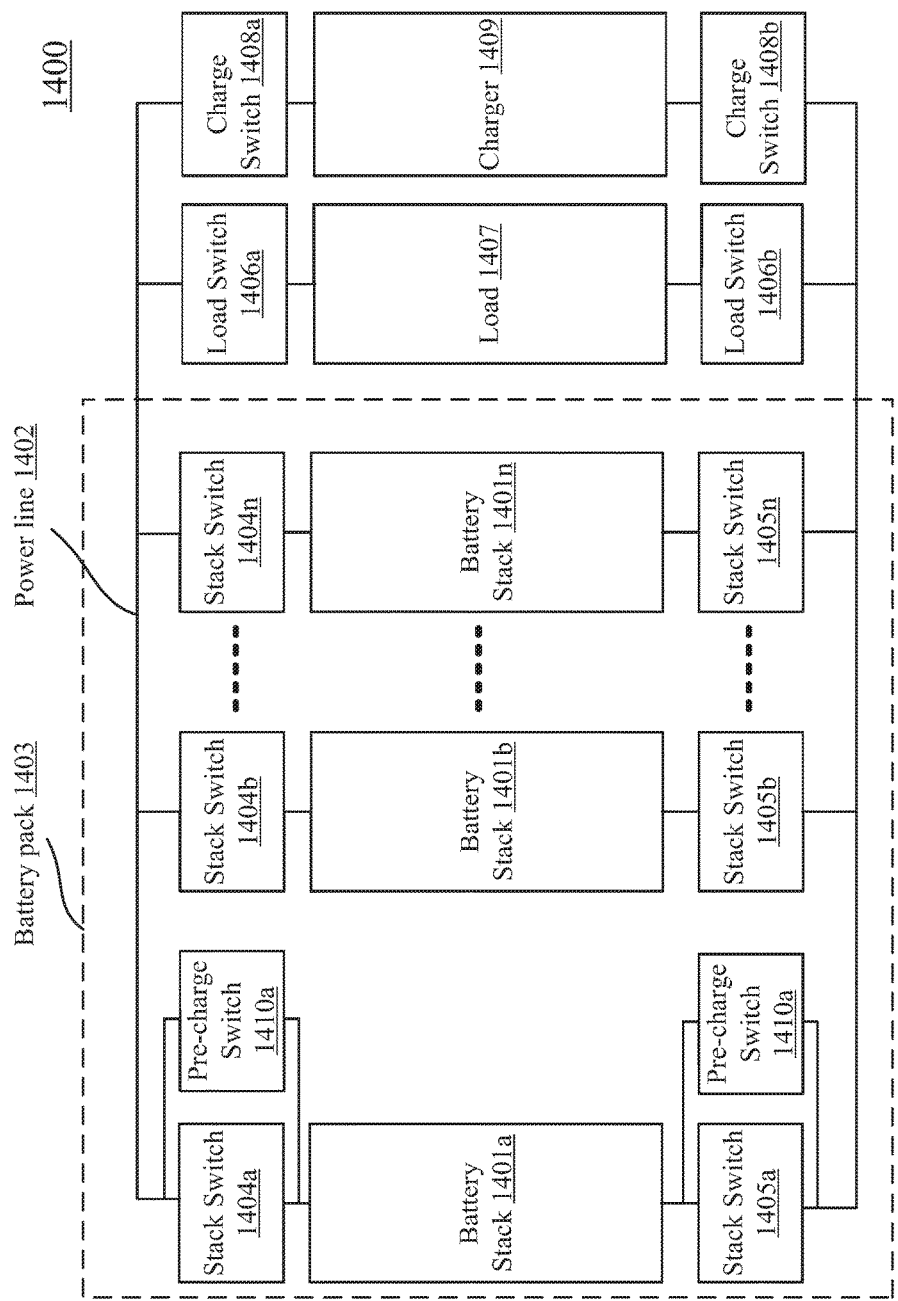
FIG. 14 shows a diagram of an embodiment of the energy storage system that may be connected and disconnected using switches.

FIG. 14 shows a diagram of an embodiment of the energy storage system 1400 that may be connected and disconnected using switches. Energy storage system 1400 includes at least battery stacks 1401a-n, a power line 1402, a battery pack 1403, stack switches 1404a-n and 1405a-n, load switches 1406a and 1406b, a load 1407, charge switches 1408a and 1408b, a charger 1409, and pre-charge switches 1410a and 1410b. In other embodiments, the energy storage system 1400 may not have all of the elements or features listed and/or may have other elements or features instead of or in addition to those listed.

FIG. 14 shows components of the energy storage system 1400 that are electrically connected to the system using switches and may be electrically isolated from the energy storage system 1400 by disconnecting the associated switches.

Energy storage system 1400 and battery pack 1403 may be embodiments of the energy storage system 301 and battery pack 304, which were discussed in conjunction with FIG. 3. Battery stacks 1401a-n may be embodiments of the battery stack 210a-n, which were discussed in conjunction with FIG. 2. Power line 1402 may be an embodiment of the power line 130, which were discussed in conjunction with FIG. 1. In at least one embodiment, the battery stack 1401a-n are connected in parallel via the power line to form the battery pack 1403, which is further connected to a load and/or charger. In at least one embodiment, any one of the battery stack 1401a-n, load, and/or charger may be electrically isolated from the rest of the energy storage system 1400. In at least one embodiment, any one of the battery stack 1401a-n may be physically removable as a unit from the battery pack 1403.

Stack switches 1404a-n and 1405a-n are switches that connect the battery stacks 1401a-n to the power line 1402 in parallel in the battery stack 1403. In at least one embodiment, a pair of stack switches are located at either end of the battery stack (e.g., stack switches 1404a and 1405a are located at the most positive end and the most negative end of battery stack 1401a, respectively). In at least one embodiment, a pair of stack switches may electrically isolate a battery stack from the rest of the battery pack 1403. For example, disconnecting the stack switches 1404a and 1405a may isolate the battery stack 1401a from the battery pack 1403 while the other battery stacks 1401b-n are still functional. In an embodiment, each of the battery stack 1401a-n may be isolated using the associated stack switches.

Load switches 1406a and 1406b are a pair of switches that connect the load to the power line 1402 so as to receive power output from the battery pack 1403. In at least one embodiment, the load switches 1406a and 1406b connect and disconnect the load power path from the battery pack 1403.

Load 1407 may be a device, an electrical component, and/or a portion of a circuit that consumes electric power supplied by the battery pack 1403 when the load switches 1406a and 1406b are closed.

Charge switches 1408a and 1408b are a pair of switches that connect the charger to the power line 1402 so as to provide power to the battery pack 1403. In at least one embodiment, the charge switches 1406a and 1406b connect and disconnect the charger power path from the battery pack 1403.

Charger 1409 is a device that is used to charge battery pack 1403, putting energy into the battery pack 1403 when the charge switches 1408a and 1408b are closed. In at least one embodiment, the charger 1409 applies an electric voltage across the battery pack 1403 via the power line 1402.

Pre-charge switches 1410a and 1410b are switches that are used to limit in-rush current associated with switching of capacitive loads (e.g., load 1407) or with connecting battery stacks 1401a in parallel with other battery stacks, where the stacks are at different states of charge. Pre-charge switches 1410a and 1410b may be an embodiment of the switch 140b with its associated current limiter 175. In at least one embodiment, the pre-charge switches 1410a and 1410b are connected in parallel to the stack switches 1404a and 1405b, respectively. In an embodiment, a pre-charge switch is used in parallel with each of the stack switches 1404a-n and 1405a-n. In an embodiment, a pre-charge switch may be used in parallel with each of the load switches 1406a-b and charge switches 1408a-b. In an embodiment, the pre-charge switch function may be implemented at one end of a battery stack only, with the switch and pre-charge switch pair at the opposite end implemented as a single switch.

ALTERNATIVES AND EXTENSIONS

Each embodiment disclosed herein may be used or otherwise combined with any of the other embodiments disclosed. Any element of any embodiment may be used in any embodiment.

Although the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

The invention claimed is:

1. A system comprising:
   at least one battery stack having at least one battery cell;
   at least one interface for the at least one battery stack, which when activated, monitors a status of the at least one battery cell;
   a power interface, which when activated, controls whether a load is connected and whether a load is disconnected; the power interface includes at least one detector, which when activated detects data indicative of whether a fault is present; the power interface, when activated, takes actions based on the data pertaining to the fault;
   a signal generator, the signal generator generating a signal indicating a positive status of the system, and the at least one detector detecting whether the signal indicative of a positive status is present;
   a signal suppressor, which suppresses the signal indicative of a positive status, when the signal suppressor receives a input indicative of a problem in the system.

2. The system of claim 1, the at least one detector including at least
   a detector that detects a ground fault, and
   a detector that detects other faults.

3. A system comprising
   at least one battery stack having at least one battery cell;
   at least one interface for the at least one battery stack, which when activated, monitors a status of the at least one battery cell;
   a power interface, which when activated, controls whether a load is connected and whether a load is disconnected; the power interface includes at least one detector, which when activated detects data indicative of whether a fault is present; the power interface, when activated, takes actions based on the data pertaining to the fault;
   a bus that links a plurality of components of the system;
   a signal generator, the signal generator generating a signal indicating a positive status of the system, and the at least one detector detecting whether the signal indicative of a positive status is present; the signal generator being communicatively connected to the bus, the signal generator, when activated, superimposing the signal indicative of the positive status on a voltage carried by the bus that links a plurality of components of the system, the voltage being different from the signal indicative of the positive status.

4. A system comprising:
   at least one battery stack having at least one battery cell;
   at least one interface for the at least one battery stack, which when activated, monitors a status of the at least one battery cell;
   a power interface, which when activated, controls whether a load is connected and whether a load is disconnected; the power interface includes at least one detector, which when activated detects data indicative of whether a fault is present; the power interface, when activated, takes actions based on the data pertaining to the fault;
   a signal generator, the signal generator generating a signal indicating a positive status of the system, and the at least one detector detecting whether the signal indicative of a positive status is present;
   a processor for controlling the system;
   one or more switches controlling whether a load is connected to a power source and whether the load is disconnected from the power source;
   a switch controller controlling the switches, the switch controller being a separate unit from the processor;
   the at least one detector being communicatively coupled to the switch controller, the at least one detector sending output, bypassing the processor, to the switch controller, thereby controlling the switches, without requiring control instructions from the processor.

5. A system comprising:
   at least one battery stack having at least one battery cell;
   at least one interface for the at least one battery stack, which when activated, monitors a status of the at least one battery cell;
   a power interface, which when activated, controls whether a load is connected and whether a load is disconnected; the power interface includes at least one detector, which when activated detects data indicative of whether a fault is present; the power interface, when activated, takes actions based on the data pertaining to the fault;
   a bus that links a plurality of components of the system;
   a signal generator, the signal generator generating a signal indicating a positive status of the system, and the at least one detector detecting whether the signal indicative of a positive status is present;
   the signal generator being communicatively connected to the bus, the signal generator, when activated, superimposing the signal indicative of the positive status on a voltage carried by the bus that links a plurality of components of the system, the voltage being different from the signal indicative of the positive status;
   a signal suppressor, which suppresses the signal indicative of a positive status, when the signal suppressor receives a signal as a result of a problem in the system;
   a processor for controlling the system;
   one or more switches controlling whether a load is connected to a power source and whether the load is disconnected from the power source;
   a switch controller controlling the switches, the switch controller being a separate unit from the processor;
   the at least one detector being communicatively coupled to the switch controller, the at least one detector sending output, bypassing the processor, to the switch controller, therein controlling the switches, without requiring control instructions from the processor.

6. The system of claim 1, wherein
   the at least one detector including at least
   a voltage sensor that monitors a voltage of at least the at least one battery cell, and
   a temperature sensor that senses a temperature associated with the at least one battery cell.

7. The system of claim 1, wherein
   the at least one battery cell of the at least one battery stack including a plurality of battery cells connected in series.

8. The system of claim 7, the at least one detector, when activated, detecting whether a ground fault exists in the battery stack.

9. A system comprising:
at least one battery stack having at least one battery cell; wherein the at least one battery cell of the at least one battery stack including a plurality of battery cells connected in series;
at least one interface for the at least one battery stack, which when activated, monitors a status of the at least one battery cell;
a power interface, which when activated, controls whether a load is connected and whether a load is disconnected; the power interface includes at least one detector, which when activated detects data indicative of whether a fault is present; the power interface, when activated, takes actions based on the data pertaining to the fault;
the at least one detector including at least
a first amplifier at a positive end of the battery stack having a voltage divider at a noninverting input of the amplifier, the voltage divider creating a first relationship between a fault impedance and a fault voltage;
a second amplifier at a negative end of the battery stack, the second amplifier having a gain defining a second relationship relating a voltage of at least one input of the amplifier to a voltage at the output of the second amplifier therein relating the fault voltage to the fault impedance, via to the second relationship; and
the at least one detector, when activated, determining whether a ground fault exists by determining a fault impedance value associated with the first relationship and the second relationship.

10. The system of claim 9, the at least one detector, when activated, further determining a location of the fault based on the first relationship and the second relationship.

11. A system comprising:
at least one battery stack having at least one battery cell; wherein the at least one battery cell of the at least one battery stack including a plurality of battery cells connected in series;
at least one interface for the at least one battery stack, which when activated, monitors a status of the at least one battery cell;
a power interface, which when activated, controls whether a load is connected and whether a load is disconnected; the power interface includes at least one detector, which when activated detects data indicative of whether a fault is present; the power interface, when activated, takes actions based on the data pertaining to the fault;
the at least one detector including at least
a first amplifier at a positive end of the battery stack having a voltage divider at a noninverting input of the amplifier, the voltage divider creating a first relationship between a fault impedance and a fault voltage;
a second amplifier at a negative end of the battery stack, the second amplifier having a gain defining a second relationship relating a voltage of at least one input of the amplifier to a voltage at the output of the second amplifier therein relating the fault voltage to the fault impedance, via to the second relationship; and
a first voltage divider connected to the first amplifier, the first voltage divider being dynamically configurable while the system is running;
a second voltage divider connected to the second amplifier, the second voltage divider being dynamically configurable while the system is running;
the at least one detector, when activated, determining a value associated with a fault impedance and a value associated with a fault voltage based on the first relationship and the second relationship.

12. The system of claim 10, the first voltage divider including at least a first plurality of switches and a first plurality of resistors, the first plurality of switches control which of the first plurality resistors carry a signal; and
the second voltage divider including at least a second plurality of switches and a second plurality of resistors, the second plurality of switches control which of the second plurality resistors carry a signal.

13. The system of claim 10, wherein the second amplifier includes an inverter that inverts the at least one input to the second amplifier.

14. The system of claim 10, an output associated with the first amplifier being connected to a first port of a processor, and an output associated with the second amplifier being connected to a second port of the processor; the processor being configured for determining whether there is a ground fault based on the output associated with the first amplifier and the output associated with the second amplifier.

15. A system comprising
at least one battery cell that is connected in a circuit, the circuit delivering electrical current to and from the at least one battery cell;
at least one cell interface that is connected to the at least one battery cell, wherein the at least one cell interface monitors status of the at least one battery cell and sends the status to a controller; and
a power interface that controls connecting and disconnecting of the circuit, wherein, when activated, the power interface measures voltage and current in the circuit and sends the voltage and current to the controller, wherein, when activated, the power interface detects data indicative of whether a ground fault exists; the controller being communicatively connected to the at least one cell interface and the power interface, when in operation, the controller determines instructions to send to the power interface based on at least the status of the at least one battery cell, the voltage, and the current in the circuit, and the data indicative of whether the ground fault exists;
a battery stack that includes at least one battery cell connected in series, the battery stack having a positive end and a negative end, wherein the power interface measures a first current from the positive end of the battery stack to ground and a second current from the negative end of the battery stack to the ground, and determines whether a ground fault exists, wherein the power interface calculates a resistance and a location of the ground fault.

16. A system comprising
at least one battery cell that is connected in a circuit, the circuit delivering electrical current to and from the at least one battery cell;
at least one cell interface that is connected to the at least one battery cell, wherein the at least one cell interface monitors status of the at least one battery cell and sends the status to a controller; and
a power interface that controls connecting and disconnecting of the circuit, wherein, when activated, the power interface measures voltage and current in the circuit and sends the voltage and current to the controller, wherein, when activated, the rower interface detects data indicative of whether a ground fault exists; the controller being communicatively connected to the at least one cell interface and the power interface, when in operation, the controller determines instructions to send to the power interface based on at least the status of the at least one battery cell, the voltage, and the current in the circuit, and the data indicative of whether the ground fault exists;

a signal generator that is installed in the controller, the signal generator generating a fault pilot signal that is propagated to the at least one cell interface and the power interface;

at least one signal suppressor that is installed in at least one of the at least one cell interface and the controller, at least one of the at least one signal suppressor suppressing the fault pilot signal, if a fault exists; and a signal detector that is installed in the power interface, the signal detector detecting an absence of the fault pilot signal.

* * * * *